(12) United States Patent
Yamamoto et al.

(10) Patent No.: US 7,674,567 B2
(45) Date of Patent: Mar. 9, 2010

(54) POSITIVE RESIST COMPOSITION AND PATTERN FORMING METHOD USING THE SAME

(75) Inventors: Kei Yamamoto, Shizuoka (JP); Shinichi Kanna, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 11/523,551

(22) Filed: Sep. 20, 2006

(65) Prior Publication Data

US 2007/0065752 A1    Mar. 22, 2007

(30) Foreign Application Priority Data

Sep. 20, 2005    (JP)    ............................ P2005-272074

(51) Int. Cl.
*G03F 7/004* (2006.01)
*G03F 7/30* (2006.01)

(52) U.S. Cl. .................. 430/270.1; 430/326; 430/920; 430/921; 430/922

(58) Field of Classification Search .............. 430/270.1, 430/434, 494, 326, 920, 921, 922
See application file for complete search history.

(56) References Cited

U.S. PATENT DOCUMENTS

| | | | |
|---|---|---|---|
| 5,554,664 | A | 9/1996 | Lamanna et al. |
| 6,777,160 | B2 | 8/2004 | Sato et al. |
| 2003/0148211 | A1 | 8/2003 | Kamabuchi et al. |
| 2004/0229162 | A1 * | 11/2004 | Ohsawa et al. .......... 430/270.1 |
| 2005/0014090 | A1 * | 1/2005 | Hirayama et al. ........ 430/270.1 |
| 2005/0186505 | A1 * | 8/2005 | Kodama et al. .......... 430/270.1 |
| 2006/0210922 | A1 * | 9/2006 | Nishiyama .............. 430/270.1 |
| 2007/0042290 | A1 * | 2/2007 | Inabe et al. ............. 430/270.1 |

FOREIGN PATENT DOCUMENTS

| | | |
|---|---|---|
| EP | 1 566 692 A | 8/2005 |
| EP | 1 764 647 A | 3/2007 |
| EP | 1 764 652 A | 3/2007 |
| JP | 57-153433 A | 9/1982 |
| JP | 7-220990 A | 8/1995 |
| JP | 10-303114 A | 11/1998 |
| JP | 2002-268223 A | 9/2002 |
| JP | 2002-341539 A | 11/2002 |
| JP | 2003-261529 A | 9/2003 |
| JP | 2004-2252 A | 1/2004 |
| JP | 2005227645 A * | 8/2005 |
| WO | WO 2004/068242 A1 | 8/2004 |
| WO | WO 2004/077158 A1 | 9/2004 |

OTHER PUBLICATIONS

Watanabe, T., Hada, H., Lee, Seung Yoon., Kinoshita, H., Hmamoto, K. and Komano, H. Development of Fast-Photospeed Chemically Amplified Resist In Extreme Ultraviolet Lithography. Jul. 26, 2005, Japanese Journal of Applied Physics, vol. 44, No. 7B, pp. 5866-5870.*

* cited by examiner

*Primary Examiner*—John S Chu
(74) *Attorney, Agent, or Firm*—Sughrue Mion, PLLC

(57) ABSTRACT

A positive resist composition comprising: at least one compound selected from a compound capable of generating an acid represented by the formula (I) as defined herein upon irradiation with actinic rays or radiation and a compound capable of generating an acid represented by the following formula (II) upon irradiation with actinic rays or radiation; and a compound capable of generating an acid represented by the formula (III) as defined herein upon irradiation with actinic rays or radiation.

10 Claims, No Drawings

POSITIVE RESIST COMPOSITION AND PATTERN FORMING METHOD USING THE SAME

FIELD OF THE INVENTION

The present invention relates to a positive resist composition for use in the production process of a semiconductor such as IC, in the production of a circuit substrate of liquid crystal, thermal head or the like, and in the lithography process of other photo-applications, and a pattern forming method using the same. More specifically, the present invention relates to a positive resist composition suitable for exposure by an immersion-type projection exposure apparatus using a light source of emitting far ultraviolet light at a wavelength of 300 nm or less, and a pattern forming method using the same.

BACKGROUND OF THE INVENTION

Along with the miniaturization of semiconductor devices, the trend is moving into shorter wavelength of the exposure light source and higher numerical aperture (high NA) of the projection lens. At present, an exposure machine with NA of 0.84 has been developed, where an ArF excimer laser having a wavelength of 193 nm is used as the light source. As commonly well known, these can be expressed by the following formulae:

(Resolving power)=$k_1 \cdot (\lambda/NA)$ (Focal depth)=$\pm k_2 \cdot \lambda NA^2$ wherein $\lambda$ is the wavelength of the exposure light source, NA is the numerical aperture of the projection lens, and $k_1$ and $k_2$ are constants related to the process.

In order to realize still shorter wavelength and higher resolving power, studies are being made on an exposure machine where an $F_2$ excimer laser having a wavelength of 157 nm is used as the light source. However, the lens material used for the exposure apparatus so as to realize shorter wavelength and the material used for the resist are very limited and therefore, it is extremely difficult to stabilize the production cost or quality of the apparatus and materials. This may lead to a failure in procuring the exposure apparatus and the resist each assured of sufficiently high performance and stability within a required time period.

Conventionally, a so-called immersion method of filling a high refractive-index liquid (hereinafter sometimes referred to as an "immersion liquid") between the projection lens and the sample has been known as a technique of increasing the resolving power in an optical microscope.

As for the "effect of immersion", assuming that the wavelength of exposure light in air is $\lambda_0$, the refractive index of the immersion liquid to air is n, the convergence half-angle of beam is $\theta$ and $NA_0 = \sin\theta$, the above-described resolving power and focal depth when immersed can be expressed by the following formulae:

(Resolving power)=$k_1 \cdot (\lambda_0/n)/NA_0$ (Focal depth)=$\pm k_2 \cdot (\lambda_0/n)/NA_0^2$ That is, the effect of immersion is equal to use of an exposure wavelength of 1/n. In other words, in the case of a projection optical system with the same NA, the focal depth can be made n times larger by the immersion. This is effective for all pattern profiles and can be combined with super-resolution techniques such as phase-shift method and modified illumination method which are being studied at present.

Examples of the apparatus where this effect is applied to the transfer of a fine image pattern of a semiconductor device are described in JP-A-57-153433 (the term "JP-A" as used herein means an "unexamined published Japanese patent application") and JP-A-7-220990.

Recent progress of the immersion exposure technique is reported, for example, in *SPIE Proc.*, 4688, 11 (2002), *J. Vac. Sci. Tecnol. B*, 17 (1999), *SPIE Proc.*, 3999, 2 (2000), JP-A-10-303114 and International Publication No. WO 2004-077158. In the case of using an ArF excimer laser as the light source, in view of safety on handling as well as transmittance and refractive index at 193 nm, pure water (refractive index at 193 nm: 1.44) is considered to be a most promising immersion liquid. In the case of using an $F_2$ excimer laser as the light source, a fluorine-containing solution is being studied in the light of balance between transmittance and refractive index at 157 nm, but those satisfied in view of environmental safety or refractive index have been not yet found out. Considering the degree of immersion effect and the maturity of resist, the immersion exposure technique is expected to be most soon mounted on an ArF exposure machine.

Since the discovery of a resist for a KrF excimer laser (248 nm), an image forming method called chemical amplification is used as the image forming method for a resist so as to compensate the reduction in the sensitivity due to light absorption. The image forming method, for example, using positive chemical amplification is an image forming method where an acid generator in the exposed area decomposes upon exposure to generate an acid, the acid generated is used as a reaction catalyst in the baking after exposure (PEB: post exposure bake) to convert the alkali-insoluble group into an alkali-soluble group, and the exposed area is removed by an alkali developer.

As for the acid generator which is the main constituent component of the chemical amplification-type resist composition, various compounds have been found. For example, JP-A-2004-002252 discloses an onium salt capable of generating a sulfonic acid upon irradiation with radiation.

Also, for example, JP-A-2003-261529, U.S. Patent Application Publication 2003/0148211A, U.S. Pat. No. 5,554,664, JP-A-2002-341539 and JP-A-2002-268223 disclose a photosensitive composition containing a sulfonium or iodonium salt having a bis-sulfonylimide or tris-sulfonylmethide anion.

However, many points still remain unsatisfied, and improvement is demanded with respect to the line edge roughness (LER).

The line edge roughness as used herein means a profile such that the resist edge at the interface between the line pattern and the substrate irregularly fluctuates in the direction perpendicular to the line direction due to the resist characteristics. When this pattern is viewed from right above, the edge gives an uneven appearance (on the order of ±several nm to several tens of nm). This unevenness is transferred by the etching step and when the unevenness is large, failure in electric characteristics is caused and the yield decreases.

On the other hand, it is pointed out that when immersion exposure is applied to the chemical amplification resist, the resist layer comes into contact with the immersion liquid at the exposure, as a result, the resist layer deteriorates or a component adversely affecting the immersion liquid bleeds out from the resist layer. International Publication No. WO 2004-068242 describes a case where when the resist for ArF exposure is dipped in water before and after exposure, the resist performance is changed, and this is indicated as a problem in the immersion exposure.

For example, in the immersion exposure, the line width is known to fluctuate due to time delay between exposure and PEB, and improvement is demanded in this respect.

SUMMARY OF THE INVENTION

By taking account of the above-described problems in conventional techniques, an object of the present invention is to provide a positive resist ensuring excellent line edge roughness at both the normal exposure and the immersion exposure and less fluctuation of the line width due to time delay between exposure and PEB, and a pattern forming method using the same.

(1) A positive resist composition comprising:

(A1) at least one compound selected from a compound capable of generating an acid represented by the following formula (I) upon irradiation with actinic rays or radiation and a compound capable of generating an acid represented by the following formula (II) upon irradiation with actinic rays or radiation, and (A2) a compound capable of generating an acid represented by the following formula (III) upon irradiation with actinic rays or radiation:

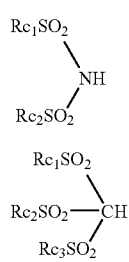

wherein $Rc_1$, $Rc_2$ and $Rc_3$ each independently represents an alkyl group substituted by at least one fluorine atom, or an aryl group substituted by at least one fluorine atom, and $Rc_1$ and $Rc_2$ may combine with each other to form a ring;

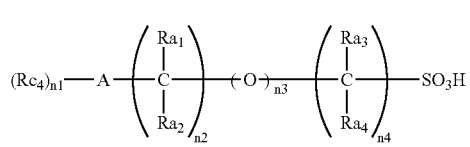

wherein $Ra_1$, $Ra_2$, $Ra_3$ and $Ra_4$ each independently represents a hydrogen atom, a fluorine atom or a trifluoromethyl group, A represents a divalent or trivalent linking group selected from an oxygen atom, a sulfur atom, a nitrogen atom, a carbonyl group, a sulfonyl group, an ester group, an amide group, a sulfonamide group, an imino group, a urethane group, a urea group and a group formed by combining two or more thereof, $Rc_4$ represents an organic group, and when n1 is 2, two $Rc_4$'s may be the same or different or may combine with each other to form a ring, n1 represents 1 or 2, n2 represents an integer of 1 to 3, n3 represents 0 or 1, and n4 represents an integer of 1 to 3.

(2) The positive resist composition as described in (1), wherein the ratio of the component (A2) occupying in the total sum of the amount added of the compound as the component (A1) and the amount added of the compound as the component (A2) is from 10 to 90 mol %.

(3) The positive resist composition as described in (1), wherein the ratio of the component (A2) occupying in the total sum of the amount added of the compound as the component (A1) and the amount added of the compound as the component (A2) is from 20 to 80 mol %.

(4) A pattern forming method comprising forming a resist film from the positive resist composition described in (1), (2) or (3), and exposing and developing the resist film.

(5) The pattern forming method as described in (4), wherein the resist film is exposed through an immersion liquid.

According to the present invention, a positive resist assured of excellent line edge roughness at both the normal exposure and the immersion exposure and reduced in the fluctuation of the line width due to time delay between exposure and PEB, and a pattern forming method using the same can be provided.

DETAILED DESCRIPTION OF THE INVENTION

The present invention is described in detail below.

In the present invention, when a group (atomic group) is denoted without specifying whether substituted or unsubstituted, the group includes both a group having no substituent and a group having a substituent. For example, an "alkyl group" includes not only an alkyl group having no substituent (unsubstituted alkyl group) but also an alkyl group having a substituent (substituted alkyl group).

[1] (A) Compound Capable of Generating an Acid upon Irradiation with Actinic Rays or Radiation The compound capable of generating an acid upon irradiation with actinic rays or radiation (hereinafter sometimes referred to as an "acid generator"), which is used in the positive resist composition of the present invention, is described below.

The positive resist composition of the present invention comprises the following compounds (A1) and (A2) as the compound capable of generating an acid upon irradiation with actinic rays or radiation.

(A1) At Least One Compound Selected from a Compound Capable of Generating an Acid Represented by the Following Formula (I) upon Irradiation with Actinic Rays or Radiation and a Compound Capable of Generating an Acid Represented by the Following Formula (II) upon Irradiation with Actinic Rays or Radiation The positive resist composition of the present invention comprises at least one compound (sometimes referred to as a "compound (A1)") selected from a compound capable of generating an acid represented by the following formula (I) upon irradiation with actinic rays or radiation and a compound capable of generating an acid represented by the following formula (II) upon irradiation with actinic rays or radiation.

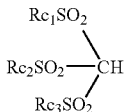
(II)

In formulae (I) and (II), $Rc_1$, $Rc_2$ and $Rc_3$ each independently represents an alkyl group substituted by at least one fluorine atom, or an aryl group substituted by at least one fluorine atom, and $Rc_1$ and $Rc_2$ may combine with each other to form a ring;

The alkyl group substituted by at least one fluorine atom for $Rc_1$ to $Rc_3$ in formulae (I) and (II) includes, for example, an alkyl group having a carbon number of 1 to 15 substituted by at least one fluorine atom and is preferably an alkyl group having a carbon number of 1 to 15 with at least the 1-position being substituted by a fluorine atom, more preferably a perfluoroalkyl group having a carbon number of 1 to 15, still more preferably a perfluoroalkyl group having a carbon number of 1 to 8, yet still more preferably a perfluoroalkyl group having a carbon number of 1 to 4.

The aryl group substituted by at least one fluorine atom for $Rc_1$, to $Rc_3$ includes, for example, an aryl group having a carbon number of 6 to 15 substituted by at least one fluorine atom or at least one fluoroalkyl group and is preferably a phenyl group substituted by at least one fluorine atom or at least one fluoroalkyl group (preferably a perfluoroalkyl group having a carbon number of 1 to 8), more preferably a perfluorophenyl group.

By virtue of $Rc_1$, to $Rc_3$ having a fluorine atom, the acidity of the acid generated upon light irradiation is increased and in turn, the sensitivity is enhanced.

In the case where $Rc_1$ and $Rc_2$ combine with each other to form a ring, the group formed by combining $Rc_1$, and $Rc_2$ includes, for example, an alkylene group having a carbon number of 1 to 10 and having at least one fluorine atom, and an arylene group having a carbon number of 6 to 10 and having at least one fluorine atom and is preferably a perfluoroalkylene group having a carbon number of 2 to 4, more preferably a perfluoropropylene group. When $Rc_1$ and $Rc_2$ combine with each other to form a ring, the acidity is increased as compared with an acid of not forming a ring and in turn, the sensitivity of the composition is enhanced.

Specific examples of the acid represented by formula (I) are set forth below, but the present invention is not limited thereto.

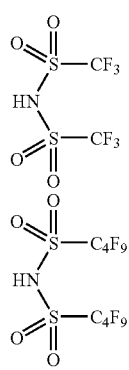
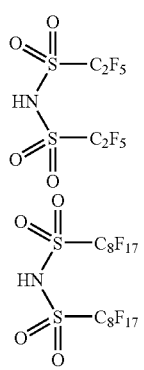

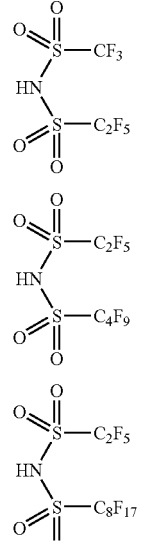
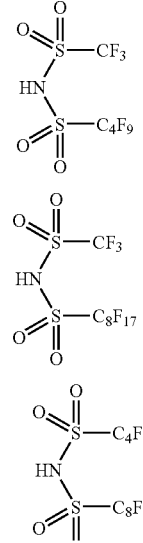

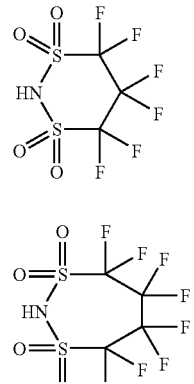
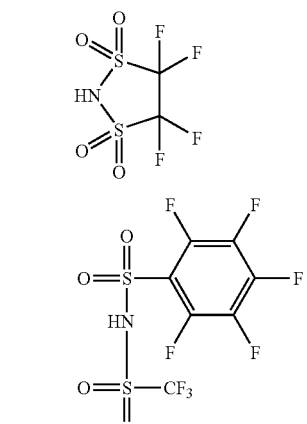

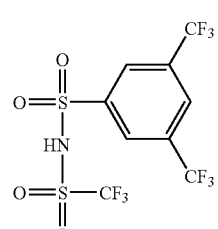
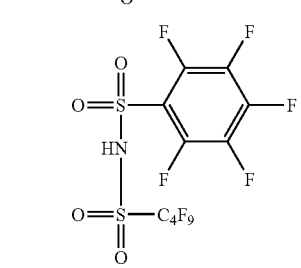

Specific examples of the acid represented by formula (II) are set forth below, but the present invention is not limited thereto.

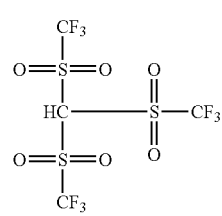

-continued

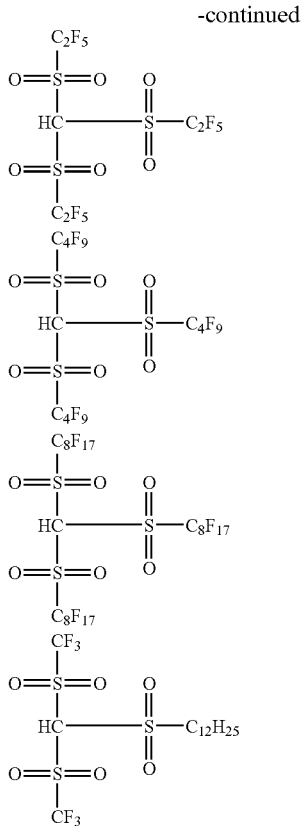

The compound capable of generating an acid represented by formula (I) or (II) upon irradiation with actinic rays or radiation is preferably a sulfonium or iodonium salt of the acid represented by formula (I) or (II), more preferably a compound where in the following formula (A1a) or (A2a), $Xa^-$ is an anion after removing a hydrogen atom from the acid represented by formula (I) or (II).

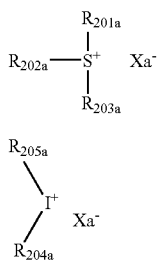

In formula (A1a), $R_{201a}$, $R_{202a}$ and $R_{203a}$ each independently represents an organic group. The carbon number of the organic group as $R_{201a}$, $R_{202a}$ and $R_{203a}$ is generally from 1 to 30, preferably from 1 to 20.

Also, two members out of $R_{201a}$ to $R_{203a}$ may combine to form a ring structure, and the ring may contain an oxygen atom, a sulfur atom, an ester bond, an amide bond or a carbonyl group. The group formed by combining two members out of $R_{201a}$ to $R_{203a}$ includes an alkylene group (e.g., butylene, pentylene).

Specific examples of the organic group as $R_{201a}$, $R_{202a}$ and $R_{203a}$ a include the corresponding groups in the compounds (A1aa), (A1ab) and (A1ac) which are described later.

The compound may be a compound having a plurality of structures represented by formula (A1a). For example, the compound may be a compound having a structure that at least one of $R_{201a}$ to $R_{203a}$ in the compound represented by formula (A1a) is bonded to at least one of $R_{201a}$ to $R_{203a}$ in another compound represented by formula (A1a).

The component (A1a) is more preferably a compound (A1aa), (A1ab) or (A1ac) described below.

The compound (A1aa) is an arylsulfonium compound where at least one of $R_{201a}$ to $R_{203a}$ in formula (A1a) is an aryl group, that is, a compound having arylsulfonium as the cation. In the arylsulfonium compound, $R_{201a}$ to $R_{203a}$ all may be an aryl group or a part of $R_{201a}$ to $R_{203a}$ may be an aryl group, with the remaining being an alkyl group or a cycloalkyl group.

Examples of the arylsulfonium compound include a triarylsulfonium compound, a diarylalkylsulfonium compound, an aryldialkylsulfonium compound and compounds where the alkyl group in these compounds is a cycloalkyl group.

The aryl group in the arylsulfonium compound includes an aryl group composed of a hydrocarbon, and a heteroaryl group containing a heteroatom such as nitrogen atom, sulfur atom and oxygen atom. The aryl group composed of a hydrocarbon is preferably a phenyl group or a naphthyl group, more preferably a phenyl group. Examples of the heteroaryl group include a pyrrole group, an indole group, a carbazole group and a thiophene group, with an indole group being preferred. In the case where the arylsulfonium compound has two or more aryl groups, these two or more aryl groups may be the same or different.

The alkyl group or cycloalkyl group which is present, if desired, in the arylsulfonium compound is preferably a linear or branched alkyl group having a carbon number of 1 to 15 or a cycloalkyl group having a carbon number of 3 to 15, and examples thereof include a methyl group, an ethyl group, a propyl group, an n-butyl group, a sec-butyl group, a tert-butyl group, a cyclopropyl group, a cyclobutyl group and a cyclohexyl group.

Examples of the substituent which the aryl group, alkyl group and cycloalkyl group of $R_{201a}$ to $R_{203a}$ each may have include a cycloalkyl group (for example, a cycloalkyl group having a carbon number of 3 to 15), an aryl group (for example, an aryl group having a carbon number of 6 to 14), an alkoxy group (for example, an alkoxy group having a carbon number of 1 to 15), a halogen atom, a hydroxyl group and a phenylthio group. As for the cyclic structure such as aryl ring and cyclo ring in each group, examples of the substituent further include an alkyl group (for example, an alkyl group having a carbon number of 1 to 15). The substituent is preferably a linear or branched alkyl group having a carbon number of 1 to 12, a cycloalkyl group having a carbon number of 3 to 12, or a linear, branched or cyclic alkoxy group having a carbon number of 1 to 12, more preferably an alkyl group having a carbon number of 1 to 4, or an alkoxy group having a carbon number of 1 to 4. The substituent may be substituted to any one of three members $R_{201a}$ to $R_{203a}$ or may be substituted to all of these three members. As for the aryl group, examples of the substituent further include an alkyl group (for example, an alkyl group having a carbon number of 1 to 15). Furthermore, the substituent is preferably substituted at the p-position of the aryl group.

The compound (A1ab) is described below.

The compound (A1ab) is a compound when $R_{201a}$ to $R_{203a}$ in formula (A1a) each independently represents an organic group having no aromatic ring. The aromatic ring as used herein includes an aromatic ring having a heteroatom.

The aromatic ring-free organic group as $R_{201a}$ to $R_{203a}$ has a carbon number of generally from 1 to 30, preferably from 1 to 20.

$R_{201a}$ to $R_{203a}$ each is independently preferably an alkyl group, a cycloalkyl group, an allyl group or a vinyl group, more preferably a linear, branched or cyclic 2-oxoalkyl group, still more preferably a linear or branched 2-oxoalkyl group.

The alkyl group as $R_{201a}$ to $R_{203a}$ may be either linear or branched, and the alkyl group is preferably a linear or branched alkyl group having a carbon number of 1 to 20 (e.g., methyl, ethyl, propyl, butyl, pentyl). The alkyl group as $R_{201a}$ to $R_{203a}$ is more preferably a linear or branched 2-oxoalkyl group or an alkoxymethyl group.

The cycloalkyl group as $R_{201a}$ to $R_{203a}$ preferably includes a cycloalkyl group having a carbon number of 3 to 10 (e.g., cyclopentyl, cyclohexyl, norbornyl). The cycloalkyl group as $R_{201a}$ to $R_{203a}$ is more preferably a cyclic 2-oxocycloalkyl group.

The linear, branched or cyclic 2-oxoalkyl group as $R_{201a}$ to $R_{203a}$ may have a double bond, and preferred examples thereof include a group having >C=O at the 2-position of the above-described alkyl group or cycloalkyl group.

The alkoxy group in the alkoxycarbonylmethyl group as $R_{201a}$ to $R_{203a}$ preferably includes an alkoxy group having a carbon number of 1 to 5 (e.g., methoxy, ethoxy, propoxy, butoxy, pentoxy).

Each group as $R_{201a}$ to $R_{203a}$ may be substituted by a halogen atom, an alkoxy group (for example, an alkoxy group having a carbon number of 1 to 5), a hydroxyl group, a cyano group, a nitro group or the like.

The compound (A1ac) is a compound represented by the following formula (A1ac), and this is a compound having an arylacylsulfonium salt structure.

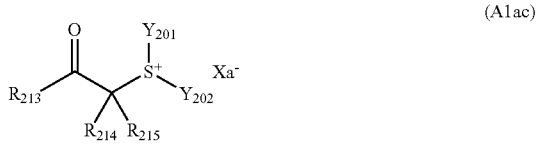

(A1ac)

In formula (A1ac), $R_{213}$ represents an aryl group, and the aryl group may have a substituent and is preferably a phenyl group or a naphthyl group. Examples of the substituent which the aryl group of $R_{213}$ may have include an alkyl group, an alkoxy group, an acyl group, a nitro group, a hydroxyl group, an alkoxycarbonyl group and a carboxy group.

$R_{214}$ and $R_{215}$ each independently represents a hydrogen atom, an alkyl group or a cycloalkyl group.

$Y_{201}$, and $Y_{202}$ each independently represents an alkyl group, a cycloalkyl group, an aryl group or a vinyl group.

$Xa^-$ represents an anion after removing a hydrogen atom from the acid represented by formula (I) or (II).

$R_{213}$ and $R_{214}$ may combine with each other to form a ring structure, $R_{214}$ and $R_{215}$ may combine with each other to form a ring structure, and $Y_{201}$ and $Y_{202}$ may combine with each other to form a ring structure. The ring structure formed may contain an oxygen atom, a sulfur atom, an ester bond or an amide bond. Examples of the group formed by combining $R_{213}$ and $R_{214}$, the group formed by combining $R_{214}$ and $R_{215}$, and the group formed by combining $Y_{201}$ and $Y_{202}$ include a butylene group and a pentylene group.

The alkyl group as $R_{214}$ and $R_{215}$ is preferably a linear or branched alkyl group having a carbon number of 1 to 20 (e.g., methyl, ethyl, propyl, n-butyl, sec-butyl, tert-butyl).

The cycloalkyl group as $R_{214}$ and $R_{215}$ is preferably a cycloalkyl group having a carbon number of 3 to 20 (e.g., cyclopropyl, cyclobutyl, cyclohexyl).

The alkyl group as $Y_{201}$ and $Y_{202}$ may have a substituent and may have an oxo group in the alkylene chain, and the alkyl group is preferably a linear or branched alkyl group having a carbon number of 1 to 20 (e.g., methyl, ethyl, propyl, n-butyl, sec-butyl, tert-butyl). The alkyl group having a substituent includes particularly an alkoxy-carbonylalkyl group and a carboxyalkyl group, and the alkyl group having an oxo group includes a 2-oxoalkyl group. The 2-oxoalkyl group includes a group having >C=O at the 2-position of the alkyl group. The alkoxycarbonyl group in the alkoxycarbonylalkyl group is preferably an alkoxycarbonyl group having a carbon number of 2 to 20.

The cycloalkyl group as $Y_{201}$ and $Y_{202}$ is preferably a cycloalkyl group having a carbon number of 3 to 20 (e.g., cyclopropyl, cyclobutyl, cyclohexyl) and similarly to the above-described alkyl group, the cycloalkyl group may have a substituent and may have an oxo group in the alkylene chain.

The aryl group as $Y_{201}$ and $Y_{202}$ is preferably a phenyl group or a naphthyl group, more preferably a phenyl group.

Each group as $R_{214}$, $R_{215}$, $Y_{201}$ to $Y_{202}$ may have a substituent, and examples of the substituent include an aryl group (for example, an aryl group having a carbon number of 6 to 15), an alkoxy group (for example, an alkoxy group having a carbon number of 1 to 15), an alkoxycarbonyl group (having a carbon number of 2 to 20), a carboxyl group, a halogen atom, a hydroxyl group and a phenylthio group. As for the cyclic structure such as aryl ring and cyclo ring in each group, examples of the substituent further include an alkyl group (for example, an alkyl group having a carbon number of 1 to 15).

$Y_{201}$ and $Y_{202}$ each is preferably an alkyl or cycloalkyl group having a carbon number of 4 or more, more preferably from 4 to 16, still more preferably from 4 to 12.

At least either one of $R_{214}$ and $R_{215}$ is preferably an alkyl or cycloalkyl group, and more preferably, $R_{214}$ and $R_{215}$ both are an alkyl or cycloalkyl group.

In formula (A2a), $R_{204a}$ and $R_{205a}$ each independently represents an aryl group, an alkyl group or a cycloalkyl group.

The aryl group of $R_{204a}$ and $R_{205a}$ is preferably a phenyl group or a naphthyl group, more preferably a phenyl group.

The alkyl group and cycloalkyl group as $R_{204a}$ and $R_{205a}$ are preferably a linear or branched alkyl group having a carbon number of 1 to 10 (e.g., methyl, ethyl, propyl, butyl, pentyl) and a cycloalkyl group having a carbon number of 3 to 10 (e.g., cyclopentyl, cyclohexyl, norbornyl).

The compound is preferably a compound represented by formula (A1a), more preferably a compound represented by any one of formulae (A1aa) to (A1ac).

Specific examples of the compound capable of generating an acid represented by formula (I) upon irradiation with actinic rays or radiation are set forth below, but the present invention is not limited thereto.

A1-I-1 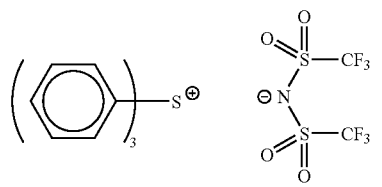
A1-I-2 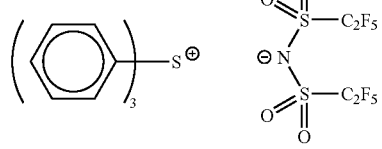
A1-I-3 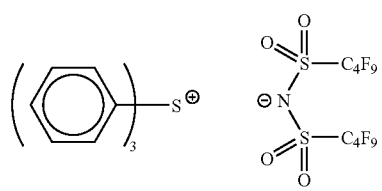
A1-I-4 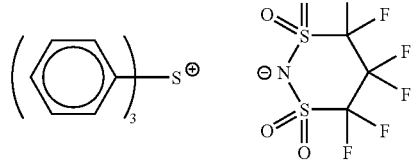
A1-I-5 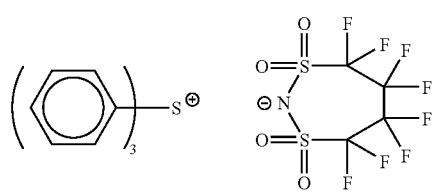
A1-I-6 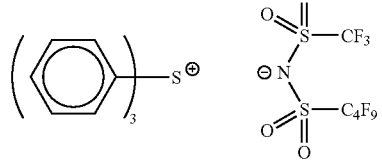
A1-I-7 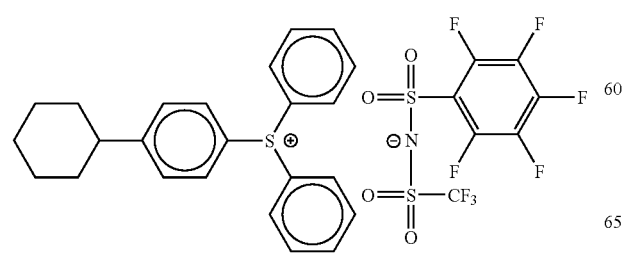
-continued
A1-I-8 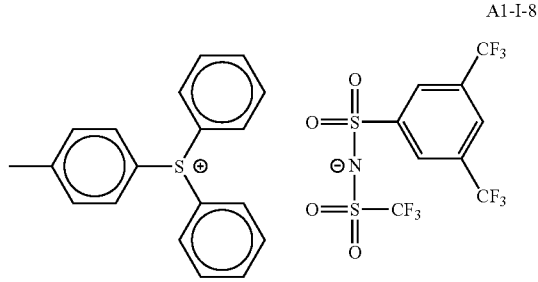
A1-I-9 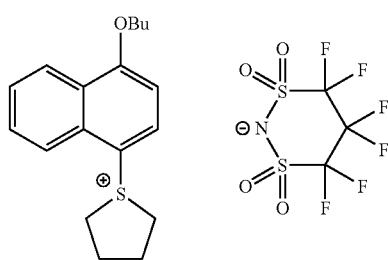
A1-I-10 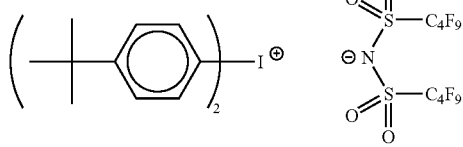
A1-I-11 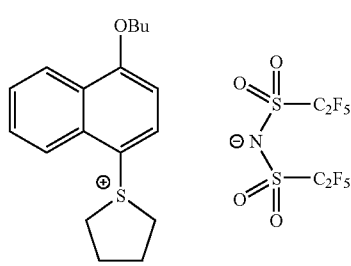
A1-I-12 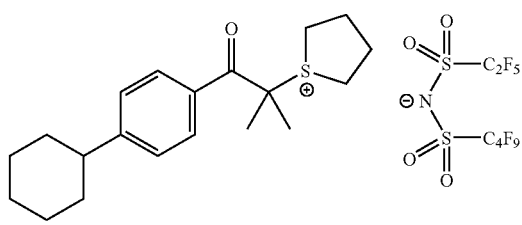
A1-I-13 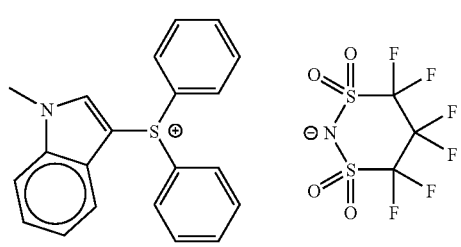

A1-I-14

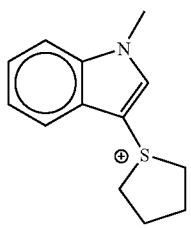 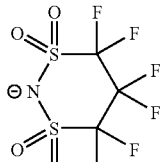

A1-I-15

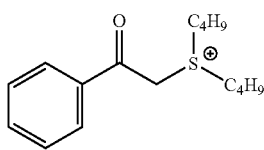 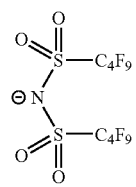

Specific examples of the compound capable of generating an acid represented by formula (II) upon irradiation with actinic rays or radiation are set forth below, but the present invention is not limited thereto.

A1-II-1

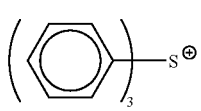 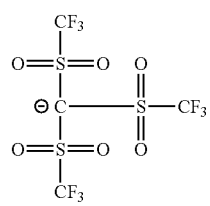

A1-II-2

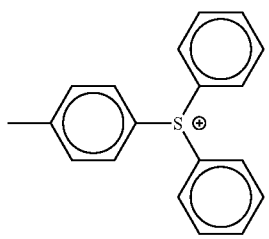 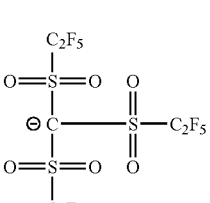

A1-II-3

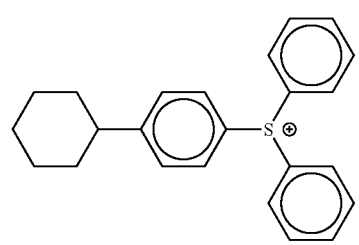 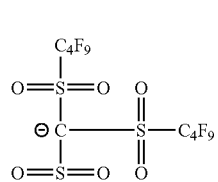

A1-II-4

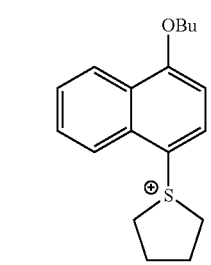 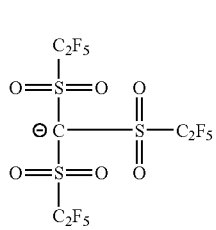

A1-II-5

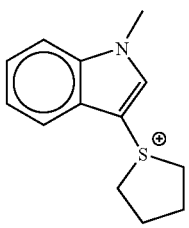 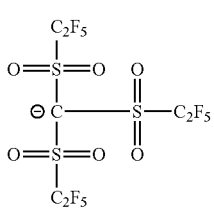

(A2) Compound Capable of Generating an Acid Represented by Formula (III) upon Irradiation with Actinic Rays or Radiation The positive resist composition of the present invention comprises a compound capable of generating an acid represented by the following formula (III) upon irradiation with actinic rays or radiation (sometimes referred to as a "compound (A2)").

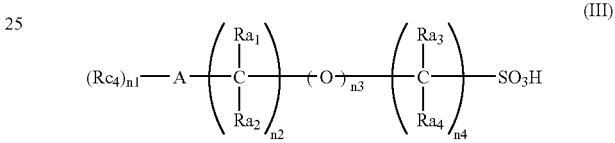

(III)

In formula (III), $Ra_1$, $Ra_2$, $Ra_3$ and $Ra_4$ each independently represents a hydrogen atom, a fluorine atom or a trifluoromethyl group, A represents a divalent or trivalent linking group selected from an oxygen atom, a sulfur atom, a nitrogen atom, a carbonyl group, a sulfonyl group, an ester group, an amide group, a sulfonamide group, an imino group, a urethane group, a urea group and a group formed by combining two or more thereof, $Rc_4$ represents an organic group, and when n1 is 2, two $Rc_4$'s may be the same or different or may combine with each other to form a ring, n1 represents 1 or 2, n2 represents an integer of 1 to 3, n3 represents 0 or 1, and n4 represents an integer of 1 to 3.

$Ra_1$, $Ra_2$, $Ra_3$ and $Ra_4$ each is preferably a fluorine atom.

The organic group of $Rc_4$ is preferably a single group selected from an alkyl group, a cycloalkyl group, an aryl group, an aralkyl group and an alkenyl group, or a group formed by combining two or more of these groups directly or through a linking group.

The alkyl group in $Rc_4$ may have a substituent, and the alkyl group is preferably a linear or branched alkyl group having a carbon number of 1 to 20, more preferably from 3 to 20, still more preferably from 6 to 20, and may have an oxygen atom, a sulfur atom or a nitrogen atom in the alkyl chain. Specific examples thereof include a linear alkyl group such as methyl group, ethyl group, n-propyl group, n-butyl group, n-pentyl group, n-hexyl group, n-octyl group, n-dodecyl group, n-tetradecyl group and n-octadecyl group, and a branched alkyl group such as isopropyl group, isobutyl group, tert-butyl group, neopentyl group and 2-ethylhexyl group.

The cycloalkyl group in $Rc_4$ may have a substituent, and the cycloalkyl group is preferably a cycloalkyl group having a carbon number of 3 to 20, more preferably from 6 to 20, and may have an oxygen atom within the ring. Specific examples thereof include a cyclopropyl group, a cyclopentyl group, a cyclohexyl group, a norbornyl group and an adamantyl group.

The aryl group in $Rc_4$ may have a substituent, and the aryl group is preferably an aryl group having a carbon number of 6 to 14. Examples thereof include a phenyl group and a naphthyl group.

The aralkyl group in $Rc_4$ preferably includes an aralkyl group having a carbon number of 7 to 20, and examples thereof include a benzyl group, a phenethyl group, a naphthylmethyl group and a naphthylethyl group.

The alkenyl group in $Rc_4$ includes a group having a double bond at an arbitrary position of the above-described alkyl group.

The organic group of $Rc_4$ further includes a group where two or more groups selected from an alkyl group, a cycloalkyl group, an aryl group, an aralkyl group and an alkenyl group are combined directly or through a linking group represented by A.

Incidentally, the alkyl group, cycloalkyl group or aryl group having a substituent includes a group where the alkyl group, cycloalkyl group or aryl group is substituted by a cycloalkyl group. At this time, the alkyl group, cycloalkyl group or aryl group and the cycloalkyl group may be bonded through a linking group represented by A.

In the case where in formula (III), n1 is 2 and two $Rc_4$'s combine with each other to form a ring, specific preferred examples of the -A-$(Rc_4)_2$ group include a group represented by the following formula (IIIa):

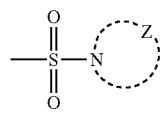
(IIIa)

In formula (IIIa), Z represents an atomic group necessary for forming a ring together with the nitrogen atom.

In formula (IIIa), the ring formed by Z together with the nitrogen atom is preferably a monocyclic or polycyclic 5- to 15-membered ring and other than the nitrogen atom and the carbon atom, the ring may further have a heteroatom (preferably an oxygen atom).

The acid represented by formula (III) may have a structure where a -A-$(C(Ra_1)(Ra_2))_{n2}$—$(O)_{n3}$—$(C(Ra_3)(Ra_4))_{n4}$—$SO_3H$ group is further bonded to the $Rc_4$ group in the acid represented by formula (III).

Specific examples of the acid represented by formula (III) are set forth below, but the present invention is not limited thereto.

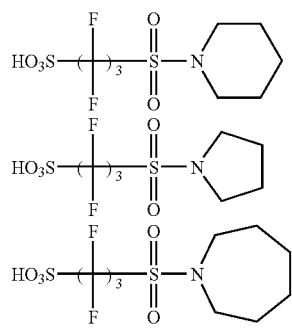

-continued

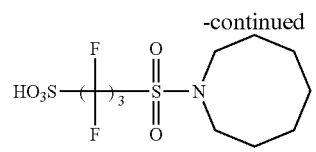

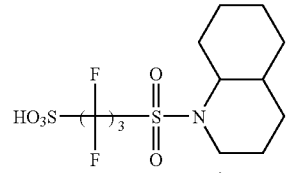

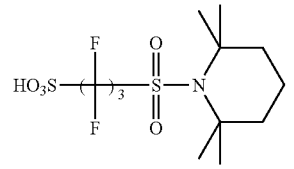

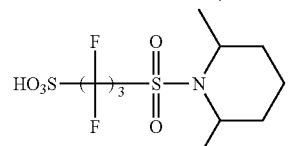

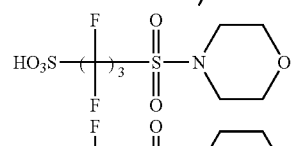

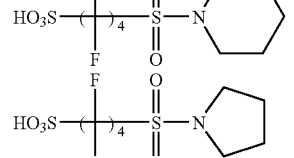

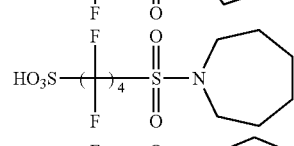

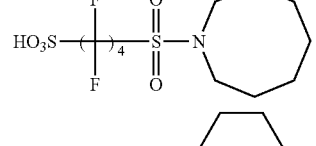

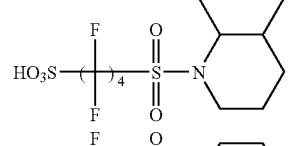

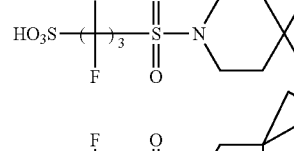

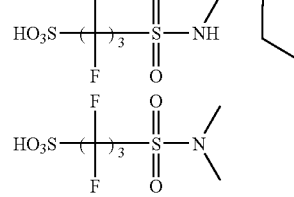

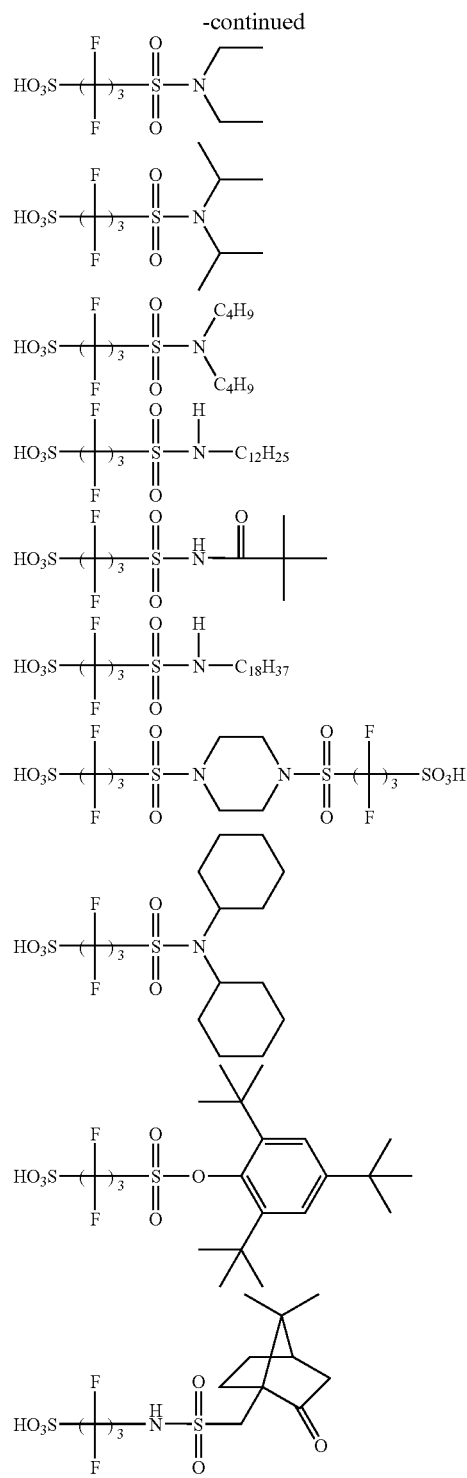
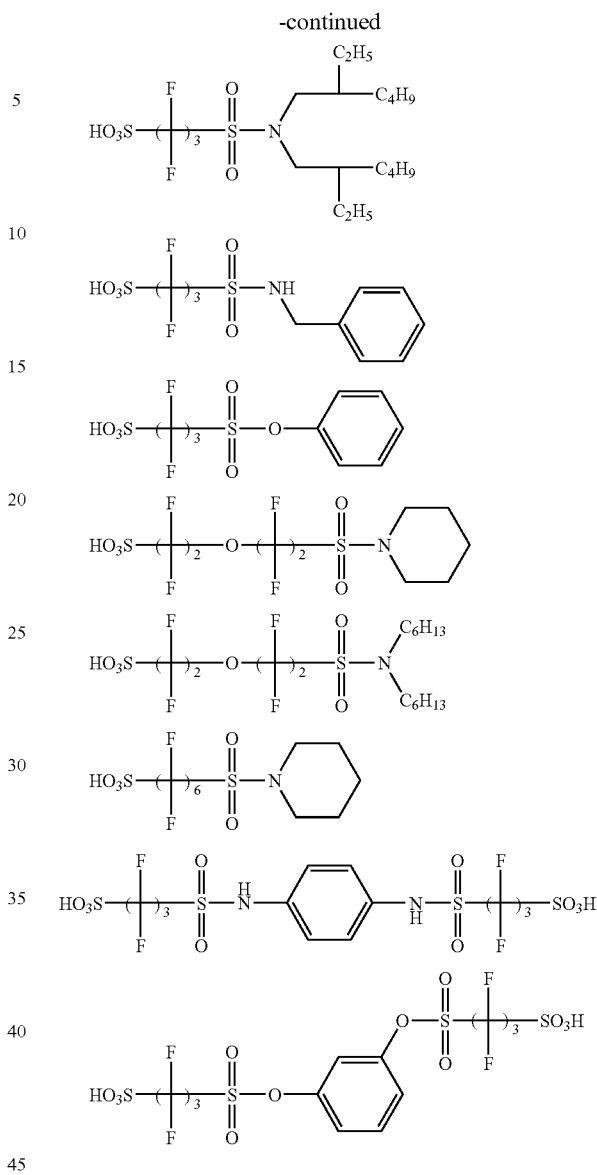

The compound capable of generating an acid represented by formula (III) upon irradiation with actinic rays or radiation is preferably a sulfonium or iodonium salt of the acid represented by formula (III), more preferably a compound where in formula (A1a) or (A2a), Xa⁻ is an anion after removing a hydrogen atom from the acid represented by formula (III).

Specific examples of the compound capable of generating an acid represented by formula (III) upon irradiation with actinic rays or radiation are set forth below, but the present invention is not limited thereto.

A2-III-1

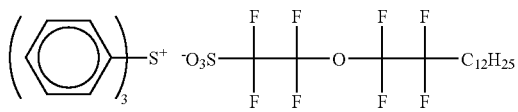

-continued
A2-III-2
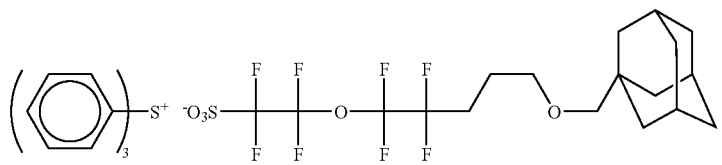
A2-III-3
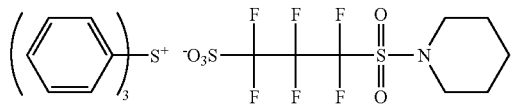
A2-III-4
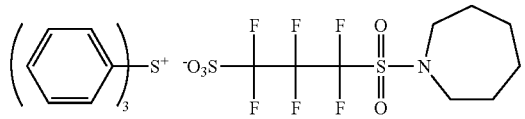
A2-III-5
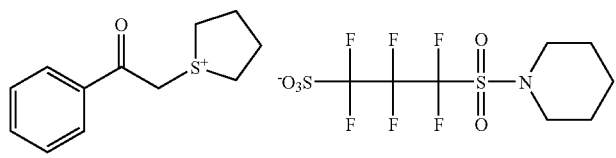
A2-III-6
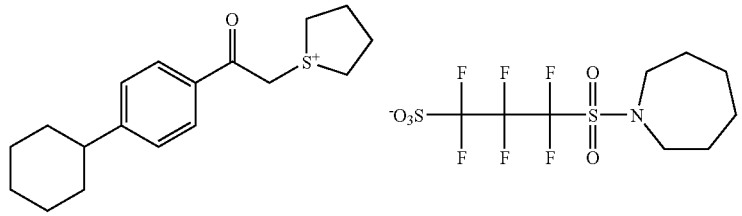
A2-III-7
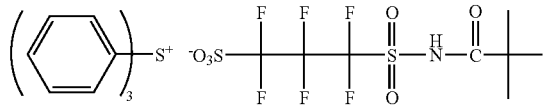
A2-III-8
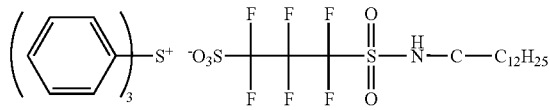
A2-III-9
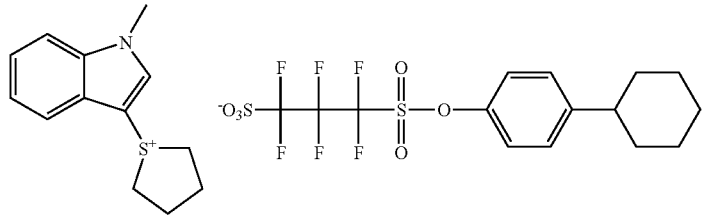
A2-III-10
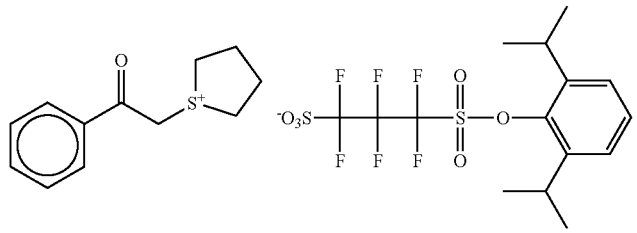

-continued
A2-III-11
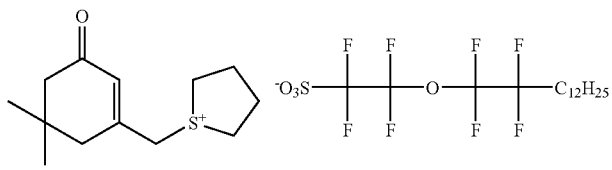
A2-III-12
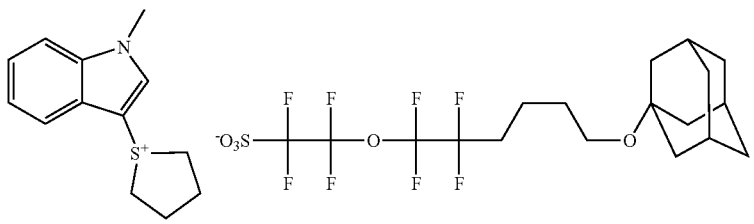
A2-III-13
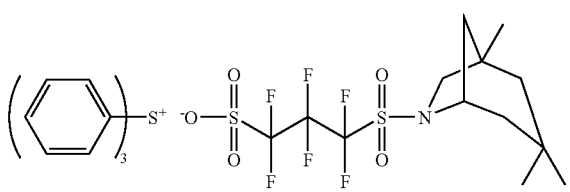
A2-III-14
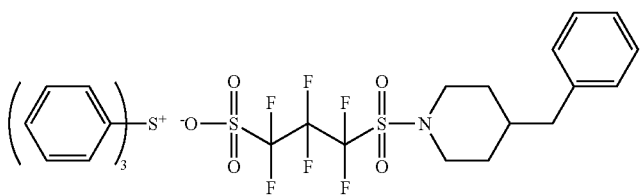
A2-III-15
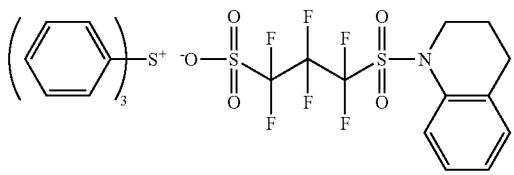
A2-III-16
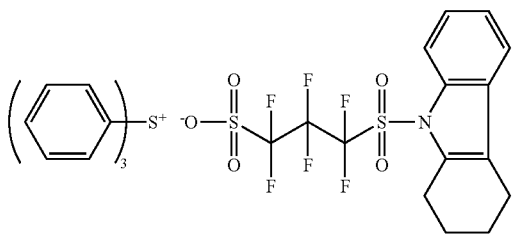
A2-III-17
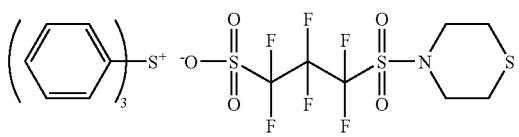
A2-III-18
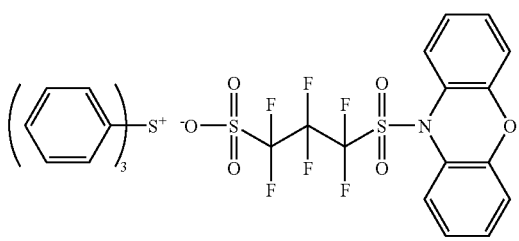

-continued
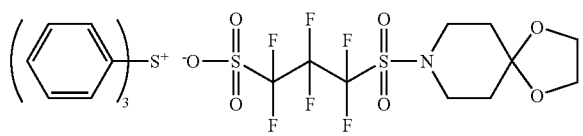
A2-III-19
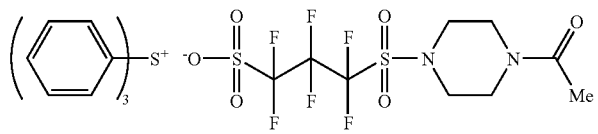
A2-III-20
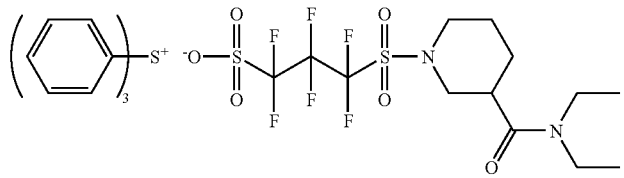
A2-III-21
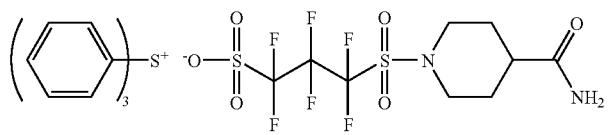
A2-III-22
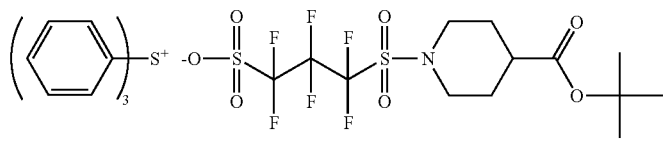
A2-III-23
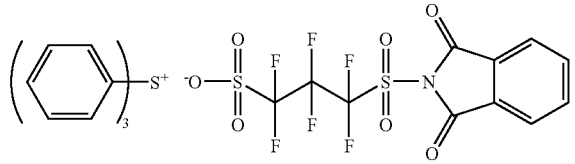
A2-III-24
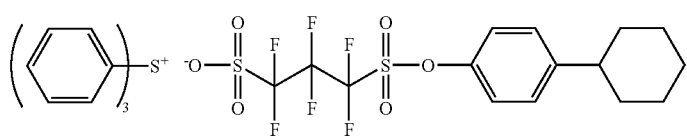
A2-III-25
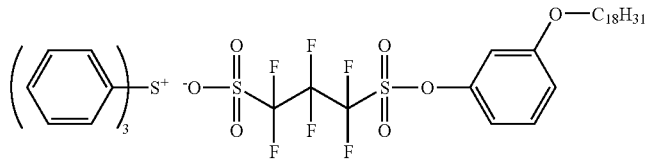
A2-III-26
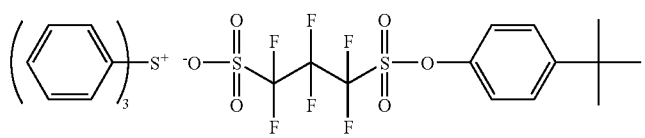
A2-III-27
A2-III-28
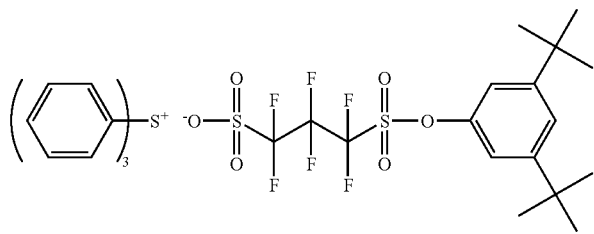

-continued

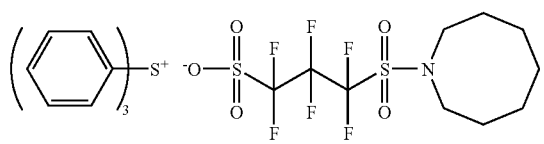

The total content of the compounds (A1) and (A2) is preferably from 0.1 to 15 weight %, more preferably from 0.5 to 10 weight %, still more preferably from 1 to 8 weight %, in the positive resist composition (as solid content).

As for the ratio of the compound (A1) to the compound (A2) used in the present invention, the compound (A1)/compound (A2) is, in terms of the molar ratio, preferably from 90/10 to 10/90, more preferably from 80/20 to 20/80.

(Acid Generator Used in Combination)

In the present invention, other than the compounds (A1) and (A2), a compound capable of decomposing to generate an acid upon irradiation with actinic rays or radiation (hereinafter, sometimes referred to as an "acid generator used in combination") may be further used in combination.

The amount added of the acid generator used in combination is, in terms of the molar ratio (compounds (A1) and (A2)/acid generator used in combination), usually from 100/0 to 50/50, preferably from 100/0 to 60/40, more preferably from 100/0 to 70/30.

As for the acid generator used in combination, a photoinitiator for photocationic polymerization, a photoinitiator for photoradical polymerization, a photo-decoloring agent for coloring matters, a photo-discoloring agent, a known compound capable of generating an acid upon irradiation with actinic rays or radiation, which is used for microresist and the like, or a mixture thereof may be appropriately selected and used.

Examples thereof include a diazonium salt, a phosphonium salt, a sulfonium salt, an iodonium salt, imidosulfonate, oxime sulfonate, diazodisulfone, disulfone and o-nitrobenzyl sulfonate.

Also, a compound where the above-described group or compound capable of generating an acid upon irradiation with actinic rays or radiation is introduced into the polymer main or side chain, such as compounds described in U.S. Pat. No. 3,849,137, German Patent 3,914,407, JP-A-63-26653, JP-A-55-164824, JP-A-62-69263, JP-A-63-146038, JP-A-63-163452, JP-A-62-153853 and JP-A-63-146029, may be used.

Furthermore, a compound capable of generating an acid by the effect of light described, for example, in U.S. Pat. No. 3,779,778 and European Patent 126,712 may also be used.

Among the compounds as the acid generator used in combination, preferred are the compounds represented by the following formulae (ZI), (ZII) and (ZIII):

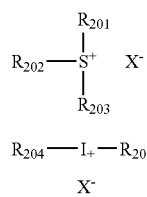

ZI

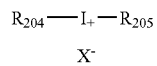

ZII

A2-III-29

-continued

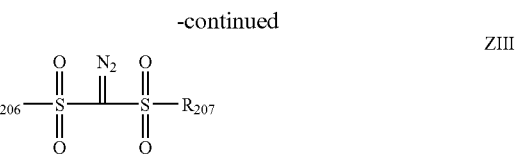

ZIII

In formula (ZI), $R_{201}$, $R_{202}$ and $R_{203}$ each independently represents an organic group.

$X^-$ represents a non-nucleophilic anion.

Examples of the non-nucleophilic anion as $X^-$ include a sulfonate anion, a carboxylate anion and a sulfonylimide anion.

The non-nucleophilic anion is an anion having an extremely low ability of causing a nucleophilic reaction and this anion can suppress the decomposition in aging due to an intramolecular nucleophilic reaction. By this anion, the aging stability of the resist is enhanced.

Examples of the sulfonate anion include an aliphatic sulfonate anion, an aromatic sulfonate anion and a camphorsulfonate anion.

Examples of the carboxylate anion include an aliphatic carboxylate anion, an aromatic carboxylate anion and an aralkylcarboxylate anion.

The aliphatic moiety in the aliphatic sulfonate anion may be an alkyl group or a cycloalkyl group but is preferably an alkyl group having a carbon number of 1 to 30 or a cycloalkyl group having a carbon number of 3 to 30, and examples thereof include a methyl group, an ethyl group, a propyl group, an isopropyl group, an n-butyl group, an isobutyl group, a sec-butyl group, a pentyl group, a neopentyl group, a hexyl group, a heptyl group, an octyl group, a nonyl group, a decyl group, an undecyl group, a dodecyl group, a tridecyl group, a tetradecyl group, a pentadecyl group, a hexadecyl group, a heptadecyl group, an octadecyl group, a nonadecyl group, an eicosyl group, a cyclopropyl group, a cyclopentyl group, a cyclohexyl group, an adamantyl group, a norbornyl group and a boronyl group.

The aryl group in the aromatic sulfonate anion is preferably an aryl group having a carbon number of 6 to 14, and examples thereof include a phenyl group, a tolyl group and a naphthyl group.

The alkyl group, cycloalkyl group, aryl group and camphor residue in the aliphatic sulfonate anion, aromatic sulfonate anion and camphorsulfonate anion each may have a substituent. Examples of the substituent for the alkyl group, cycloalkyl group, aryl group and camphor residue include a nitro group, a halogen atom (e.g., fluorine, chlorine, bromine, iodine), a carboxyl group, a hydroxyl group, an amino group, a cyano group, an alkoxy group (preferably having a carbon number of 1 to 5), a cycloalkyl group (preferably having a carbon number of 3 to 15), an aryl group (preferably having a carbon number of 6 to 14), an alkylthio group (preferably having a carbon number of 1 to 12), an alkoxycarbonyl group (preferably having a carbon number of 2 to 7), an acyl group (preferably having a carbon number of 2 to 12) and an alkoxycarbonyloxy group (preferably having a carbon number of 2 to 7). As for the aryl group or ring structure in each group, examples of the substituent further include an alkyl group (preferably having a carbon number of 1 to 15).

Examples of the aliphatic moiety in the aliphatic carboxylate anion include the same alkyl group and cycloalkyl group as in the aliphatic sulfonate anion.

Examples of the aryl group in the aromatic carboxylate anion include the same aryl group as in the aromatic sulfonate anion.

The aralkyl group in the aralkylcarboxylate anion is preferably an aralkyl group having a carbon number of 6 to 12, and examples thereof include a benzyl group, a phenethyl group, a naphthylmethyl group, a naphthylethyl group and a naphthylmethyl group.

The alkyl group, cycloalkyl group, aryl group and aralkyl group in the aliphatic carboxylate anion, aromatic carboxylate anion and aralkylcarboxylate anion each may have a substituent. Examples of the substituent for the alkyl group, cycloalkyl group, aryl group and aralkyl group include the same halogen atom, alkyl group, cycloalkyl group, alkoxy group and alkylthio group as in the aromatic sulfonate anion.

Examples of the sulfonylimide anion include saccharin anion.

Other examples of the non-nucleophilic anion include phosphorus fluoride, boron fluoride and antimony fluoride.

The non-nucleophilic anion of X$^-$ is preferably an aliphatic sulfonate anion with the α-position of the sulfonic acid being substituted by a fluorine atom, or an aromatic sulfonate anion substituted by a fluorine atom or a group having a fluorine atom, more preferably a perfluoroaliphatic sulfonate anion having a carbon number of 4 to 8 or a benzenesulfonate anion having a fluorine atom, and most preferably nonafluorobutanesulfonate anion, perfluorooctanesulfonate anion, pentafluorobenzenesulfonate anion or 3,5-bis(trifluoromethyl)benzenesulfonate anion.

In formula (ZI), the carbon number of the organic group as $R_{201}$, $R_{202}$ and $R_{203}$ is generally from 1 to 30, preferably from 1 to 20.

Also, two members out of $R_{201}$ to $R_{203}$ may combine to form a ring structure, and the ring may contain an oxygen atom, a sulfur atom, an ester bond, an amide bond or a carbonyl group.

The group formed by combining two members out of $R_{201}$, to $R_{203}$ includes an alkylene group (e.g., butylene, pentylene).

Examples of the organic group as $R_{201}$, $R_{202}$ and $R_{203}$ include the corresponding groups in the compounds (ZI-1), (ZI-2) and (ZI-3) which are described later.

The compound may be a compound having a plurality of structures represented by formula (Z1). For example, the compound may be a compound having a structure that at least one of $R_{201}$, to $R_{203}$ in the compound represented by formula (Z1) is bonded to at least one of $R_{201}$ to $R_{203}$ in another compound represented by formula (Z1).

The component (Z1) is more preferably a compound (ZI-1), (ZI-2) or (ZI-3) described below.

The compound (ZI-1) is an arylsulfonium compound where at least one of $R_{201}$ to $R_{203}$ in formula (Z1) is an aryl group, that is, a compound having an arylsulfonium as the cation.

In the arylsulfonium compound, $R_{201}$ to $R_{203}$ all may be an aryl group or a part of $R_{201}$ to $R_{203}$ may be an aryl group with the remaining being an alkyl group or a cycloalkyl group.

Examples of the arylsulfonium compound include a triarylsulfonium compound, a diarylalkylsulfonium compound, an aryldialkylsulfonium compound, a diarylcycloalkyl compound and an aryldicycloalkyl compound.

The aryl group in the arylsulfonium compound is preferably a phenyl group or a naphthyl group, more preferably a phenyl group. In the case where the arylsulfonium compound has two or more aryl groups, these two or more aryl groups may be the same of different.

The alkyl group or cycloalkyl group which is present, if desired, in the arylsulfonium compound is preferably a linear or branched alkyl group having a carbon number of 1 to 15 or a cycloalkyl group having a carbon number of 3 to 15, and examples thereof include a methyl group, an ethyl group, a propyl group, an n-butyl group, a sec-butyl group, a tert-butyl group, a cyclopropyl group, a cyclobutyl group and a cyclohexyl group.

The aryl group, alkyl group and cycloalkyl group of $R_{201}$, to $R_{203}$ each may have, as the substituent, an alkyl group (for example, an alkyl group having a carbon number of 1 to 15), a cycloalkyl group (for example, a cycloalkyl group having a carbon number of 3 to 15), an aryl group (for example, an aryl group having a carbon number of 6 to 14), an alkoxy group (for example, an alkoxy group having a carbon number of 1 to 15), a halogen atom, a hydroxyl group, a phenylthio group or the like. The substituent is preferably a linear or branched alkyl group having a carbon number of 1 to 12, a cycloalkyl group having a carbon number of 3 to 12, or a linear, branched or cyclic alkoxy group having a carbon number of 1 to 12, more preferably an alkyl group having a carbon number of 1 to 4, or an alkoxy group having a carbon number of 1 to 4. The substituent may be substituted to any one of three members $R_{201}$ to $R_{203}$ or may be substituted to all of these three members. In the case where $R_{201}$ to $R_{203}$ are an aryl group, the substituent is preferably substituted at the p-position of the aryl group.

The compound (ZI-2) is described below.

The compound (ZI-2) is a compound where $R_{201}$, to $R_{203}$ in formula (ZI) each independently represents an organic group having no aromatic ring. The aromatic ring as used herein includes an aromatic ring containing a heteroatom.

$R_{201}$ to $R_{203}$ each is independently preferably an alkyl group, a cycloalkyl group, an allyl group or a vinyl group, more preferably a linear or branched 2-oxoalkyl group, a 2-oxocycloalkyl group or an alkoxycarbonylmethyl group, and most preferably a linear or branched 2-oxoalkyl group.

The alkyl group and cycloalkyl group of $R_{201}$, to $R_{203}$ are preferably a linear or branched alkyl group having a carbon number of 1 to 10 (e.g., methyl, ethyl, propyl, butyl, pentyl) and a cycloalkyl group having a carbon number of 3 to 10 (e.g., cyclopentyl, cyclohexyl, norbornyl). The alkyl group is more preferably a 2-oxoalkyl group or an alkoxycarbonylmethyl group. The cycloalkyl group is more preferably a 2-oxocycloalkyl group.

The 2-oxoalkyl group may be either linear or branched and is preferably a group having >C=O at the 2-position of the above-described alkyl group.

The 2-oxocycloalkyl group is preferably a group having >C=O at the 2-position of the above-described cycloalkyl group.

The alkoxy group in the alkoxycarbonylmethyl group is preferably an alkyl group having a carbon number of 1 to 5 (e.g., methyl, ethyl, propyl, butyl, pentyl).

$R_{201}$ to $R_{203}$ each may be further substituted by a halogen atom, an alkoxy group (for example, an alkoxy group having a carbon number of 1 to 5), a hydroxyl group, a cyano group or a nitro group.

The compound (ZI-3) is a compound represented by the following formula (ZI-3), and this is a compound having a phenacylsulfonium salt structure.

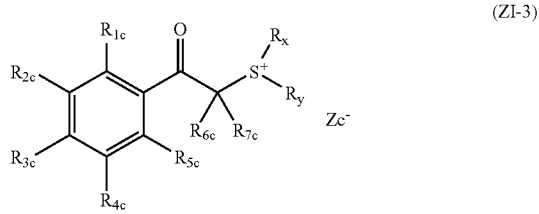

In formula (ZI-3), $R_{1c}$ to $R_{5c}$ each independently represents a hydrogen atom, an alkyl group, a cycloalkyl group, an alkoxy group or a halogen atom.

$R_{6c}$ and $R_{7c}$ each independently represents a hydrogen atom, an alkyl group or a cycloalkyl group.

$R_x$ and $R_y$ each independently represents an alkyl group, a cycloalkyl group, an allyl group or a vinyl group.

Any two or more members out of $R_{1c}$ to $R_{5c}$, the pair of $R_{6c}$ and $R_{7c}$, or the pair of $R_x$ and $R_y$ may combine with each other to form a ring structure. Examples of the group formed by combining these include a butylene group and a pentylene group. The ring structure may contain an oxygen atom, a sulfur atom, an ester bond or an amide bond.

$Zc^-$ represents a non-nucleophilic anion, and examples thereof are the same as those of the non-nucleophilic anion of $X^-$ in formula (ZI).

The alkyl group as $R_{1c}$ to $R_{7c}$, may be either linear or branched and this is, for example, an alkyl group having a carbon number of 1 to 20, preferably a linear or branched alkyl group having a carbon number of 1 to 12 (e.g., methyl, ethyl, linear or branched propyl, linear or branched butyl, linear or branched pentyl). The cycloalkyl group is, for example, a cycloalkyl group having a carbon number of 3 to 8 (e.g., cyclopentyl, cyclohexyl).

The alkoxy group as $R_{1c}$ to $R_{5c}$ may be linear, branched or cyclic and this is, for example, an alkoxy group having a carbon number of 1 to 10, preferably a linear or branched alkoxy group having a carbon number of 1 to 5 (e.g., methoxy, ethoxy, linear or branched propoxy, linear or branched butoxy, linear or branched pentoxy) or a cyclic alkoxy group having a carbon number of 3 to 8 (e.g., cyclopentyloxy, cyclohexyloxy).

A compound where any one of $R_{1c}$ to $R_{5c}$ is a linear or branched alkyl group, a cycloalkyl group or a linear, branched or cyclic alkoxy group is preferred, and a compound where the sum of carbon numbers of $R_{1c}$ to $R_{5c}$ is from 2 to 15 is more preferred. In this case, the solubility in a solvent is more enhanced, and production of particles during storage can be suppressed.

The alkyl group and cycloalkyl group as $R_x$ and $R_y$ include the same alkyl group and cycloalkyl group as in $R_{1c}$ to $R_{7c}$. A 2-oxoalkyl group, a 2-oxocycloalkyl group and an alkoxycarbonylmethyl group are preferred.

The 2-oxoalkyl group and 2-oxocycloalkyl group include a group having >C=O at the 2-position of the alkyl group or cycloalkyl group as $R_{1c}$ to $R_{7c}$.

The alkoxy group in the alkoxycarbonylmethyl group includes the same alkoxy group as in $R_{1c}$ to $R_{5c}$.

$R_x$ and $R_y$ each is preferably an alkyl or cycloalkyl group having a carbon number of 4 or more, more preferably 6 or more, still more preferably 8 or more.

In formulae (ZII) and (ZIII), $R_{204}$ to $R_{207}$ each independently represents an aryl group, an alkyl group or a cycloalkyl group.

The aryl group of $R_{204}$ to $R_{207}$ is preferably a phenyl group or a naphthyl group, more preferably a phenyl group.

The alkyl group and cycloalkyl group in $R_{204}$ to $R_{207}$ are preferably a linear or branched alkyl group having a carbon number of 1 to 10 (e.g., methyl, ethyl, propyl, butyl, pentyl) and a cycloalkyl group having a carbon number of 3 to 10 (e.g., cyclopentyl, cyclohexyl, norbornyl).

Examples of the substituent which $R_{204}$ to $R_{207}$ each may have include an alkyl group (for example, an alkyl group having a carbon number of 1 to 15), a cycloalkyl group (for example, a cycloalkyl group having a carbon number of 3 to 15), an aryl group (for example, an aryl group having a carbon number of 6 to 15), an alkoxy group (for example, an alkoxy group having a carbon number of 1 to 15), a halogen atom, a hydroxyl group and a phenylthio group.

$X^-$ represents a non-nucleophilic anion, and examples thereof are the same as those of the non-nucleophilic anion of $X^-$ in formula (ZI).

Other examples of the acid generator used in combination include the compounds represented by the following formulae (ZIV), (ZV) and (ZVI):

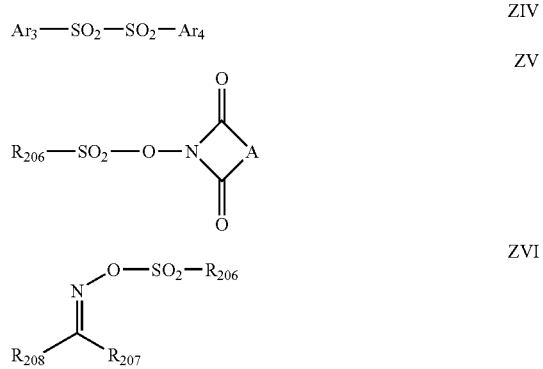

In formulae (ZIV) to (ZVI), $Ar_3$ and $Ar_4$ each independently represents an aryl group.

$R_{206}$, $R_{207}$ and $R_{208}$ each independently represents an alkyl group, a cycloalkyl group or an aryl group.

A represents an alkylene group, an alkenylene group or an arylene group.

Among the acid generators used in combination, more preferred are the compounds represented by formulae (ZI) to (ZIII).

The acid generator used in combination is preferably a compound capable of generating a sulfonic acid having one sulfonic acid, more preferably a compound capable of generating a monovalent perfluoroalkanesulfonic acid, or a compound capable of generating an aromatic sulfonic acid substituted by a fluorine atom or a fluorine atom-containing group, still more preferably a sulfonium salt of a monovalent perfluoroalkanesulfonic acid.

Specific preferred examples of the acid generator used in combination are set forth below.

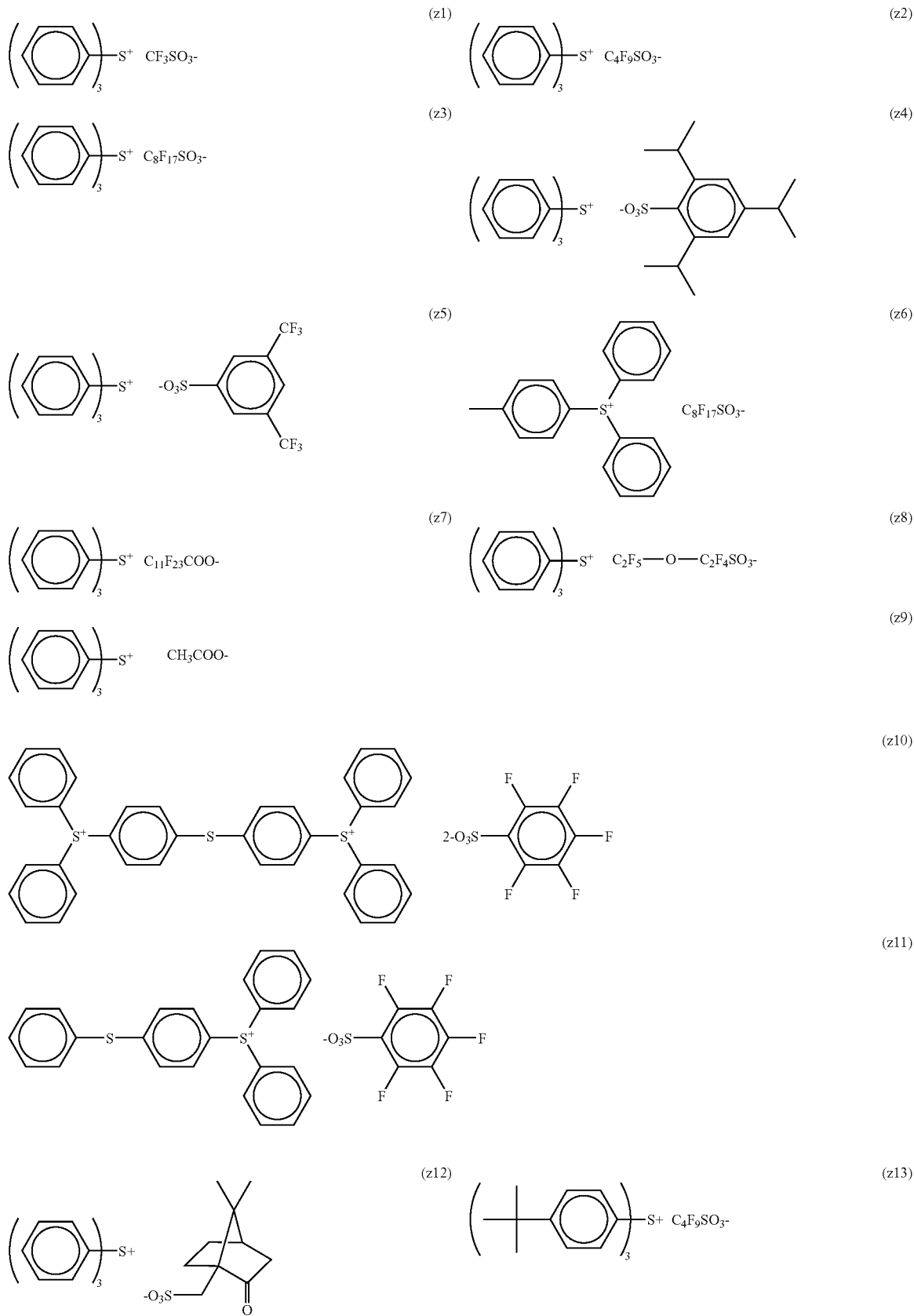

-continued
(z14)
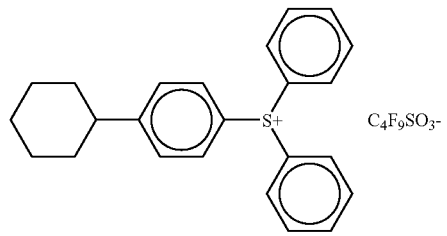
(z15)
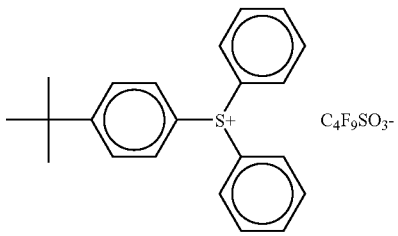
(z16)
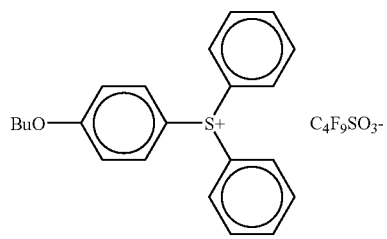
(z17)
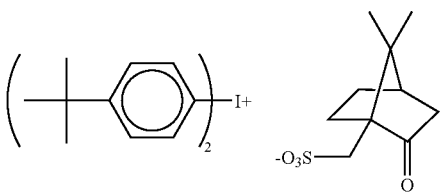
(z18)
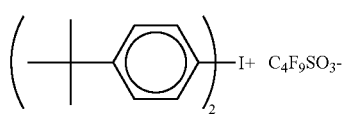
(z19)
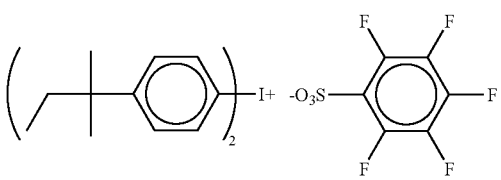
(z20)
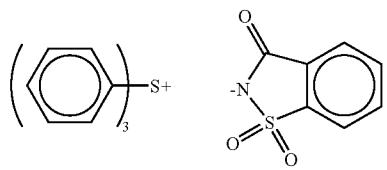
(z21)
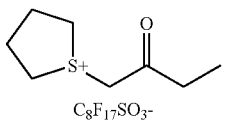
(z22)
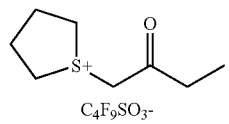
(z23)
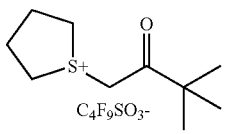
(z24)
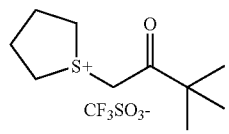
(z25)
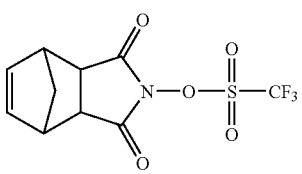
(z26)
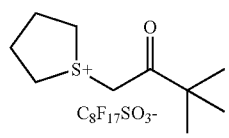
(z27)
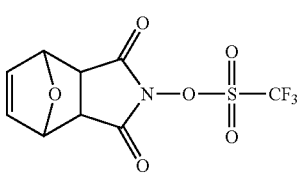
(z28)
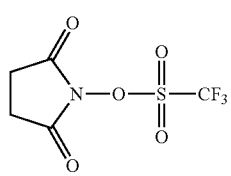
(z29)
(z30)
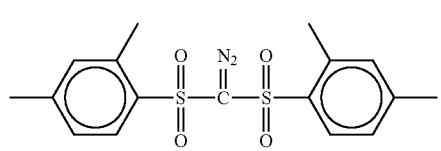
(z31)
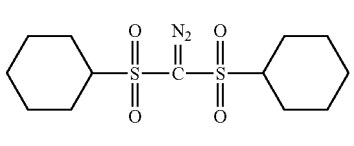

-continued
(z32) 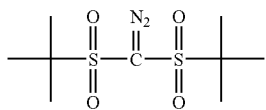
(z33) 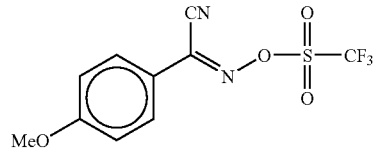
(z34) 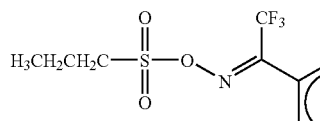
(z35) 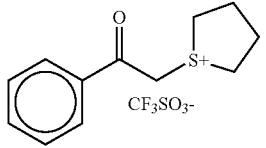
(z36) 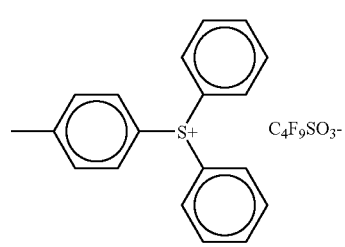
(z37) 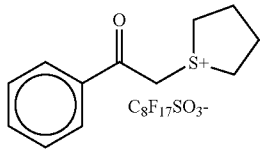
(z38) 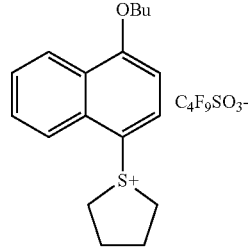
(z39) 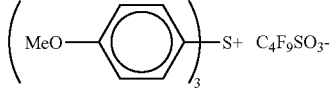
(z40) 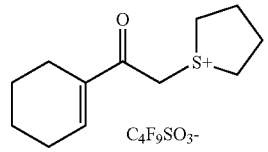
(z41) 
(z42) 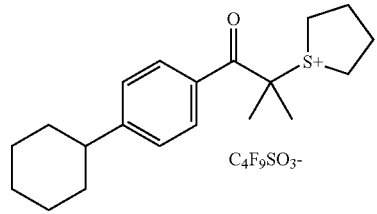
(z43) 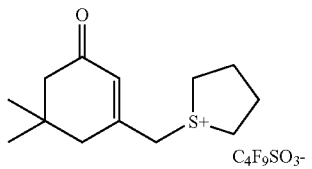
(z44) 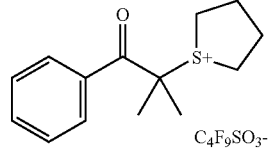
(z45) 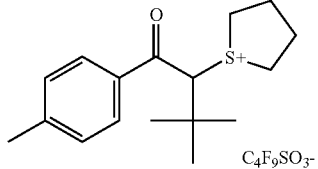
(z46) 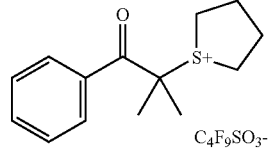

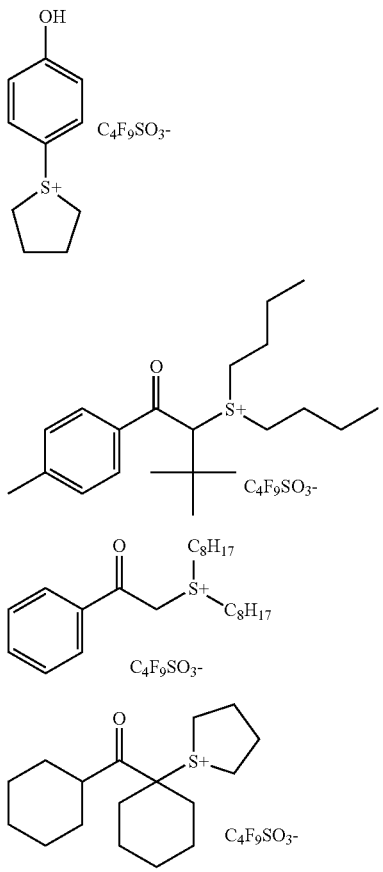
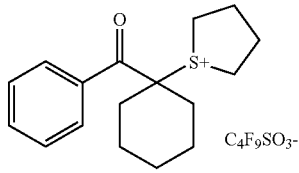
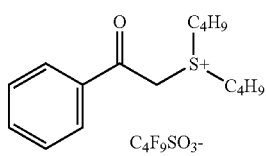
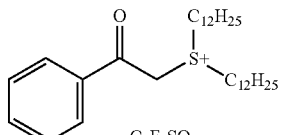
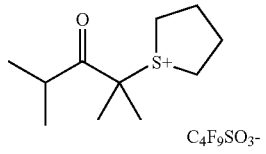
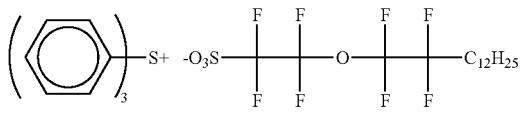
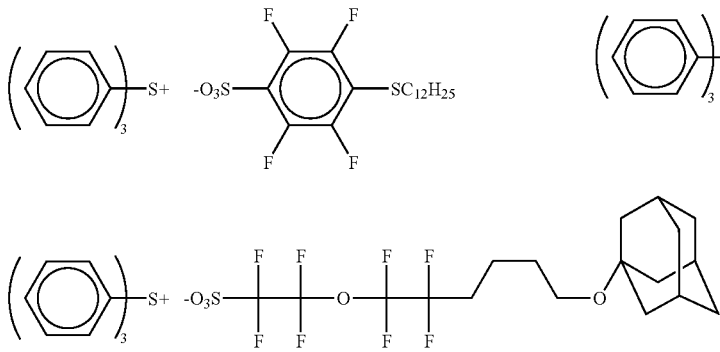

The total content of the compounds (A1) and (A2) and the acid generator used in combination is preferably from 0.1 to 15 weight %, more preferably from 0.5 to 10 weight %, still more preferably from 1 to 8 weight %, in the positive resist composition (as solid content).

In the case of using the acid generator used in combination, the ratio of the compound as the component (A2) occupying in the sum total of the amounts added of acid generators is preferably from 20 to 80 mol %.

[2] (B) Resin Capable of Decomposing Under the Action of an Acid to Increase the solubility in an alkali developer In the case of irradiating ArF excimer laser light on the positive resist composition of the present invention, the resin as the component (B) is preferably a resin having a monocyclic or polycyclic alicyclic hydrocarbon structure and being capable of decomposing under the action of an acid to increase the solubility in an alkali developer.

The resin having a monocyclic or polycyclic alicyclic hydrocarbon structure and being capable of decomposing under the action of an acid to increase the solubility in an alkali developer (hereinafter sometimes referred to as an "alicyclic hydrocarbon-based acid-decomposable resin") is preferably a resin containing at least one repeating unit selected from the group consisting of a repeating unit having an alicyclic hydrocarbon-containing partial structure represented by any one of the following formulae (pI) to (pV), and a repeating unit represented by the following formula (II-AB):

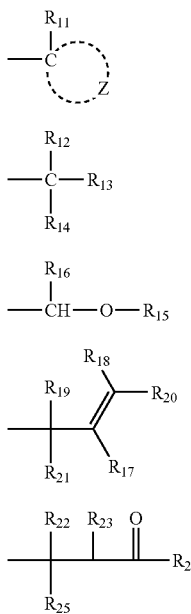 (pI)

(pII)

(pIII)

(pIV)

(pV)

In formulae (pI) to (pV), $R_{11}$ represents a methyl group, an ethyl group, an n-propyl group, an isopropyl group, an n-butyl group, an isobutyl group or a sec-butyl group. Z represents an atomic group necessary for forming a cycloalkyl group together with the carbon atom.

$R_{12}$ to $R_{16}$ each independently represents a linear or branched alkyl group having a carbon number of 1 to 4 or a cycloalkyl group, provided that at least one of $R_{12}$ to $R_{14}$ or either one of $R_{15}$ and $R_{16}$ represents a cycloalkyl group.

$R_{17}$ to $R_{21}$, each independently represents a hydrogen atom, a linear or branched alkyl group having a carbon number of 1 to 4 or a cycloalkyl group, provided that at least one of $R_{17}$ to $R_{21}$ represents a cycloalkyl group and that either one of $R_{19}$ and $R_{21}$ represents a linear or branched alkyl group having a carbon number of 1 to 4 or a cycloalkyl group.

$R_{22}$ to $R_{25}$ each independently represents a hydrogen atom, a linear or branched alkyl group having a carbon number of 1 to 4 or a cycloalkyl group, provided that at least one of $R_{22}$ to $R_{25}$ represents a cycloalkyl group. $R_{23}$ and $R_{24}$ may combine with each other to form a ring.

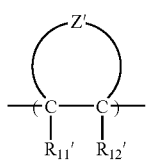 (II-AB)

In formula (II-AB), $R_{11}'$, and $R_{12}'$ each independently represents a hydrogen atom, a cyano group, a halogen atom or an alkyl group.

Z' represents an atomic group for forming an alicyclic structure, containing two bonded carbon atoms (C—C).

Formula (II-AB) is preferably the following formula (II-AB 1) or (II-AB2).

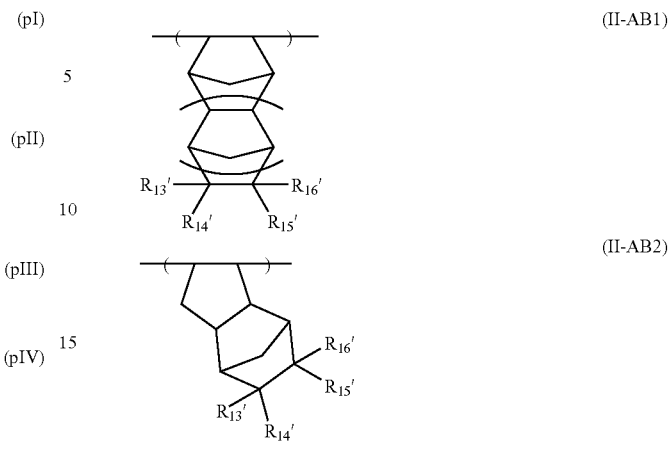

In formulae (II-AB1) and (II-AB2), $R_{13}'$ to $R_{16}'$ each independently represents a hydrogen atom, a halogen atom, a cyano group, —COOH, —COOR$_5$, a group capable of decomposing under the action of an acid, —C(=O)—X-A'-$R_{17}'$, an alkyl group or a cycloalkyl group, and at least two members out of $R_{13}'$ to $R_{16}'$ may combine to form a ring.

$R_5$ represents an alkyl group, a cycloalkyl group or a group having a lactone structure.

X represents an oxygen atom, a sulfur atom, —NH—, —NHSO$_2$— or —NHSO$_2$NH—.

A' represents a sing bond or a divalent linking group.

$R_{17}'$ represents —COOH, —COOR$_5$, —CN, a hydroxyl group, an alkoxy group, —CO—NH—R$_6$, —CO—NH—SO$_2$—R$_6$ or a group having a lactone structure.

$R_6$ represents an alkyl group or a cycloalkyl group.

n represents 0 or 1.

In formulae (pI) to (pV), examples of the linear or branched alkyl group having a carbon number of 1 to 4 of $R_{12}$ to $R_{25}$ include a methyl group, an ethyl group, an n-propyl group, an isopropyl group, an n-butyl group, an isobutyl group and a sec-butyl group.

The cycloalkyl group of $R_{11}$ to $R_{25}$ and the cycloalkyl group formed by Z together with the carbon atom may be monocyclic or polycyclic. Specific examples thereof include a group having a carbon number of 5 or more and having a monocyclo, bicyclo, tricyclo or tetracyclo structure or the like. The carbon number thereof is preferably from 6 to 30, more preferably from 7 to 25. These cycloalkyl groups each may have a substituent.

Preferred examples of the cycloalkyl group include an adamantyl group, a noradamantyl group, a decalin residue, a tricyclodecanyl group, a tetracyclododecanyl group, a norbornyl group, a cedrol group, a cyclopentyl group, a cyclohexyl group, a cycloheptyl group, a cyclooctyl group, a cyclodecanyl group and a cyclododecanyl group. Among these, more preferred are an adamantyl group, a norbornyl group, a cyclohexyl group, a cyclopentyl group, a tetracyclododecanyl group and a tricyclodecanyl group.

Examples of the substituent which these alkyl group and cycloalkyl group may further have include an alkyl group (having a carbon number of 1 to 4), a halogen atom, a hydroxyl group, an alkoxy group (having a carbon number of 1 to 4), a carboxyl group and an alkoxycarbonyl group (having a carbon number of 2 to 6). Examples of the substituent which these alkyl group, alkoxy group, alkoxycarbonyl group and the like may further have include a hydroxyl group, a halogen atom and an alkoxy group.

The structures represented by formulae (pI) to (pV) each can be used for the protection of an alkali-soluble group in the resin. Examples of the alkali-soluble group include various groups known in this technical field.

Specific examples thereof include a structure where the hydrogen atom of a carboxylic acid group, a sulfonic acid group, a phenol group or a thiol group is replaced by the structure represented by any one of formulae (pI) to (pV). Among these, preferred is a structure where the hydrogen atom of a carboxylic acid group or a sulfonic acid group is replaced by the structure represented by any one of formulae (PI) to (pV).

The repeating unit having an alkali-soluble group protected by the structure represented by any one of formulae (pI) to (pV) is preferably a repeating unit represented by the following formula (pA):

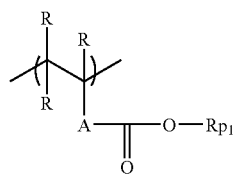

(PA)

In formula (pA), R represents a hydrogen atom, a halogen atom or a linear or branched alkyl group having a carbon number of 1 to 4, and a plurality of R's may be the same or different.

A represents a single bond, or sole group or a combination of two or more groups, selected from the group consisting of an alkylene group, an ether group, a thioether group, a carbonyl group, an ester group, an amido group, a sulfonamido group, a urethane group and a urea group. A is preferably a single bond.

$Rp_1$ represents any one group of formulae (pI) to (pV).

The repeating unit represented by formula (pA) is preferably a repeating unit comprising a 2-alkyl-2-adamantyl (meth)acrylate or a dialkyl(1-adamantyl)methyl (meth)acrylate.

Specific examples of the repeating unit represented by formula (pA) are set forth below.

(In the formulae, Rx represents H, $CH_3$, $CF_3$ or $CH_2OH$, and Rxa and Rxb each independently resents an alkyl group having a carbon number of 1 to 4.)

1

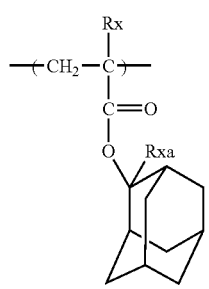

2

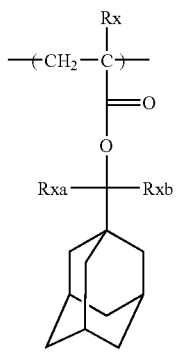

3

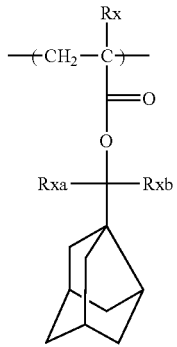

4

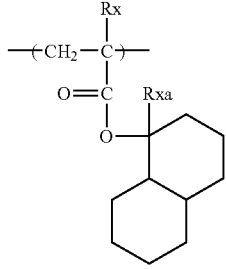

5

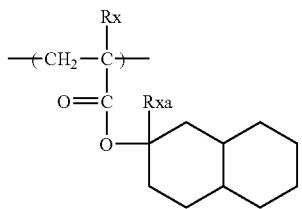

6

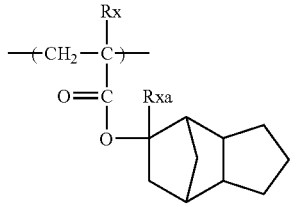

7

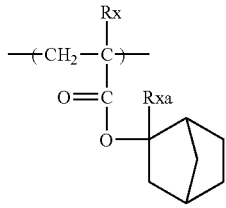

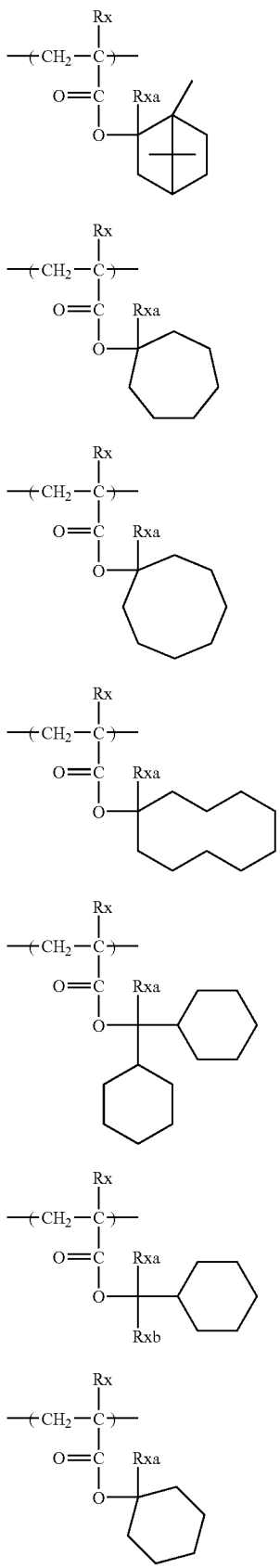
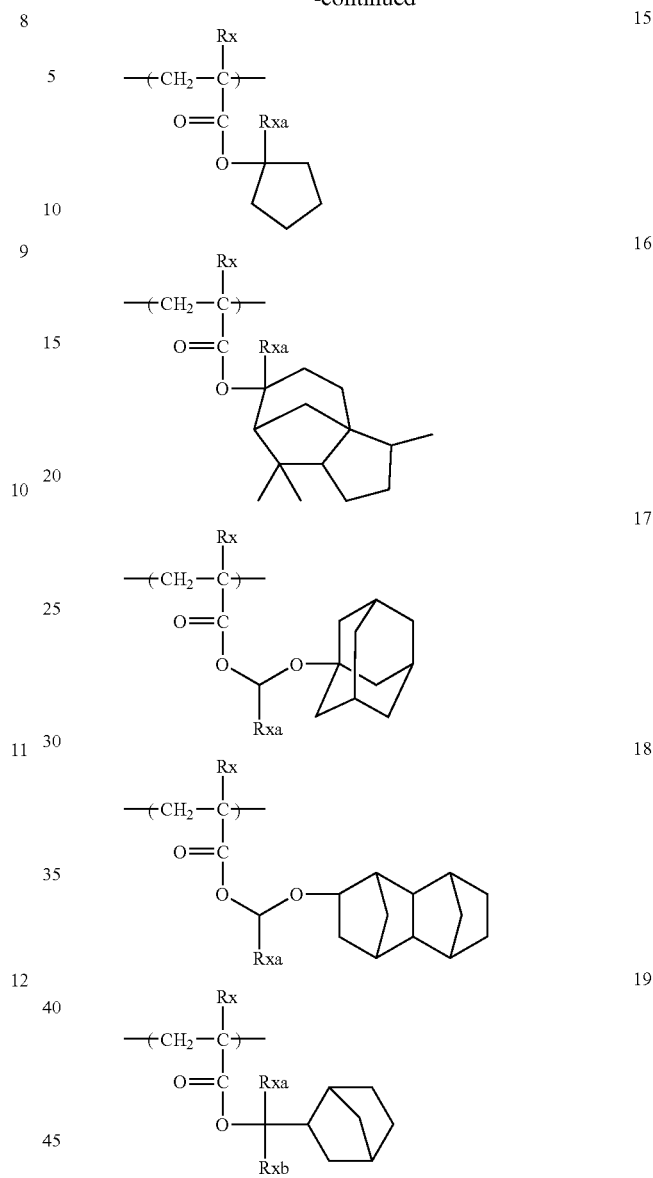

Examples of the halogen atom of $R_{11}'$ and $R_{12}'$ in formula (II-AB) include a chlorine atom, a bromine atom, a fluorine atom and an iodine atom.

The alkyl group of $R_{11}'$ and $R_{12}'$ includes a linear or branched alkyl group having a carbon number of 1 to 10.

The atomic group of Z' for forming an alicyclic structure is an atomic group of forming, in the resin, an alicyclic hydrocarbon repeating unit which may have a substituent. In particular, an atomic group of forming a crosslinked alicyclic structure to form a crosslinked alicyclic hydrocarbon repeating unit is preferred. Examples of the skeleton of the alicyclic hydrocarbon formed are the same as those of the alicyclic hydrocarbon group (cycloalkyl group) of $R_{12}$ to $R_{25}$ in formulae (pI) to (pVI). The alicyclic hydrocarbon skeleton may have a substituent, and examples of the substituent include $R_{13}'$ to $R_{16}'$ in formulae (II-AB1) and (II-AB2).

In the alicyclic hydrocarbon-based acid-decomposable resin for use in the present invention, the group capable of decomposing under the action of an acid may be contained in at least one repeating unit out of the repeating unit having an alicyclic hydrocarbon-containing partial structure represented by any one of formulae (pI) to (pV), the repeating unit represented by formula (II-AB), and the repeating unit comprising a copolymerization component described later.

Specific examples of the repeating units represented by formulae (II-AB1) and (II-AB2) are set forth below, but the present invention is not limited thereto.

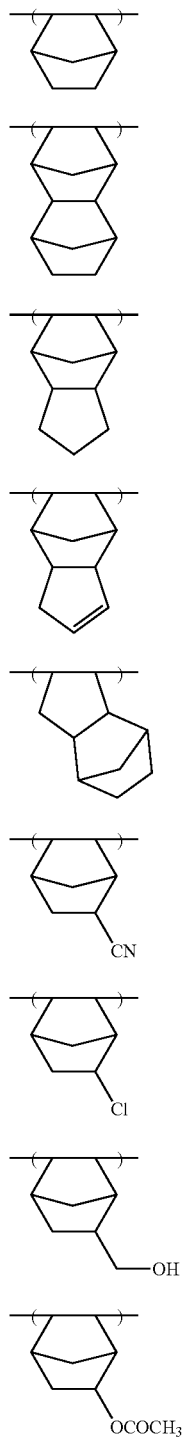

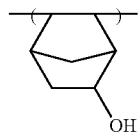

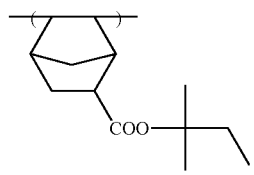

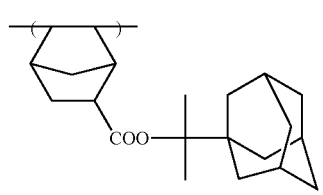

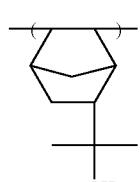

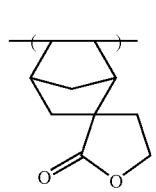

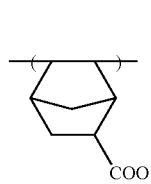

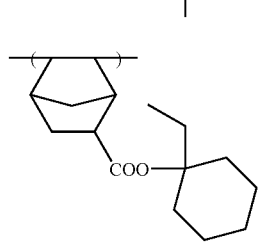

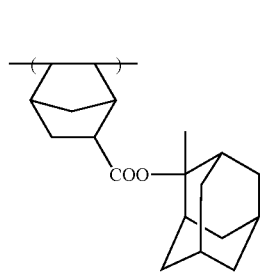

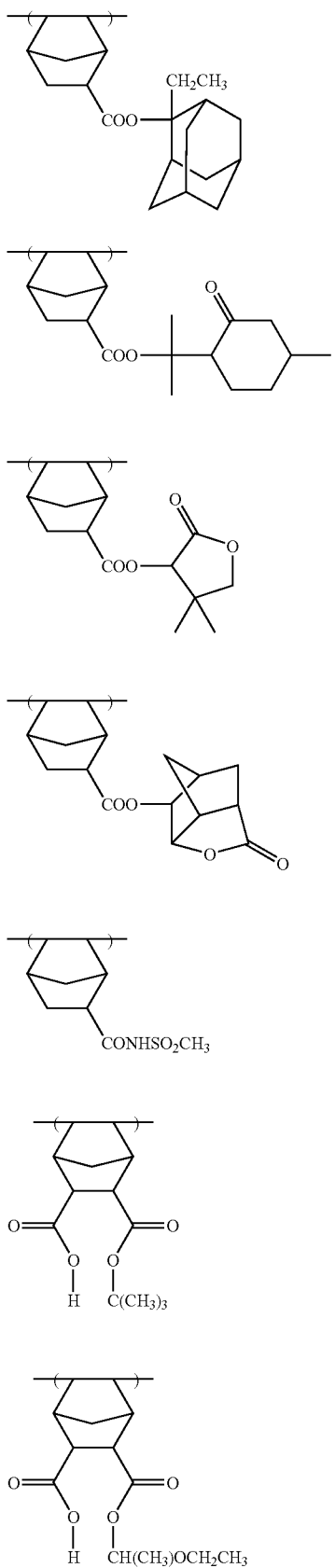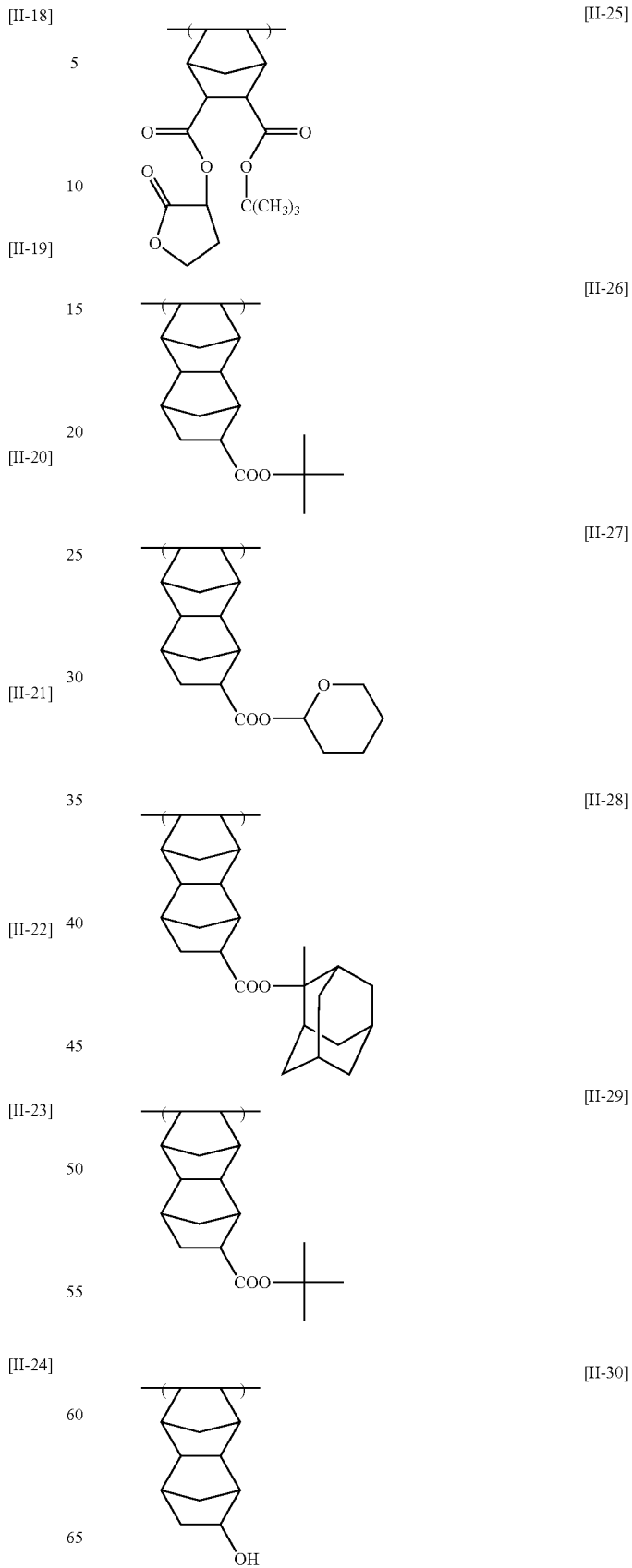

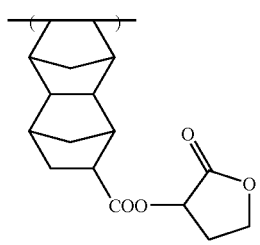
[II-31]

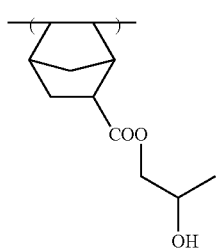
[II-32]

The alicyclic hydrocarbon-based acid-decomposable resin for use in the present invention preferably has a lactone group. As for the lactone group, any group may be used as long as it has a lactone structure, but a group having a 5- to 7-membered ring lactone structure is preferred. The 5- to 7-membered ring lactone structure is preferably condensed with another ring structure in the form of forming a bicyclo or spiro structure. It is more preferred to have a repeating unit containing a group having a lactone structure represented by any one of the following formulae (LC1-1) to (LC1-16). The group having a lactone structure may be bonded directly to the main chain. Among these lactone structures, (LC1-1), (LC1-4), (LC1-5), (LC1-6), (LC1-13) and (LC1-14) are preferred. By virtue of using a specific lactone structure, the line edge roughness and the development defect are improved.

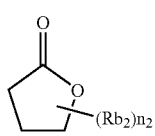
LC1-1

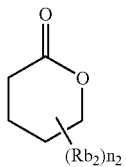
LC1-2

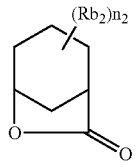
LC1-3

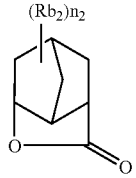
LC1-4

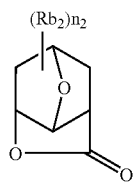
LC1-5

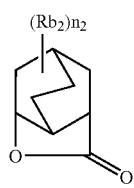
LC1-6

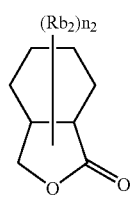
LC1-7

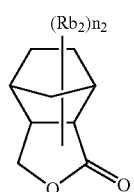
LC1-8

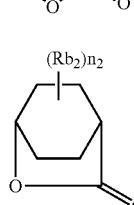
LC1-9

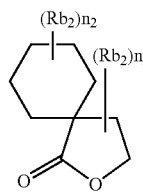
LC1-10

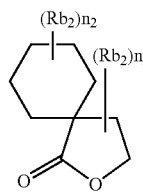
LC1-11

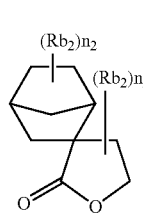
LC1-12

-continued

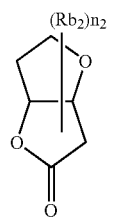
LC1-13

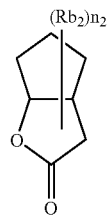
LC1-14

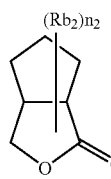
LC1-15

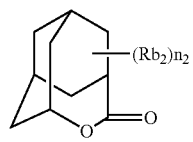
LC1-16

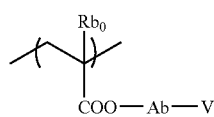

The lactone structure moiety may or may not have a substituent ($Rb_2$). Preferred examples of the substituent ($Rb_2$) include an alkyl group having a carbon number of 1 to 8, a cycloalkyl group having a carbon number of 4 to 7, an alkoxy group having a carbon number of 1 to 8, an alkoxycarbonyl group having a carbon number of 1 to 8, a carboxyl group, a halogen atom, a hydroxyl group, a cyano group and an acid-decomposable group. $n_2$ represents an integer of 0 to 4. When $n_2$ is an integer of 2 or more, the plurality of $Rb_2$'s may be the same or different and also, the plurality of $Rb_2$'s may combine with each other to form a ring.

Examples of the repeating unit containing a group having a lactone structure represented by any one of formulae (LC1-1) to (LC1-16) include a repeating unit where at least one of $R_{13}'$ to $R_{16}'$ in formula (II-AB1) or (II-AB2) has a group represented by any one of formulae (LC1-1) to (LC1-16) (for example, $R_5$ of —$COOR_5$ is a group represented by any one of formulae (LC1-1) to (LC1-16)), and a repeating unit represented by the following formula (AI):

(AI)

[Structure: $Rb_0$ / COO—Ab—V]

In formula (AI), $Rb_0$ represents a hydrogen atom, a halogen atom or an alkyl group having a carbon number of 1 to 4. Examples of the substituent which the alkyl group of $Rb_0$ may have include a hydroxyl group and a halogen atom.

Examples of the halogen atom of $Rb_0$ include a fluorine atom, a chlorine atom, a bromine atom and an iodine atom.

$Rb_0$ is preferably a hydrogen atom or a methyl group.

Ab represents an alkylene group, a divalent linking group having a monocyclic or polycyclic alicyclic hydrocarbon structure, a single bond, an ether group, an ester group, a carbonyl group, a carboxyl group, or a divalent group comprising a combination thereof, preferably a single bond or a linking group represented by -$Ab_1$-$CO_2$—. $Ab_1$ is a linear or branched alkylene group or a monocyclic or polycyclic cycloalkylene group, preferably a methylene group, an ethylene group, a cyclohexyl group, an adamantyl group or a norbornyl group.

V represents a group represented by any one of formulae (LC1-1) to (LC 1-16).

The repeating unit having a lactone structure usually has an optical isomer, but any optical isomer may be used. One optical isomer may be used alone or a mixture of a plurality of optical isomers may be used. In the case of mainly using one optical isomer, the optical purity (ee) thereof is preferably 90 or more, more preferably 95 or more.

Specific examples of the repeating unit containing a group having a lactone structure are set forth below, but the present invention is not limited thereto.

(In the formulae, Rx is H, $CH_3$, $CH_2OH$ or $CF_3$.)

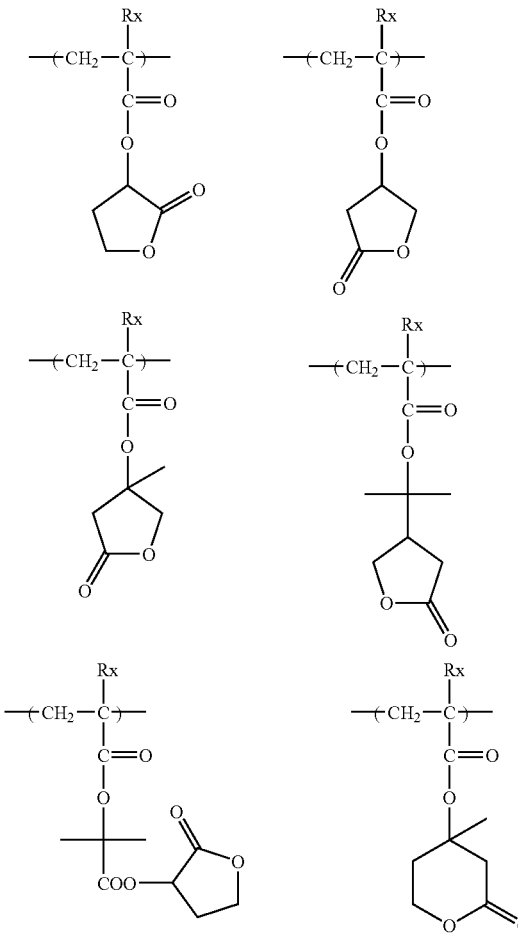

-continued
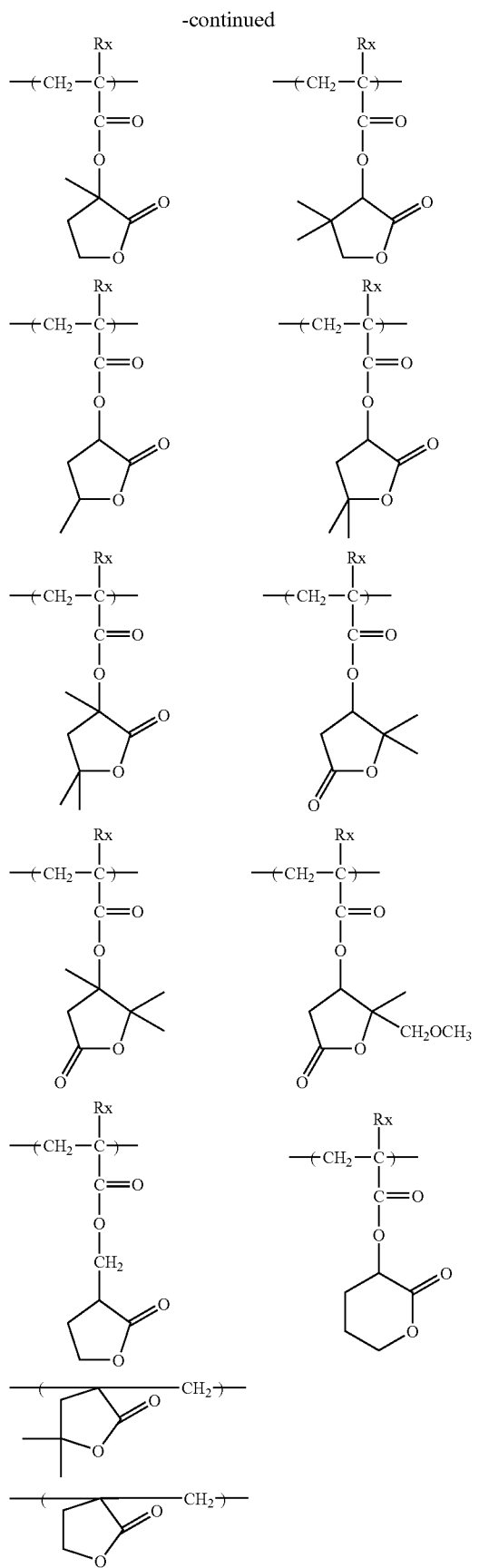
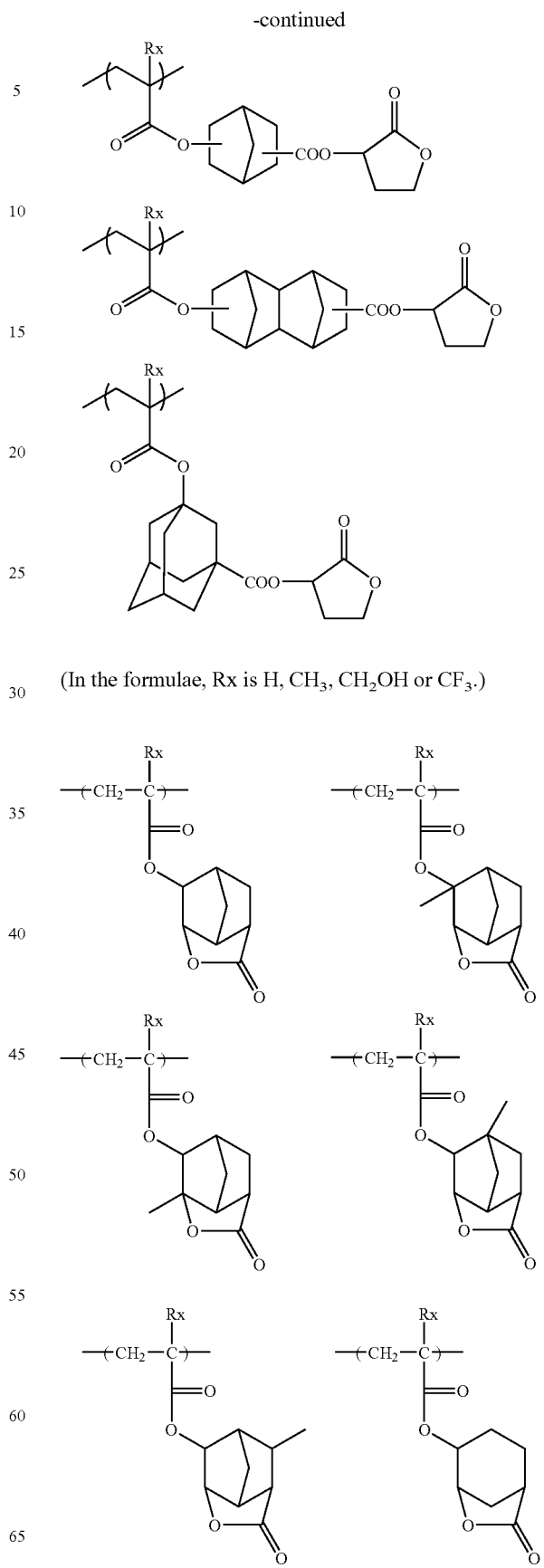
(In the formulae, Rx is H, CH₃, CH₂OH or CF₃.)

-continued
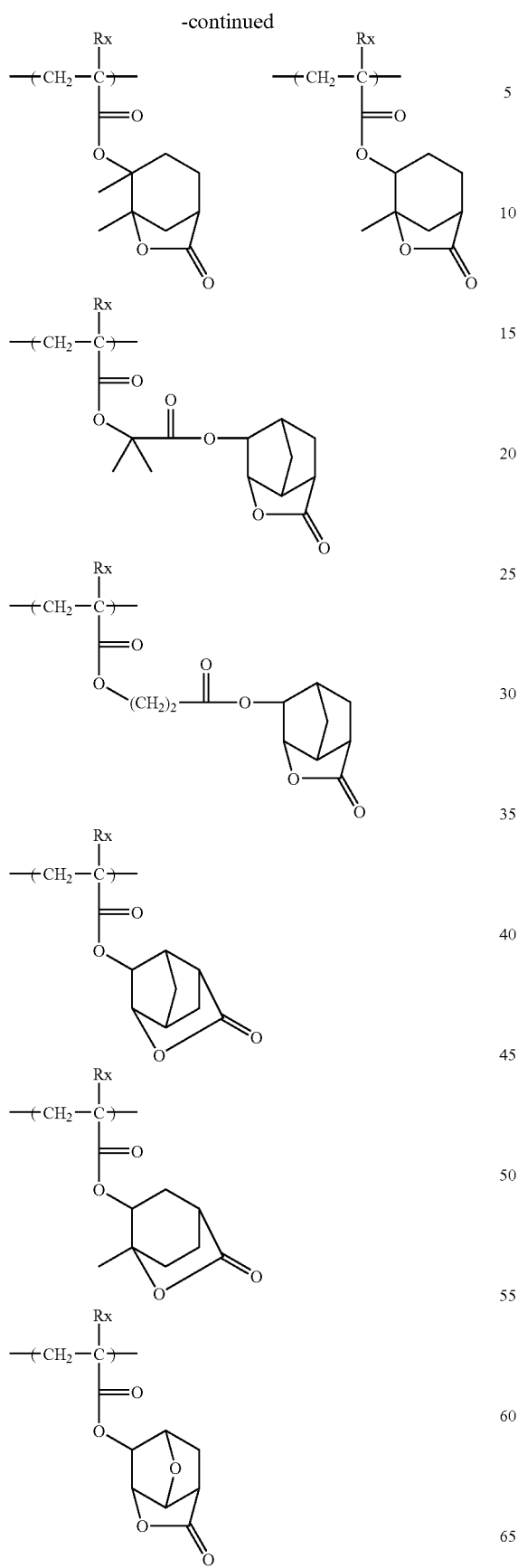
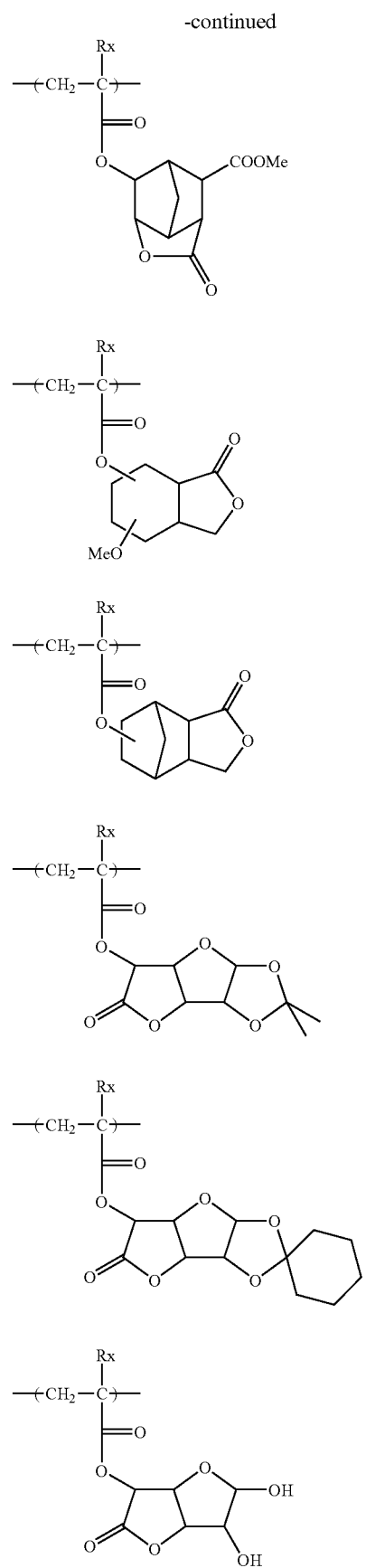

-continued
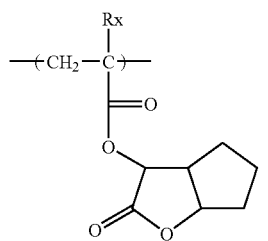
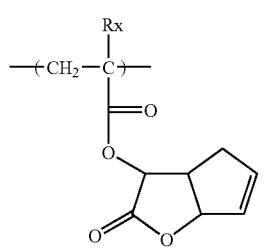
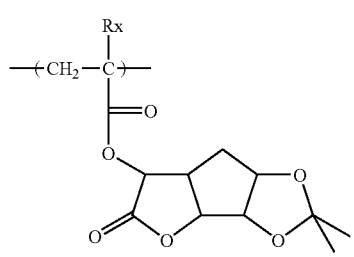
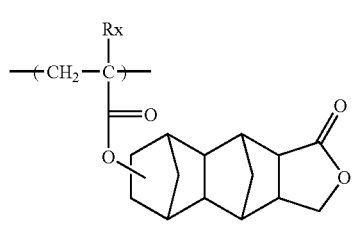
(In the formulae, Rx is H, CH₃, CH₂OH or CF₃.)
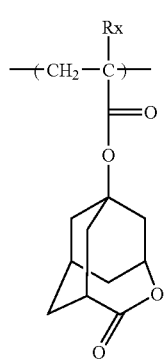
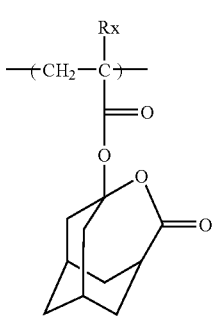
-continued
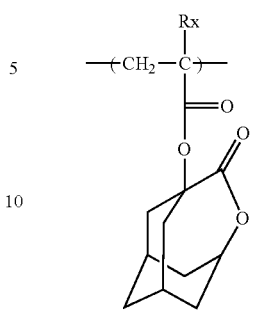
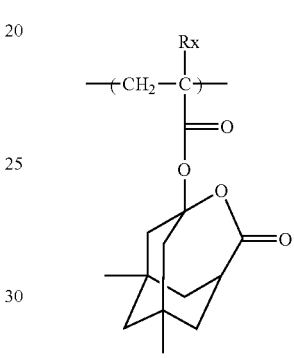
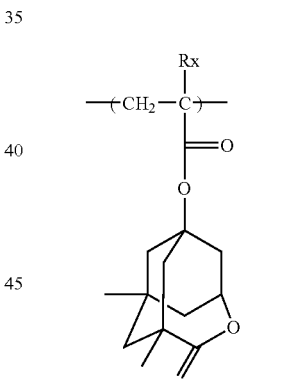
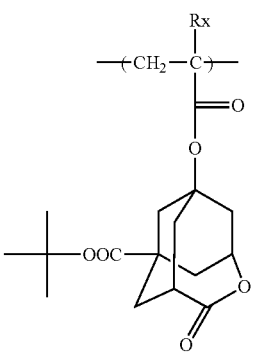

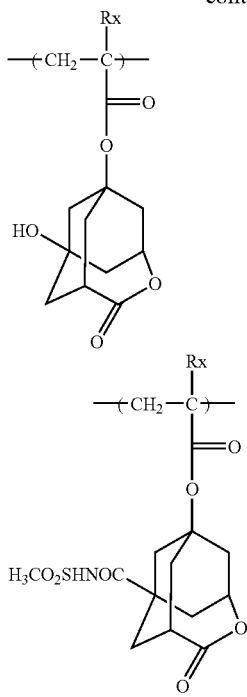

The alicyclic hydrocarbon-based acid-decomposable resin for use in the present invention preferably contains a repeating unit having an alicyclic hydrocarbon structure substituted by a polar group. By virtue of this repeating unit, the adhesion to substrate and the affinity for developer are enhanced. The polar group is preferably a hydroxyl group or a cyano group. The group having an alicyclic hydrocarbon structure substituted by a polar group is preferably a group represented by the following formula (VIIa) or (VIIb):

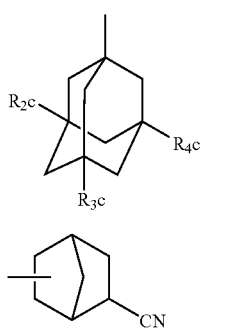

(VIIa)

(VIIb)

In formula (VIIa), $R_{2c}$ to $R_{4c}$ each independently represents a hydrogen atom, a hydroxyl group or a cyano group, provided that at least one of $R_{2c}$ to $R_{4c}$ represents a hydroxyl group or a cyano group. A group where one or two member out of $R_{2c}$ to $R_{4c}$ is a hydroxyl group with the remaining being a hydrogen atom is preferred, and a group where two members out of $R_{2c}$ to $R_{4c}$ are a hydroxyl group with the remaining being a hydrogen atom is more preferred.

The group represented by formula (VIIa) is preferably a dihydroxy form or a monohydroxy form, more preferably a dihydroxy form.

Examples of the repeating unit having a group represented by formula (VIIa) or (VIIb) include a repeating unit where at least one of $R_{13}'$ to $R_{16}'$ in formula (II-AB1) or (II-AB2) has a group represented by formula (VIIa) or (VIIb) (for example, $R_5$ of —COOR$_5$ is a group represented by formula (VIIa) or (VIIb)), and repeating units represented by the following formulae (AIIa) and (AIIb):

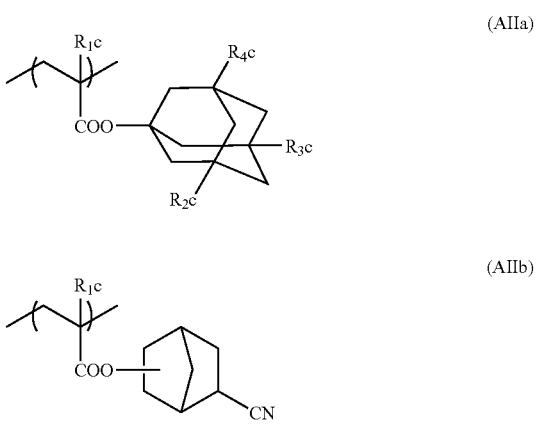

(AIIa)

(AIIb)

In formulae (AIIa) and (AIIb), $R_{1c}$ represents a hydrogen atom, a methyl group, a trifluoromethyl group or a hydroxymethyl group.

Specific examples of the repeating unit having a structure represented by formula (AIIa) or (AIIb) are set forth below, but the present invention is not limited thereto.

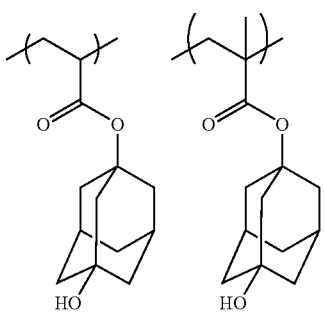

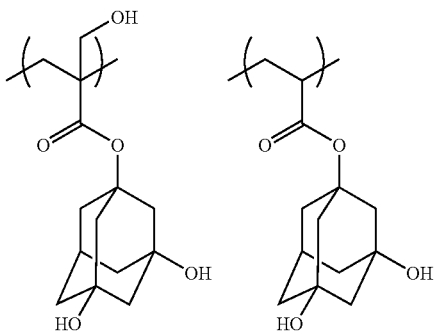

-continued

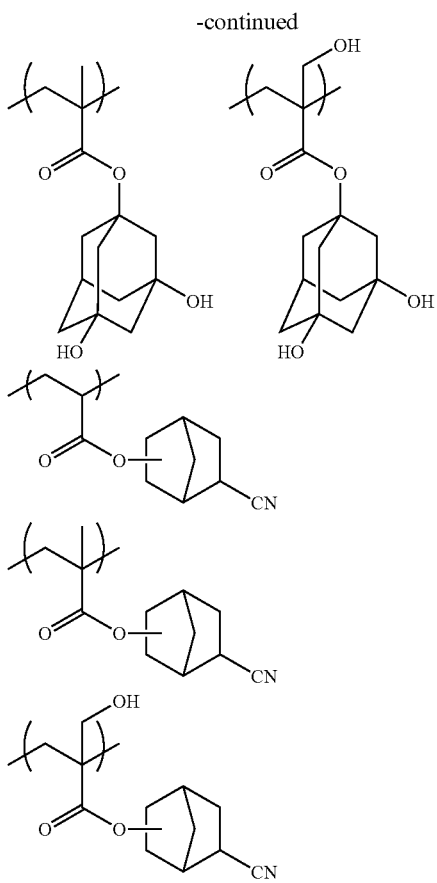

The alicyclic hydrocarbon-based acid-decomposable resin for use in the present invention may contain a repeating unit represented by the following formula (VIII):

(VIII)

In formula (VIII), $Z_2$ represents —O— or —N($R_{41}$)—. $R_{41}$ represents a hydrogen atom, a hydroxyl group, an alkyl group or —OSO$_2$—$R_{42}$. $R_{42}$ represents an alkyl group, a cycloalkyl group or a camphor residue. The alkyl group of $R_{41}$ and $R_{42}$ may be substituted by a halogen atom (preferably fluorine atom) or the like.

Specific examples of the repeating unit represented by formula (VIII) are set forth below, but the present invention is not limited thereto.

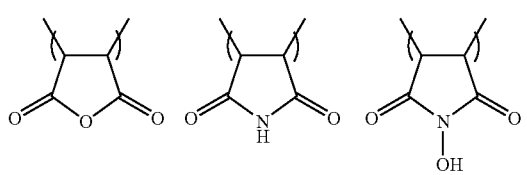

-continued

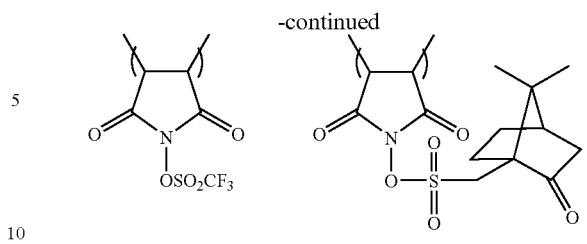

The alicyclic hydrocarbon-based acid-decomposable resin for use in the present invention preferably contains a repeating unit having an alkali-soluble group, more preferably a repeating unit having a carboxyl group. By virtue of containing such a repeating unit, the resolution increases in the usage of forming contact holes. As for the repeating unit having a carboxyl group, a repeating unit where a carboxyl group is directly bonded to the resin main chain, such as repeating unit by an acrylic acid or a methacrylic acid, a repeating unit where a carboxyl group is bonded to the resin main chain through a linking group, and a repeating unit where a carboxyl group is introduced into the terminal of the polymer chain by using a polymerization initiator or chain transfer having an alkali-soluble group at the polymerization, all are preferred. The linking group may have a monocyclic or polycyclic hydrocarbon structure. An acrylic acid and a methacrylic acid are particularly preferred.

The alicyclic hydrocarbon-based acid-decomposable resin for use in the present invention may contain a repeating unit having from 1 to 3 groups represented by the following formula (F1). By virtue of this repeating unit, the line edge roughness performance is enhanced.

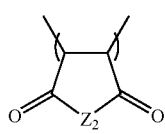
(F1)

In formula (Z), $R_{50}$ to $R_{55}$ each independently represents a hydrogen atom, a fluorine atom or an alkyl group, provided that at least one of $R_{50}$ to $R_{55}$ is a fluorine atom or an alkyl group with at least one hydrogen atom being substituted by a fluorine atom.

Rxa represents a hydrogen atom or an organic group (preferably an acid-decomposable protective group, an alkyl group, a cycloalkyl group, an acyl group or an alkoxycarbonyl group).

The alkyl group of $R_{50}$ to $R_{55}$ may be substituted by a halogen atom (e.g., fluorine), a cyano group or the like, and the alkyl group is preferably an alkyl group having a carbon number of 1 to 3, such as methyl group and trifluoromethyl group.

It is preferred that $R_{50}$ to $R_{55}$ all are a fluorine atom.

The organic group represented by Rxa is preferably an acid-decomposable group or an alkyl, cycloalkyl, acyl, alkylcarbonyl, alkoxycarbonyl, alkoxycarbonylmethyl, alkoxymethyl or 1-alkoxyethyl group which may have a substituent.

The repeating unit having a group represented by formula (F1) is preferably a repeating unit represented by the following formula (F2):

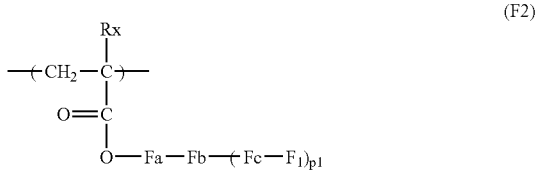

In formula (F2), Rx represents a hydrogen atom, a halogen atom or an alkyl group having a carbon number of 1 to 4. Preferred examples of the substituent which the alkyl group of Rx may have include a hydroxyl group and a halogen atom.

Fa represents a single bond or a linear or branched alkylene group, preferably a single bond.

Fb represents a monocyclic or polycyclic hydrocarbon group.

Fc represents a single bond or a linear or branched alkylene group, preferably a single bond or a methylene group.

$F_1$ represents a group represented by formula (F1).

$p_1$ represents a number of 1 to 3.

The cyclic hydrocarbon group in Fb is preferably a cyclopentyl group, a cyclohexyl group or a norbornyl group.

Specific examples of the repeating unit having a structure of formula (F1) are set forth below.

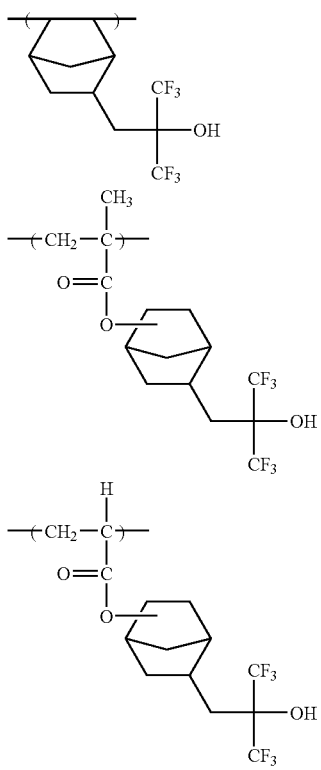

The alicyclic hydrocarbon-based acid-decomposable resin for use in the present invention may further contain a repeating unit having an alicyclic hydrocarbon structure and not exhibiting acid decomposability. By containing such a repeating unit, the dissolving out of the low molecular components from the resist film to the immersion liquid at the immersion exposure can be reduced. Examples of this repeating unit include 1-adamantyl (meth)acrylate, tricyclodecanyl (meth)acrylate and cyclohexyl (meth)acrylate.

The alicyclic hydrocarbon-based acid-decomposable resin for use in the present invention may contain, in addition to the above-described repeating units, various repeating structural units for the purpose of controlling dry etching resistance, suitability for standard developer, adhesion to substrate, resist profile and properties generally required of the resist, such as resolving power, heat resistance and sensitivity.

Examples of such a repeating structural unit include, but are not limited to, repeating structural units corresponding to the monomers described below.

By virtue of such a repeating structural unit, the performance required of the alicyclic hydrocarbon-based acid-decomposable resin, particularly, (1) solubility in the coating solvent,
(2) film-forming property (glass transition point),
(3) alkali developability,
(4) film loss (selection of hydrophilic, hydrophobic or alkali-soluble group),
(5) adhesion of unexposed area to substrate,
(6) dry etching resistance and the like, can be subtly controlled.

Examples of the monomer include a compound having one addition-polymerizable unsaturated bond selected from acrylic acid esters, methacrylic acid esters, acrylamides, methacrylamides, allyl compounds, vinyl ethers and vinyl esters.

Other than these, an addition-polymerizable unsaturated compound copolymerizable with the monomers corresponding to the above-described various repeating structural units may be copolymerized.

In the alicyclic hydrocarbon-based acid-decomposable resin, the molar ratio of respective repeating structural units contained is appropriately determined to control the dry etching resistance of resist, suitability for standard developer, adhesion to substrate, resist profile and performances generally required of the resist, such as resolving power, heat resistance and sensitivity.

The preferred embodiment of the alicyclic hydrocarbon-based acid-decomposable resin for use in the present invention includes the followings:

(1) a resin containing a repeating unit having an alicyclic hydrocarbon-containing partial structure represented by any one of formulae (pI) to (pV) (side chain type), preferably containing a (meth)acrylate repeating unit having a structure represented by any one of formulae (pI) to (pV), and (2) a resin containing a repeating unit represented by formula (II-AB) (main chain type).

The embodiment of (2) further includes:

(3) a resin having a repeating unit represented by formula (II-AB), a maleic anhydride derivative and a (meth)acrylate structure (hybrid type).

In the alicyclic hydrocarbon-based acid-decomposable resin, the content of the repeating unit having an acid-decomposable group is preferably from 10 to 60 mol %, more preferably from 20 to 50 mol %, still more preferably from 25 to 40 mol %, based on all repeating structural units.

In the alicyclic hydrocarbon-based acid-decomposable resin, the content of the repeating unit having an alicyclic hydrocarbon-containing partial structure represented by any one of formulae (pI) to (pV) is preferably from 20 to 70 mol %, more preferably from 20 to 50 mol %, still more preferably from 25 to 40 mol %, based on all repeating structural units.

In the alicyclic hydrocarbon-based acid-decomposable resin, the content of the repeating unit represented by formula (II-AB) is preferably from 10 to 60 mol %, more preferably from 15 to 55 mol %, still more preferably from 20 to 50 mol %, based on all repeating structural units.

The content of the repeating structural unit based on the monomer as the further copolymerization component, in the resin can also be appropriately selected according to the desired resist performance but in general, the content thereof is preferably 99 mol % or less, more preferably 90 mol % or less, still more preferably 80 mol % or less, based on the total molar number of the repeating structural unit having an alicyclic hydrocarbon-containing partial structure represented by any one of formulae (pI) to (pV) and the repeating unit represented by formula (II-AB).

In the case of using the composition of the present invention for exposure with ArF, the resin preferably has no aromatic group in view of transparency to ArF light.

The alicyclic hydrocarbon-based acid-decomposable resin for use in the present invention is preferably a resin where all repeating units comprise a (meth)acrylate repeating unit. In this case, the repeating units may be all a methacrylate, all an acrylate, or a mixture of methacrylate/acrylate, but the content of the acrylate repeating unit is preferably 50 mol % or less based on all repeating units.

The alicyclic hydrocarbon-based acid-decomposable resin for use in the present invention is more preferably a ternary copolymerization polymer comprising from 20 to 50% of the repeating unit having an alicyclic hydrocarbon-containing partial structure represented by any one of formulae (pI) to (pV), from 20 to 50% of the repeating unit having a lactone structure and from 5 to 30% of the repeating unit having an alicyclic hydrocarbon structure substituted by a polar group, or a quaternary copolymerization polymer additionally comprising from 0 to 20% of other repeating units.

The resin is more preferably a ternary copolymerization polymer comprising from 20 to 50% of the repeating unit having an acid-decomposable group represented by any one of the following formulae (ARA-1) to (ARA-5), from 20 to 50% of the repeating unit having a lactone group represented by any one of the following formulae (ARL-1) to (ARL-6), and from 5 to 30% of the repeating unit having an alicyclic hydrocarbon structure substituted by a polar group represented by any one of the following formulae (ARH-1) to (ARH-3), or a quaternary copolymerization polymer further comprising from 5 to 20% of the repeating unit containing a carboxyl group or a structure represented by formula (F 1) and the repeating unit having an alicyclic hydrocarbon structure and not exhibiting acid decomposability.

(In the formulae, $Rxy_1$ represents a hydrogen atom or a methyl group, and $Rxa_1$ and $Rxb_1$ each represents a methyl group or an ethyl group).

ARA-1

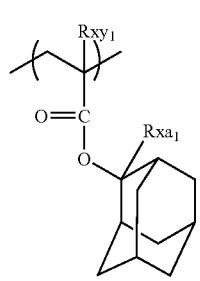

-continued

ARA-2

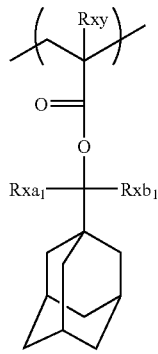

ARA-3

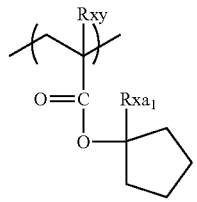

ARA-4

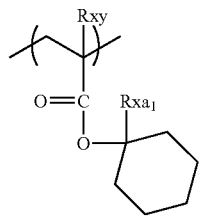

ARA-5

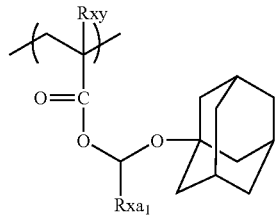

ARL-1

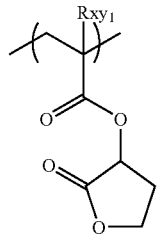

ARL-2

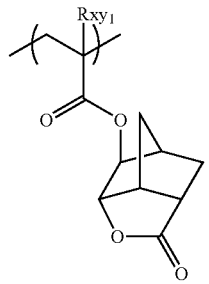

ARL-3 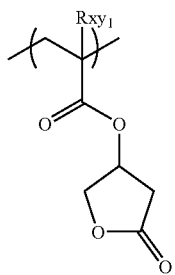

ARL-4 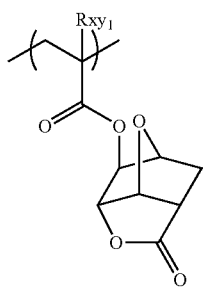

ARL-5 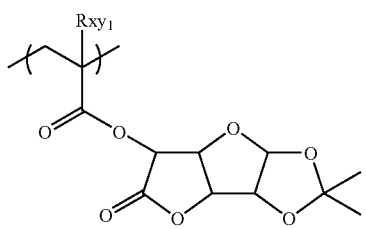

ARL-6 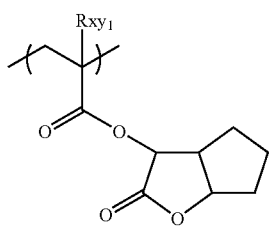

ARH-1 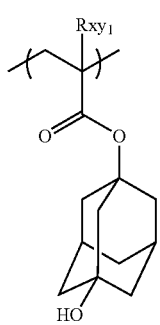

ARH-2 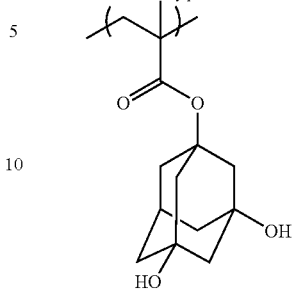

ARH-3 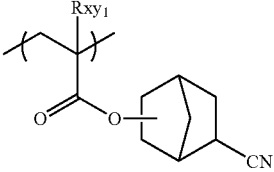

The alicyclic hydrocarbon-based acid-decomposable resin for use in the present invention can be synthesized by an ordinary method (for example, radical polymerization). Examples of the synthesis method in general include a batch polymerization method of dissolving the monomer species and an initiator in a solvent and heating the solution, thereby effecting the polymerization, and a dropping polymerization method of adding dropwise a solution containing monomer species and an initiator to a heated solvent over 1 to 10 hours. A dropping polymerization method is preferred. Examples of the reaction solvent include tetrahydrofuran, 1,4-dioxane, ethers (e.g., diisopropyl ether), ketones (e.g., methyl ethyl ketone, methyl isobutyl ketone), an ester solvent (e.g., ethyl acetate), an amide solvent (e.g., dimethylformamide, diethylacetamide), and a solvent capable of dissolving the composition of the present invention, such as propylene glycol monomethyl ether acetate, propylene glycol monomethyl ether and cyclohexanone, which is described later. The polymerization is preferably performed by using the same solvent as the solvent used in the resist composition of the present invention. By the use of this solvent, production of particles during storage can be suppressed.

The polymerization reaction is preferably performed in an inert gas atmosphere such as nitrogen and argon. As for the polymerization initiator, the polymerization is started by using a commercially available radical initiator (e.g., azo-based initiator, peroxide). The radical initiator is preferably an azo-based initiator, and an azo-based initiator having an ester group, a cyano group or a carboxyl group is preferred. Preferred examples of the initiator include azobisisobutyronitrile, azobis-dimethylvaleronitrile and dimethyl 2,2'-azobis (2-methylpropionate). The initiator is added additionally or in parts, if desired. After the completion of reaction, the reactant is charged into a solvent, and the desired polymer is recovered by a method such as powder or solid recovery. The reaction concentration is from 5 to 50 weight %, preferably from 10 to 30 weight %, and the reaction temperature is usually from 10 to 150° C., preferably from 30 to 120° C., more preferably from 60 to 100° C.

The weight average molecular weight of the resin for used in the present invention is preferably from 1,000 to 200,000, more preferably from 3,000 to 20,000, and most preferably from 5,000 to 15,000, in terms of polystyrene by the GPC method. When the weight average molecular weight is from 1,000 to 200,000, the heat resistance, dry etching resistance and developability can be prevented from deterioration and also, the deterioration in the film-forming property due to high viscosity can be prevented. The molecular weight distribution is usually from 1 to 5, preferably from 1 to 3, more preferably from 1 to 2. As the molecular weight distribution is smaller, the resolution and resist profile are more excellent, the side wall of the resist pattern is smoother, and the roughness property is more enhanced.

In the positive resist composition of the present invention, the amount of all resins for use in the present invention blended in the entire composition is preferably from 50 to 99.99 weight %, more preferably from 60 to 99.0 weight %, based on the entire solid content.

In the present invention, one resin may be used or a plurality of resins may be used in combination.

[3] (C) Dissolution inhibiting compound capable of decomposing under the action of an acid to increase the solubility in an alkali developer and having a molecular weight of 3,000 or less The positive resist composition of the present invention may contain a dissolution inhibiting compound capable of decomposing under the action of an acid to increase the solubility in an alkali developer and having a molecular weight of 3,000 or less (hereinafter sometimes referred to as a "component (C)" or a "dissolution inhibiting compound").

In order to prevent reduction in the transparency to light at 220 nm or less, the dissolution inhibiting compound capable of decomposing under the action of an acid to increase the solubility in an alkali developer and having a molecular weight of 3,000 or less is preferably an alicyclic or aliphatic compound containing an acid-decomposable group, such as acid-decomposable group-containing cholic acid derivatives described in *Proceeding of SPIE*, 2724, 355 (1996). Examples of the acid-decomposable group and alicyclic structure are the same as those described above for the alicyclic hydrocarbon-based acid-decomposable resin.

The molecular weight of the dissolution inhibiting compound for use in the present invention is 3,000 or less, preferably from 300 to 3,000, more preferably from 500 to 2,500.

The amount of the dissolution inhibiting compound added is preferably from 3 to 50 weight %, more preferably from 5 to 40 weight %, based on the solid content of the positive resist composition.

Specific examples of the dissolution inhibiting compound are set forth below, but the present invention is not limited thereto.

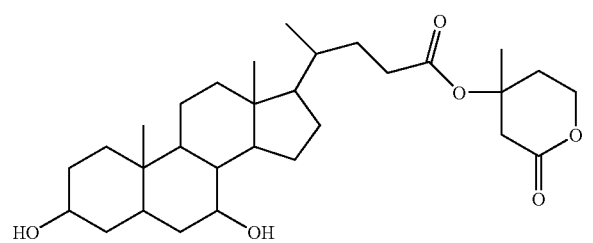

-continued

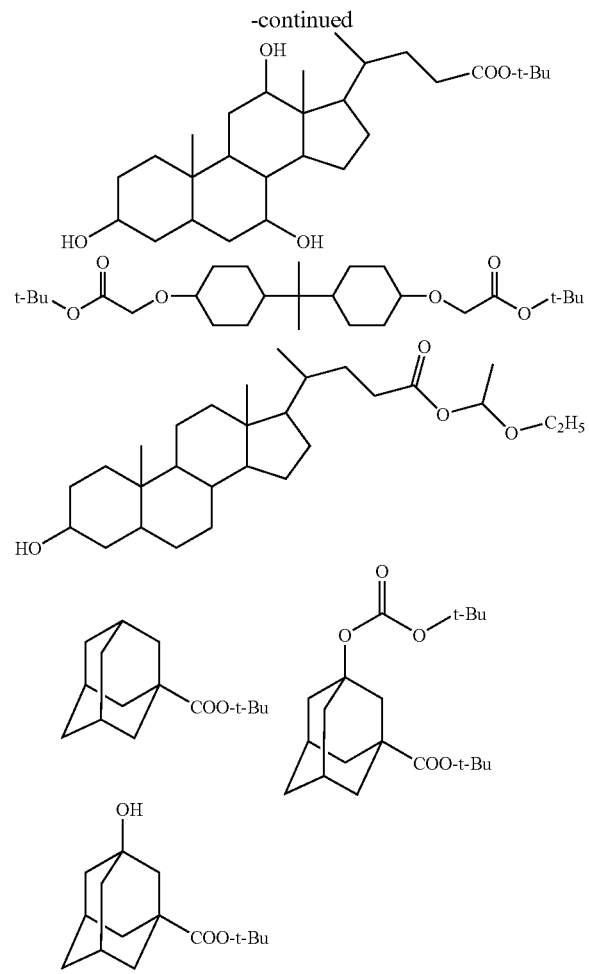

[4] (D) Basic Compound

The positive resist composition of the present invention preferably contains (D) a basic compound so as to reduce the change of performance in aging from exposure to heating or control the in-film diffusion of the acid generated upon exposure.

The basic compound includes a nitrogen-containing basic compound and an onium salt compound. As for the preferred structure of the nitrogen-containing basic compound, the compound includes those having a partial structure represented by any one of the following formulae (A) to (E).

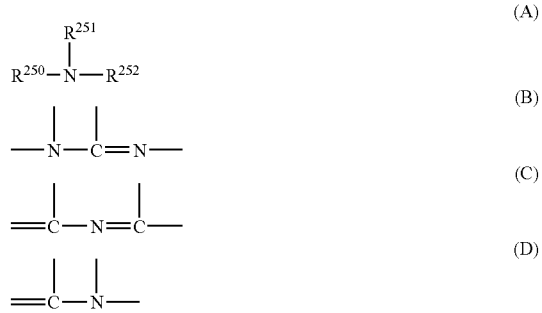

-continued

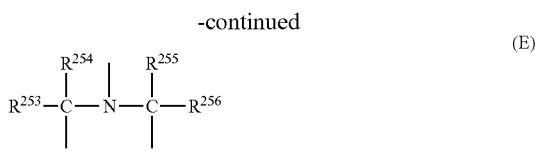

(E)

In formula (A), $R^{250}$, $R^{251}$ and $R^{252}$ each independently represents a hydrogen atom, an alkyl group having a carbon number of 1 to 20, a cycloalkyl group having a carbon number of 3 to 20, or an aryl group having a carbon number of 6 to 20, and $R^{250}$ and $R^{251}$ may combine with each other to form a ring. These groups each may have a substituent. The alkyl or cycloalkyl group having a substituent is preferably an aminoalkyl group having a carbon number of 1 to 20, an aminocycloalkyl group having a carbon number of 3 to 20, a hydroxyalkyl group having a carbon number of 1 to 20, or a hydroxycycloalkyl group having a carbon number of 3 to 20, and these groups each may contain an oxygen atom, a sulfur atom or a nitrogen atom in the alkyl chain.

In formula (E), $R^{253}$, $R^{254}$, $R^{255}$ and $R^{256}$ each independently represents an alkyl group having a carbon number of 1 to 6 or a cycloalkyl group having a carbon number of 3 to 6.

Preferred examples of the compound include guanidine, aminopyrrolidine, pyrazole, pyrazoline, piperazine, aminomorpholine, aminoalkylmorpholine and piperidine, and these compounds each may have a substituent. More preferred examples of the compound include a compound having an imidazole structure, a diazabicyclo structure, an onium hydroxide structure, an onium carboxylate structure, a trialkylamine structure, an aniline structure or a pyridine structure; an alkylamine derivative having a hydroxyl group and/or an ether bond; and an aniline derivative having a hydroxyl group and/or an ether bond.

Examples of the compound having an imidazole structure include imidazole, 2,4,5-triphenylimidazole and benzimidazole. Examples of the compound having a diazabicyclo structure include 1,4-diazabicyclo[2,2,2]octane, 1,5-diazabicyclo[4,3,0]non-5-ene and 1,8-diazabicyclo[5,4,0]undec-7-ene. Examples of the compound having an onium hydroxide structure include a triarylsulfonium hydroxide, a phenacylsulfonium hydroxide and a sulfonium hydroxide having a 2-oxoalkyl group, and specific examples thereof include triphenylsulfonium hydroxide, tris(tert-butylphenyl)sulfonium hydroxide, bis(tert-butylphenyl)iodonium hydroxide, phenacylthiophenium hydroxide and 2-oxopropylthiophenium hydroxide. The compound having an onium carboxylate structure is a compound where the anion moiety of the compound having an onium hydroxide structure is converted into a carboxylate, and examples thereof include acetate, adamantane-1-carboxylate and perfluoroalkyl carboxylate. Examples of the compound having a trialkylamine structure include tri(n-butyl)amine and tri(n-octyl)amine. Examples of the aniline compound include 2,6-diisopropylaniline, N,N-dimethylaniline, N,N-dibutylaniline and N,N-dioctylaniline. Examples of the alkylamine derivative having a hydroxyl group and/or an ether bond include ethanolamine, diethanolamine, triethanolamine and tris(methoxyethoxyethyl)amine. Examples of the aniline derivative having a hydroxyl group and/or an ether bond include N,N-bis(hydroxyethyl)aniline and N,N-bis(hydroxyethyl)-p-toluidine.

The basic compound is more preferably an aniline derivative, and most preferably an aniline derivative in which an alkyl group having a carbon number of 1 to 20 or an alkyl group having a hydroxyl group and/or an ether bond is substituted on the nitrogen atom or the aromatic ring.

One of these basic compounds may be used alone, or two or more thereof may be used in combination. The amount of the basic component used is usually from 0.001 to 10 weight %, preferably from 0.01 to 5 weight %, based on the solid content of the positive resist composition. The amount used is preferably 0.001 weight % or more for obtaining a sufficiently high addition effect and preferably 10 weight % or less in view of sensitivity or developability of the unexposed area.

[5] (E) Fluorine- and/or Silicon-Containing Surfactant

The positive resist composition of the present invention preferably further contains any one fluorine- and/or silicon-containing surfactant (a fluorine-containing surfactant, a silicon-containing surfactant or a surfactant containing both a fluorine atom and a silicon atom), or two or more thereof.

When the positive resist composition of the present invention contains a fluorine- and/or silicon-containing surfactant, a resist pattern assured of sufficient adhesion and less development defect can be obtained with good sensitivity and resolution at the time of using an exposure light source of 250 nm or less, particularly 220 nm or less.

Examples of the fluorine- and/or silicon-containing surfactant include surfactants described in JP-A-62-36663, JP-A-61-226746, JP-A-61-226745, JP-A-62-170950, JP-A-63-34540, JP-A-7-230165, JP-A-8-62834, JP-A-9-54432, JP-A-9-5988, JP-A-2002-277862 and U.S. Pat. Nos. 5,405,720, 5,360,692, 5,529,881, 5,296,330, 5,436,098, 5,576,143, 5,294,511 and 5,824,451. The following commercially available surfactants each may also be used as it is.

Examples of the commercially available surfactant which can be used include a fluorine-containing surfactant and a silicon-containing surfactant, such as EFtop EF301 and EF303 (produced by Shin-Akita Kasei K.K.), Florad FC430 and 431 (produced by Sumitomo 3M Inc.), Megafac F171, F173, F176, F189 and R08 (produced by Dainippon Ink & Chemicals, Inc.), Surflon S-382, SC101, 102, 103, 104, 105 and 106 (produced by Asahi Glass Co., Ltd.), and Troysol S-366 (produced by Troy Chemical). In addition, polysiloxane polymer KP-341 (produced by Shin-Etsu Chemical Co., Ltd.) may also be used as the silicon-containing surfactant.

Other than these known surfactants, a surfactant using a polymer having a fluoro-aliphatic group, which is derived from a fluoro-aliphatic compound produced by a telomerization process (also called telomer process) or an oligomerization process (also called oligomer process), may be used. The fluoro-aliphatic compound can be synthesized by the method described in JP-A-2002-90991.

The polymer having a fluoro-aliphatic group is preferably a copolymer of a fluoro-aliphatic group-containing monomer with a (poly(oxyalkylene)) acrylate and/or a (poly(oxyalkylene)) methacrylate, and the polymer may have an irregular distribution or may be a block copolymer. Examples of the poly(oxyalkylene) group include a poly(oxyethylene) group, a poly(oxypropylene) group and a poly(oxybutylene) group). This group may also be a unit having alkylenes differing in the chain length within the same chain, such as block-linked poly(oxyethylene, oxypropylene and oxyethylene) and block-linked poly(oxyethylene and oxypropylene). Furthermore, the copolymer of a fluoro-aliphatic group-containing monomer with a (poly(oxyalkylene)) acrylate (or methacrylate) may be not only a binary copolymer but also a ternary or greater copolymer obtained by simultaneously copolymerizing two or more different fluoro-aliphatic group-containing monomers or two or more different (poly(oxyalkylene)) acrylates (or methacrylates).

Examples thereof include commercially available surfactants such as Megafac F178, F-470, F-473, F-475, F-476 and F-472 (produced by Dainippon Ink & Chemicals, Inc.). Other examples include a copolymer of a $C_6F_{13}$ group-containing acrylate (or methacrylate) with a (poly(oxyalkylene)) acrylate (or methacrylate), a copolymer of a $C_6F_{13}$ group-containing acrylate (or methacrylate) with a (poly(oxyethylene)) acrylate (or methacrylate) and a (poly(oxypropylene)) acrylate (or methacrylate), a copolymer of a $C_8F_{17}$ group-containing acrylate (or methacrylate) with a (poly(oxyalkylene)) acrylate (or methacrylate), and a copolymer of a $C_8F_{17}$ group-containing acrylate (or methacrylate) with a (poly(oxyethylene)) acrylate (or methacrylate) and a (poly(oxypropylene)) acrylate (or methacrylate).

The amount of the fluorine- and/or silicon-containing surfactant used is preferably from 0.0001 to 2 weight %, more preferably from 0.001 to 1 weight %, based on the entire amount of the positive resist composition (excluding the solvent).

<Other Additives>

If desired, the positive resist composition of the present invention may further contain, for example, a dye, a plasticizer, a surfactant other than the component (E), a photosensitizer, and a compound capable of accelerating the solubility in a developer.

The compound capable of accelerating the dissolution in a developer, which can be used in the present invention, is a low molecular compound containing two or more phenolic OH groups or one or more carboxy group and having a molecular weight of 1,000 or less. In the case of containing a carboxyl group, an alicyclic or aliphatic compound is preferred.

The amount of the dissolution accelerating compound added is preferably from 2 to 50 weight %, more preferably from 5 to 30 weight %, based on the acid-decomposable resin. The amount added is preferably 50 weight % or less with a view to suppressing the development residue or preventing the deformation of pattern at the development.

The phenol compound having a molecular weight of 1,000 or less can be easily synthesized by one skilled in the art while referring to the method described, for example, in JP-A-4-122938, JP-A-2-28531, U.S. Pat. No. 4,916,210 and European Patent 219294.

Specific examples of the alicyclic or aliphatic compound having a carboxy group include, but are not limited to, a carboxylic acid derivative having a steroid structure, such as cholic acid, deoxycholic acid and lithocholic acid, an adamantane carboxylic acid derivative, an adamantane dicarboxylic acid, a cyclohexanecarboxylic acid and a cyclohexanedicarboxylic acid.

In the present invention, a surfactant other than the fluorine- and/or silicon-containing surfactant (E) can also be added. Specific examples thereof include a nonionic surfactant such as polyoxyethylene alkyl ethers, polyoxyethylene alkylallyl ethers, polyoxyethylene.polyoxypropylene block copolymers, sorbitan aliphatic esters and polyoxyethylene sorbitan aliphatic esters.

One of these surfactants may be used alone or some of these may be used in combination.

[6] (F) Organic Solvent

The positive resist composition of the present invention is used by dissolving the above-described components in a predetermined organic solvent.

Examples of the organic solvent which can be used include ethylene dichloride, cyclohexanone, cyclopentanone, 2-heptanone, γ-butyrolactone, methyl ethyl ketone, ethylene glycol monomethyl ether, ethylene glycol monoethyl ether, 2-methoxyethyl acetate, ethylene glycol monoethyl ether acetate, propylene glycol monomethyl ether, propylene glycol monomethyl ether acetate, toluene, ethyl acetate, methyl lactate, ethyl lactate, methyl methoxypropionate, ethyl ethoxypropionate, methyl pyruvate, ethyl pyruvate, propyl pyruvate, N,N-dimethylformamide, dimethylsulfoxide, N-methylpyrrolidone and tetrahydrofuran.

In the present invention, one organic solvent may be used alone or some organic solvents may be used as a mixture, but it is preferred to use a mixed solvent containing two or more solvents having different functional groups. By this use, the solubility of the material is enhanced and not only production of particles in aging can be suppressed but also a good pattern profile can be obtained. Preferred examples of the functional group in the solvent include an ester group, a lactone group, a hydroxyl group, a ketone group and a carbonate group. The mixed solvent having different functional groups is preferably a mixed solvent in any one of the following (S1) to (S5):

(S1) a mixed solvent prepared by mixing a hydroxyl group-containing solvent and a hydroxyl group-free solvent;

(S2) a mixed solvent prepared by mixing a solvent having an ester group and a solvent having a ketone structure;

(S3) a mixed solvent prepared by mixing a solvent having an ester structure and a solvent having a lactone structure;

(S4) a mixed solvent prepared by mixing a solvent having an ester structure, a solvent having a lactone structure, and a hydroxyl group-containing solvent; and (S5) a mixed solvent prepared by mixing a solvent having an ester structure, a solvent having a carbonate structure, and a hydroxyl group-containing solvent.

By the use of such a mixed solvent, production of particles during storage of the resist solution can be reduced and generation of a defect at the coating can be suppressed.

Examples of the hydroxyl group-containing solvent include ethylene glycol, ethylene glycol monomethyl ether, ethylene glycol monoethyl ether, propylene glycol, propylene glycol monomethyl ether, propylene glycol monoethyl ether and ethyl lactate. Among these, propylene glycol monomethyl ether and ethyl lactate are preferred.

Examples of the hydroxy group-free solvent include propylene glycol monomethyl ether acetate, ethyl ethoxypropionate, 2-heptanone, γ-butyrolactone, cyclohexanone, butyl acetate, N-methylpyrrolidone, N,N-dimethylacetamide and dimethyl sulfoxide. Among these, propylene glycol monomethyl ether acetate, ethyl ethoxypropionate, 2-heptanone, γ-butyrolactone, cyclohexanone and butyl acetate are preferred, and propylene glycol monomethyl ether acetate, ethyl ethoxypropionate, 2-heptanone and cyclohexanone are more preferred.

Examples of the solvent having a ketone structure include cyclohexanone and 2-heptanone, with cyclohexanone being preferred.

Examples of the solvent having an ester structure include propylene glycol monomethyl ether acetate, ethyl ethoxypropionate and butyl acetate, with propylene glycol monomethyl ether acetate being preferred.

Examples of the solvent having a lactone structure include γ-butyrolactone.

Examples of the solvent having a carbonate structure include propylene carbonate and ethylene carbonate, with propylene carbonate being preferred.

The mixing ratio (by weight) between the hydroxy group-containing solvent and the hydroxy group-free solvent is from 1/99 to 99/1, preferably from 10/90 to 90/10, more preferably from 20/80 to 60/40. A mixed solvent containing the hydroxy group-free solvent in a proportion of 50 weight % or more is particularly preferred in view of coating uniformity.

The mixing ratio (by weight) between the solvent having an ester structure and the solvent having a ketone structure is from 1/99 to 99/1, preferably from 10/90 to 90/10, more preferably from 40/60 to 80/20. A mixed solvent containing the solvent having an ester structure in a proportion of 50 weight % or more is particularly preferred in view of coating uniformity.

The mixing ratio (by weight) between the solvent having an ester structure and the solvent having a lactone structure is from 70/30 to 99/1, preferably from 80/20 to 99/1, more preferably from 90/10 to 99/1. A mixed solvent containing the solvent having an ester structure in a proportion of 70 weight % or more is particularly preferred in view of aging stability.

In the case of mixing a solvent having an ester structure, a solvent having a lactone structure and a hydroxyl group-containing solvent, the mixed solvent preferably contains from 30 to 80 weight % of the solvent having an ester structure, from 1 to 20 weight % of the solvent having a lactone structure, and from 10 to 60 weight % of the hydroxyl group-containing solvent.

In the case of mixing a solvent having an ester structure, a solvent having a carbonate structure and a hydroxyl group-containing solvent, the mixed solvent preferably contains from 30 to 80 weight % of the solvent having an ester structure, from 1 to 20 weight % of the solvent having a carbonate structure, and from 10 to 60 weight % of the hydroxyl group-containing solvent.

(Use Method)

The positive resist composition of the present invention is used by dissolving respective components in a predetermined organic solvent, preferably a mixed solvent described above, and coating the obtained solution on a predetermined support as follows.

That is, the positive resist composition is coated on a substrate (e.g., silicon/silicon dioxide-coated substrate) as those used in the production of precision integrated circuit devices, to an arbitrary thickness (usually from 50 to 500 nm) by an appropriate coating method such as spinner or coater.

After the coating, the resist coated is dried by spinning or baking to form a resist film and then exposed through a mask or the like for the pattern formation. The resist film may be exposed with intervention of an immersion liquid (immersion exposure). For example, the resist film is exposed in the state that an immersion liquid is filled between the resist film and an optical lens. The exposure amount may be appropriately selected but is usually from 1 to 100 mJ/cm$^2$. After the exposure, the film is preferably subjected to spinning or drying and then to development and rinsing, whereby a good pattern is obtained. The baking temperature is usually from 30 to 300° C. The time from exposure to the baking step is preferably shorter.

The exposure light used here is preferably a far ultraviolet ray at a wavelength of 250 nm or less, more preferably 220 nm or less. Specific examples thereof include KrF excimer laser (248 nm), ArF excimer laser (193 nm), F$_2$ excimer laser (157 nm) and X-ray, with ArF excimer laser (193 nm) being preferred.

Incidentally, the contact of the resist surface with the immersion liquid is considered to bring about the change in the performance, which is observed when the resist is applied to immersion exposure.

The immersion liquid for use in the immersion exposure is described below.

The immersion liquid is preferably a liquid transparent to light at the exposure wavelength and having a small temperature coefficient of refractive index as much as possible so as to minimize the distortion of an optical image projected on the resist. Particularly, when the exposure light source is an ArF excimer laser (wavelength: 193 nm), water is preferably used in view of easy availability and easy handleability, in addition to the above-described aspects.

In the case of using water as the immersion liquid, for the purpose of decreasing the surface tension of water and increasing the surface activity, an additive (liquid) which does not dissolve the resist layer on a wafer and at the same time, gives only a negligible effect on the optical coat on the lower surface of the lens element may be added at a small ratio. The additive is preferably an aliphatic alcohol having a refractive index nearly equal to that of water, and specific examples thereof include methyl alcohol, ethyl alcohol and isopropyl alcohol. By adding an alcohol having a refractive index nearly equal to that of water, even when the alcohol component in water is evaporated and changed in the content concentration, the change in the refractive index of the entire liquid can be advantageously made very small. On the other hand, if a substance opaque to light at 193 nm or an impurity greatly differing in the refractive index from water is mingled, this incurs distortion of the optical image projected on the resist. Therefore, the water used is preferably distilled water. Pure water after further filtration through an ion exchange filter or the like may also be used.

The electrical resistance of water is preferably 18.3 M-ohm·cm or more, and TOC (organic material concentration) is preferably 20 ppb or less. Also, the water is preferably subjected to a deaeration treatment.

The lithography performance can be enhanced by increasing the refractive index of the immersion liquid.

From such an aspect, an additive for increasing the refractive index may be added to water, or heavy water (D$_2$O) may be used in place of water.

In order to prevent the resist film from directly contacting with the immersion liquid, an immersion liquid sparingly soluble film (hereinafter, sometimes referred to as a "topcoat") may be provided between the immersion liquid and the resist film formed of the positive resist composition of the present invention. The functions required of the topcoat are suitability for coating on the resist upper layer part, transparency to radiation particularly at 193 nm, and low solubility in the immersion liquid. It is preferred that the topcoat does not intermix with the resist and can be uniformly coated on the resist upper layer.

In view of transparency to light at 193 nm, the topcoat preferably comprises an aromatic-free polymer, and specific examples thereof include a hydrocarbon polymer, an acrylic acid ester polymer, a polymethacrylic acid, a polyacrylic acid, a polyvinyl ether, a silicon-containing polymer and a fluorine-containing polymer.

On peeling off the topcoat, a developer may be used or a releasing agent may be separately used. The releasing agent is preferably a solvent less permeating into the resist. From the standpoint that the peeling step can be performed simultaneously with the resist development step, the topcoat is preferably peelable with an alkali developer and in view of peeling with an alkali developer, the topcoat is preferably acidic, but in view of non-intermixing with the resist, the topcoat may be neutral or alkaline.

With no difference in the refractive index between the topcoat and the immersion liquid, the resolving power is enhanced. When the exposure light source is an ArF excimer laser (wavelength: 193 nm), water is preferred as the immersion liquid and therefore, the topcoat for ArF immersion exposure preferably has a refractive index close to the refractive index (1.44) of water. Also, in view of transparency and refractive index, the topcoat is preferably a thin film.

In the development step, the developer is used as follows. The developer which can be used for the positive resist composition is an alkaline aqueous solution of inorganic alkalis such as sodium hydroxide, potassium hydroxide, sodium carbonate, sodium silicate, sodium metasilicate and aqueous ammonia, primary amines such as ethylamine and n-propylamine, secondary amines such as diethylamine and di-n-butylamine, tertiary amines such as triethylamine and methyldiethylamine, alcohol amines such as dimethylethanolamine and triethanolamine, quaternary ammonium salts such as tetramethylammonium hydroxide and tetraethylammonium hydroxide, or cyclic amines such as pyrrole and piperidine.

In this alkaline aqueous solution, alcohols and a surfactant maw also be added each in an appropriate amount.

As for the rinsing solution, pure water is used and this may be used after adding an appropriate amount of a surfactant thereto.

The alkali concentration of the alkali developer is usually from 0.1 to 20 weight %.

The pH of the alkali developer is usually from 10.0 to 15.0.

After the development or rinsing, the developer or rinsing solution adhering on the pattern may removed by a supercritical fluid.

EXAMPLES

The present invention is described in greater detail below by referring to Examples, but the present invention is not limited thereto.

Synthesis Example 1

(Synthesis of Acid Generator (A1-I-4)):

Triphenylsulfonium iodide (3.3 g) was dissolved in acetonitrile/distilled water=2/1 (by weight), and 1.5 of silver acetate was added thereto, followed by stirring for 30 minutes. The precipitated silver compound was filtered and to the filtrate, 3.0 g of a compound represented by the following formula (IA) dissolved in acetonitrile/distilled water=2/1 (by weight) was added. The obtained reaction solution was concentrated and dissolved in 200 ml of chloroform, and the resulting solution was washed with distilled water, an aqueous ammonium chloride solution, and water. Subsequently, the organic phase was filtered through a 0.1-μm polyfluorotetraethylene filter and then concentrated to obtain 4.2 g of Acid Generator (A1-I-4).

$^1$H-NMR (300 MHz, CHCl$_3$): δ 7.6-7.8 (m, 15H) $^{19}$F-NMR (300 MHz, CHCl$_3$): δ 115.59 (4F), δ 122.29 (2F)

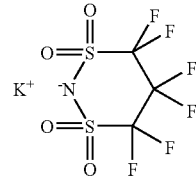

(IA)

Synthesis Example 2

Synthesis of Acid Generator (A2-III-3)

In a nitrogen steam, 4.0 g (12.65 mmol) of 1,1,2,2,3,3-hexafluoropropane-1,3-disulfonyl difluoride, 2.56 g (25.3 mmol) of triethylamine and 30 mL of diisopropyl ether were ice-cooled, and a mixed solution containing 1.08 g (12.6 mmol) of piperidine and 15 mL of diisopropyl ether was added dropwise thereto over 30 minutes. The resulting solution was stirred under ice cooling for 1 hour and further stirred at room temperature for 1 hour. The organic layer was washed sequentially with water, an aqueous saturated ammonium chloride solution, and water and then dried over sodium sulfate. After removing the solvent, 20 mL of ethanol and 200 mg of sodium hydroxide were added to the residue, followed by stirring at room temperature for 2 hours. The resulting reaction solution was neutralized with dilute hydrochloric acid to obtain an ethanol solution of the sulfonic acid represented by the following formula (IB).

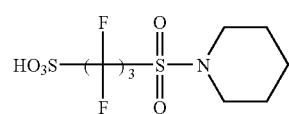

(IB)

A triphenylsulfonium acetate solution was added to the thus-obtained sulfonic acid solution, followed by stirring at room temperature for 2 hours. After adding 300 mL of chloroform, the organic layer was washed sequentially with water, an aqueous saturated ammonium chloride solution, and water and then purified by column chromatography (SiO$_2$; chloroform/methanol=5/1) to obtain 3.0 g (4.68 mmol) of Acid Generator (A2-III-3) as a white solid matter.

$^1$H-NMR (300 MHz, CDCl$_3$): δ 1.64 (bs, 6H), 3.29 (bs, 2H), 3.64 (bs, 2H), 7.70 (m, 15H). $^{19}$F-NMR (300 MHz, CDCl$_3$): δ −111.1 (t, 2F), −114.3 (t, 2F), −119.4 (m, 2F).

Other acid generators were synthesized in the same manner.

<Resin (B)>

The structures of Resins (1) to (17) used in Examples and Comparative Examples are shown below.

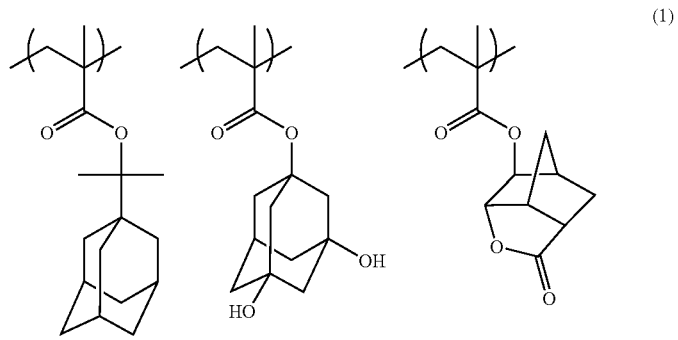
(1)
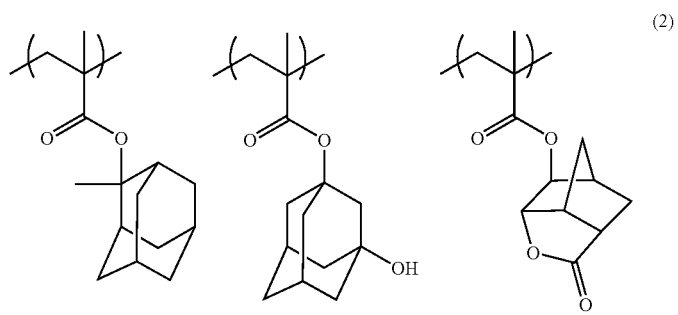
(2)
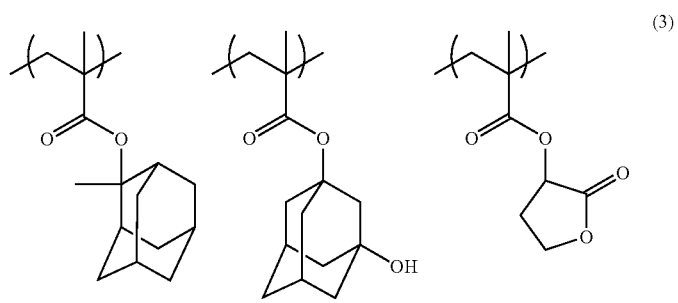
(3)
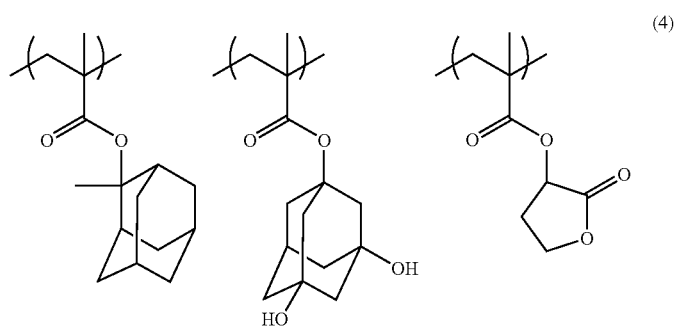
(4)
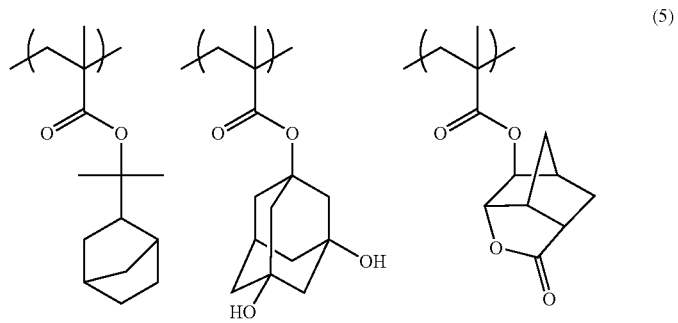
(5)

-continued
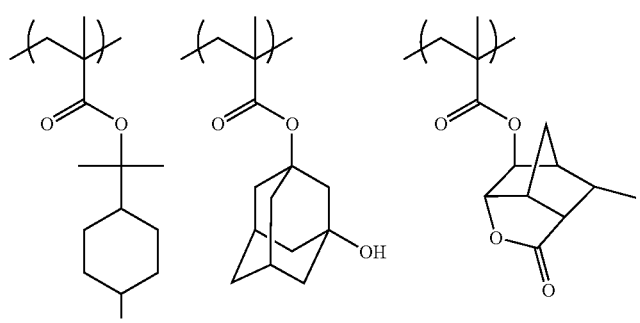
(6)
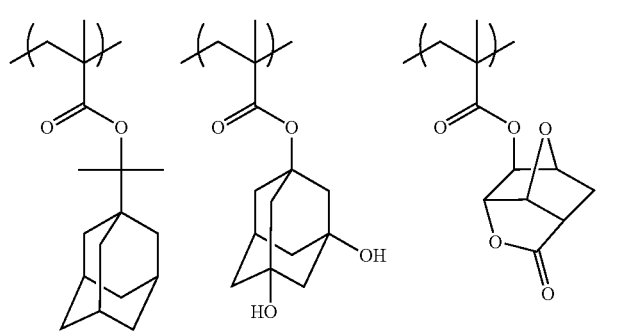
(7)
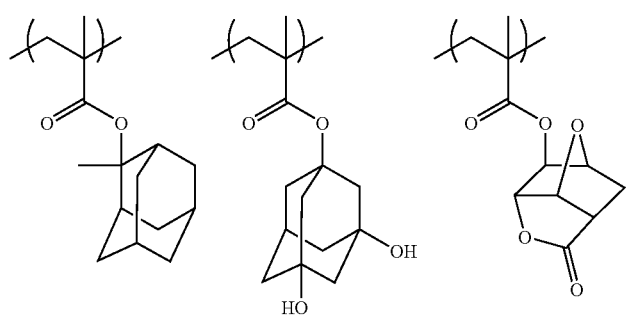
(8)
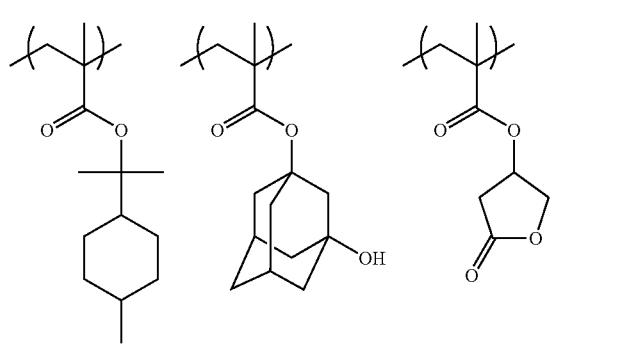
(9)
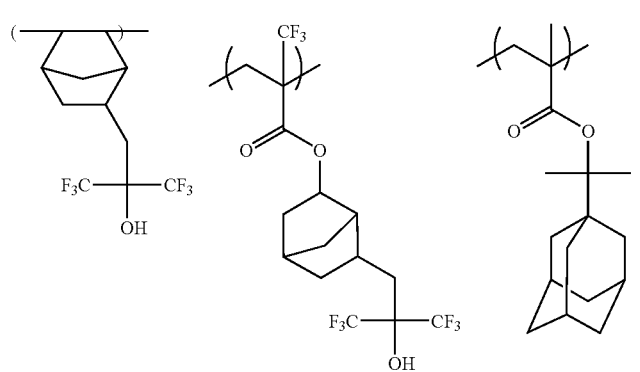
(10)

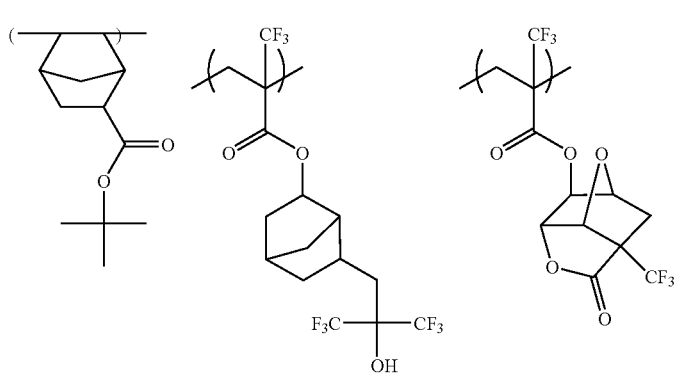
(11)
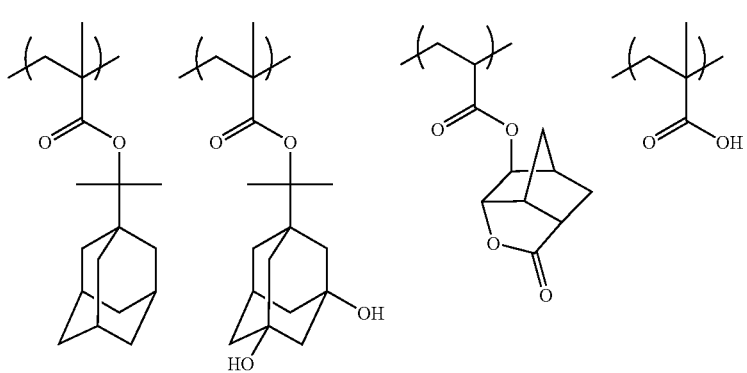
(12)
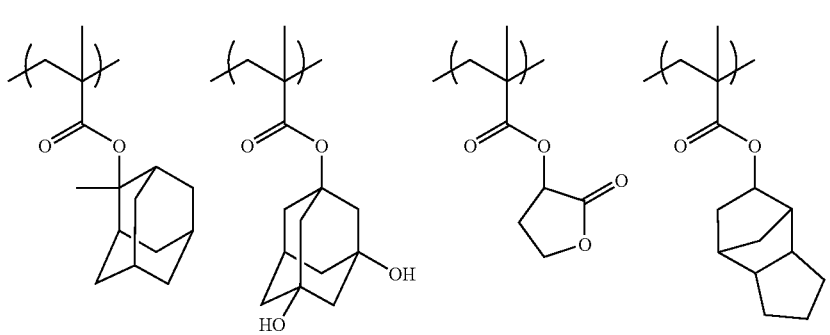
(13)
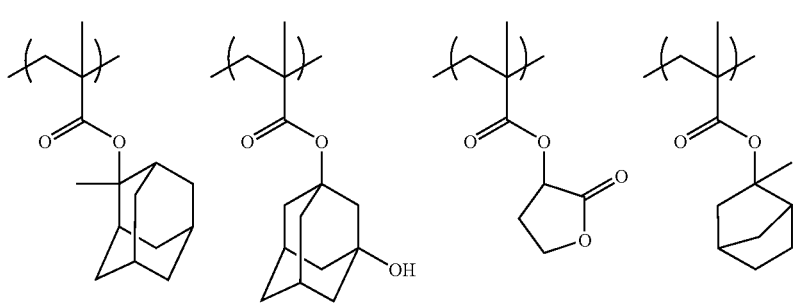
(14)

-continued

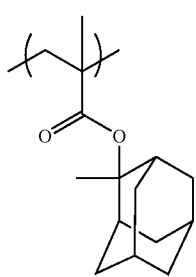 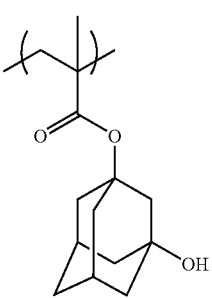 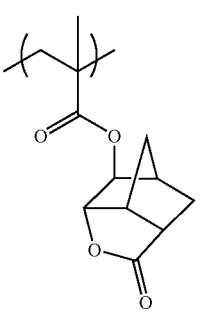 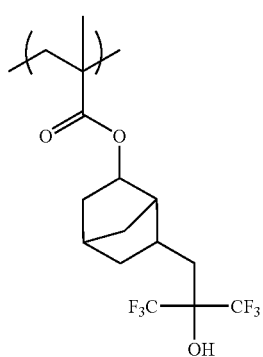

(15)

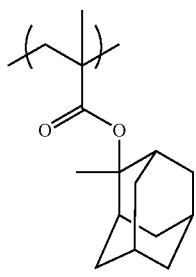 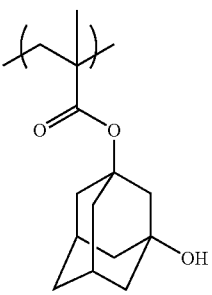 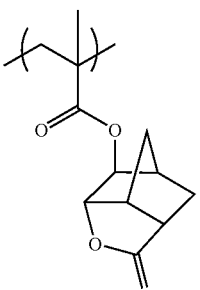 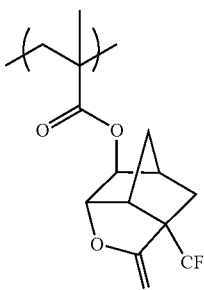

(16)

(17)

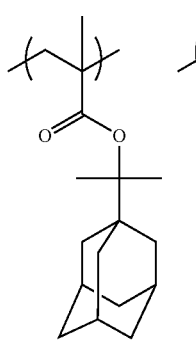 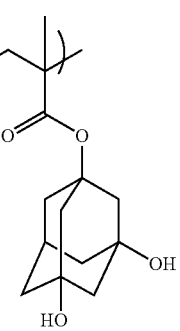 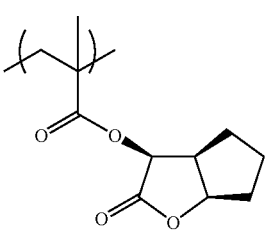 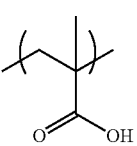

The molar ratio of repeating units (from the left in the structural formula), the weight average molecular weight (Mw) and the dispersity (Mw/Mn) in each of Resins (1) to (17) are shown in Table 1 below.

TABLE 1

| Resin | Molar Ratio | Mw | Mw/Mn |
|---|---|---|---|
| 1 | 39/20/41 | 11100 | 1.8 |
| 2 | 40/22/38 | 13000 | 2.1 |
| 3 | 34/33/33 | 10000 | 2.3 |
| 4 | 45/15/40 | 11300 | 2.2 |
| 5 | 35/15/50 | 8700 | 2.2 |
| 6 | 30/25/45 | 8800 | 1.9 |
| 7 | 39/20/41 | 11500 | 2.1 |
| 8 | 49/10/41 | 8500 | 2.0 |
| 9 | 35/32/33 | 13000 | 2.1 |
| 10 | 35/35/30 | 8700 | 2.2 |
| 11 | 40/22/38 | 9500 | 2.2 |
| 12 | 40/20/35/5 | 12700 | 2.2 |
| 13 | 40/15/40/5 | 9000 | 1.8 |
| 14 | 40/15/40/5 | 10000 | 2.3 |
| 15 | 35/20/40/5 | 7100 | 2.0 |
| 16 | 30/30/30/10 | 8600 | 2.2 |
| 17 | 40/20/35/5 | 12000 | 2.3 |

Examples 1 to 24 and Comparative Examples 1 to 5

<Preparation of Resist>

The components shown in Table 2 below were dissolved in a solvent to prepare a solution having a solid content concentration of 7 weight %, and the obtained solution was filtered through a 0.1-μm polyethylene filter to prepare a positive resist solution. The positive resist solutions prepared were evaluated by the following methods.

An organic antireflection film ARC29A (produced by Nissan Chemical Industries, Ltd.) was coated on a silicon wafer and baked at 205° C. for 60 seconds to form a 78-nm antireflection film, and the positive resist solution prepared above was coated thereon and baked at 115° C. for 60 seconds to form a 150-nm resist film. The thus-obtained wafer was subjected to pattern exposure by using an ArF excimer laser scanner (manufactured by ASML, NA: 0.75) (normal exposure) or pattern exposure by using an ArF excimer laser immersion scanner (NA: 0.75) (immersion exposure). Ultrapure water having an impurity concentration of 5 ppb or less was used as the immersion liquid. After the exposure, the resist film was heated at 115° C. for 90 seconds, developed with an aqueous tetramethylammonium hydroxide solution (2.38 weight %) for 60 seconds, rinsed with pure water and spin-dried to obtain a resist pattern. This resist pattern was observed through a scanning electron microscope (S-9260, manufactured by Hitachi Ltd.), as a result, a 90-nm line-and-space pattern was resolved.

That is, the formed resist film was subjected to normal exposure or immersion exposure, and the obtained pattern was evaluated on LER and fluctuation of line width due to time delay between exposure and PEB. The evaluation results are shown in Table 2.

Evaluation Method of Line Edge Roughness:

In the measurement of line edge roughness, a 90-nm line-and-space (1:1) pattern was observed by using a length-measuring scanning electron microscope (SEM). With respect to the 5-μm edge range in the longitudinal direction of the line pattern, the distance from a reference line where the edge should be present was measured at 50 points by a length-measuring SEM and after determining the standard deviation, 3σ was calculated. A smaller value indicates higher performance.

Evaluation Method of Fluctuation of Line Width due to Time Delay Between Exposure and PEB In the pattern forming method of performing a PEB step immediately after exposure to form a pattern, the exposure amount capable of giving a line width of 90 nm is designated as E1 and when the line width of the line pattern at E1 is measured by the length-measuring SEM at 50 points, the average value thereof is defined as the line width of the line pattern. The measured line width is designated as D1.

Also, in the pattern forming method of performing the PEB step through time delay for 1 hour after exposure, the line width of the line pattern at E1 is measured in the same manner as above, and the measured line width is designated as D2.

The fluctuation in the line width due to time delay between exposure and PEB (line width variation) is defined as follows. A smaller value indicates higher performance.

$$(\text{Line width variation}) = D2 - D1$$

TABLE 2

| | | | | Composition | | | | | | | | |
|---|---|---|---|---|---|---|---|---|---|---|---|---|
| | | | Acid Generator | | | | | | Evaluation Results | | | |
| | | | | | | | | | Immersion Exposure | | Normal Exposure | |
| | | | A3 | | | | | | | Line | | Line |
| | Resin (2 g) | Compound A1 (mg) | Compound A2 (mg) | Used in Combination (mg) | Ratio of A2 Occupying in Total of A1, A2 and A3 (mol %) | Solvent (weight ratio) | Basic Compound (mg) | Surfactant (mg) | LER (nm) | Width Variation (nm) | LER (nm) | Width Variation (nm) |
| Example 1 | 2 | A1-I-2 (50) | A2-III-1 (40) | — | 41.4% | SL-1/SL-2 (60/40) | N-5 (7) | W-1 (3) | 4.5 | 0.6 | 4.8 | 0.5 |
| Example 2 | 10 | A1-I-5 (50) | A2-III-9 (50) | — | 46.8% | SL-2/SL-4/SL-6 (40/59/1) | N-6 (10) | W-1 (3) | 5.1 | 0.5 | 5.1 | 0.3 |
| Example 3 | 12 | A1-I-9 (40) | A2-III-7 (60) | — | 56.9% | SL-2/SL-4 (70/30) | N-3 (6) | W-2 (3) | 5.2 | 0.7 | 5.3 | 0.5 |
| Example 4 | 16 | A1-I-3 (30) | A2-III-3 (60) | — | 72.5% | SL-2/SL-4 (60/40) | N-1 (7) | W-4 (3) | 4.9 | 0.5 | 4.5 | 0.5 |
| Example 5 | 8 | A1-I-6 (60) | A2-III-29 (50) | — | 46.3% | SL-3/SL-4 (30/70) | N-1 (7) | W-1 (3) | 5.7 | 0.6 | 5.2 | 0.3 |
| Example 6 | 6 | A1-I-2 (50) | A2-III-25 (65) | — | 53.3% | SL-2/SL-4/SL-5 (40/58/2) | N-3 (6) | W-1 (3) | 4.5 | 0.4 | 4.9 | 0.6 |
| Example 7 | 3 | A1-II-1 (80) | A2-III-9 (80) | — | 49.5% | SL-1/SL-2 (60/40) | N-4 (13) | W-5 (3) | 6.0 | 0.8 | 6.2 | 0.4 |
| Example 8 | 11 | A1-I-5 (50) | A2-III-28 (60) | — | 48.8% | SL-1/SL-2 (60/40) | N-3 (6) | W-6 (3) | 5.3 | 0.3 | 5.3 | 0.3 |
| Example 9 | 15 | A1-I-4 (40) | A2-III-8 (80) | — | 59.1% | SL-2/SL-4/SL-6 (40/59/1) | N-2 (9) | W-3 (3) | 5.4 | 0.5 | 5.5 | 0.3 |
| Example 10 | 1 | A1-I-6 (50) | A2-III-28 (60) | — | 52.1% | SL-2/SL-4 (70/30) | N-5 (7) | W-6 (3) | 5.9 | 0.5 | 5.7 | 0.3 |
| Example 11 | 1 | A1-I-2 (50) | A2-III-10 (60) | — | 53.2% | SL-2/SL-4 (60/40) | N-1 (7) | W-6 (3) | 5.7 | 0.7 | 5.4 | 0.4 |
| Example 12 | 4 | A1-I-14 (80) | A2-III-9 (70) | — | 39.4% | SL-1/SL-2 (50/50) | N-3 (6) | W-6 (3) | 6.4 | 0.7 | 6.8 | 0.6 |
| Example 13 | 7 | A1-I-2 (50) | A2-III-27 (60) | — | 52.2% | SL-1/SL-2 (30/70) | N-5 (7) | W-6 (3) | 6.5 | 0.6 | 5.0 | 0.5 |
| Example 14 | 9 | A1-I-5 (60) | A2-III-28 (70) | — | 48.1% | SL-2/SL-4/SL-6 (40/59/1) | N-1 (7) | W-6 (3) | 6.5 | 0.5 | 4.9 | 0.5 |
| Example 15 | 17 | A1-I-6 (50) | A2-III-2 (80) | — | 59.1% | SL-2/SL-4 (60/40) | N-5 (7) | W-6 (3) | 6.1 | 0.4 | 5.4 | 0.4 |
| Example 16 | 13 | A1-I-15 (70) | A2-III-28 (70) | — | 52.6% | SL-2/SL-4 (60/40) | N-6 (10) | W-6 (3) | 5.6 | 0.5 | 5.8 | 0.6 |
| Example 17 | 5 | A1-II-5 (50) | A2-III-1 (70) | — | 60.0% | SL-1/SL-2 (60/40) | N-3 (6) | W-6 (3) | 5.5 | 0.5 | 5.6 | 0.6 |
| Example 18 | 17 | A1-I-3 (50) | A2-III-15 (60) | — | 59.5% | SL-2/SL-4/SL-6 (40/59/1) | N-5 (7) | W-6 (3) | 5.9 | 0.6 | 5.5 | 0.5 |
| Example 19 | 14 | A1-I-5 (50) | A2-III-25 (80) | — | 56.9% | SL-2/SL-4 (70/30) | N-6 (10) | W-6 (3) | 5.8 | 0.4 | 5.5 | 0.4 |

TABLE 2-continued

| | | | Composition | | | | | | Evaluation Results | | | |
| | | | Acid Generator | | | | | | Immersion Exposure | | Normal Exposure | |
| | Resin (2 g) | Compound A1 (mg) | Compound A2 (mg) | A3 Used in Combination (mg) | Ratio of A2 Occupying in Total of A1, A2 and A3 (mol %) | Solvent (weight ratio) | Basic Compound (mg) | Surfactant (mg) | LER (nm) | Line Width Variation (nm) | LER (nm) | Line Width Variation (nm) |
|---|---|---|---|---|---|---|---|---|---|---|---|---|
| Example 20 | 17 | A1-I-5 (50) | A2-III-29 (70) | — | 55.8% | SL-2/SL-4 (60/40) | N-5 (7) | W-6 (3) | 6.2 | 0.4 | 5.9 | 0.4 |
| Example 21 | 15 | A1-I-15 (120) | A2-III-1 (15) | — | 12.7% | SL-2/SL-4/SL-6 (40/59/1) | N-4 (13) | W-5 (3) | 8.5 | 2.5 | 5.1 | 0.4 |
| Example 22 | 13 | A1-I-2 (40) A1-II-1 (40) | A2-III-3 (60) | — | 46.7% | SL-1/SL-2 (30/70) | N-4 (13) | W-5 (3) | 5.8 | 0.8 | 5.6 | 0.5 |
| Example 23 | 15 | A1-I-2 (50) | A2-III-1 (70) | z36 (20) | 45.0% | SL-1/SL-2 (30/70) | N-5 (7) | W-6 (3) | 6.3 | 1.3 | 5.8 | 0.3 |
| Example 24 | 14 | A1-I-6 (50) | A2-III-2 (80) | z55 (20) | 50.8% | SL-2/SL-4/SL-6 (40/59/1) | N-2 (9) | W-3 (3) | 6.9 | 1.0 | 6.4 | 0.4 |
| Comparative Example 1 | 1 | A1-I-5 (100) | — | | 0% | SL-2/SL-4 (60/40) | N-5 (7) | W-1 (3) | 9.6 | 6.1 | 4.8 | 1.5 |
| Comparative Example 2 | 4 | A1-I-15 (150) | — | | 0% | SL-1/SL-2 (60/40) | N-6 (10) | W-1 (3) | 13.8 | 4.6 | 5.5 | 1.1 |
| Comparative Example 3 | 17 | A1-I-2 (60) A1-II-1 (60) | — | | 0% | SL-2/SL-4/SL-5 (40/58/2) | N-3 (6) | W-6 (3) | 11.0 | 5.7 | 4.5 | 1.7 |
| Comparative Example 4 | 5 | — | A2-III-29 (120) | | 100% | SL-2/SL-4 (70/30) | N-1 (7) | W-6 (3) | 8.9 | 0.6 | 9.2 | 0.6 |
| Comparative Example 5 | 8 | — | A2-III-1 (130) | | 100% | SL-2/SL-4 (60/40) | N-2 (9) | W-1 (3) | 13.3 | 0.5 | 11.5 | 0.4 |

The symbols in Table 2 denote the followings.
N-1: N,N-Dibutylaniline
N-2: N,N-Dihexylaniline
N-3: 2,6-Diisopropylaniline
N-4: Tri-n-octylamine
N-5: N,N-Dihydroxyethylaniline
N-6: 2,4,5-Triphenylimidazole
W-1: Megafac F176 (produced by Dainippon Ink & Chemicals, Inc.) (fluorine-containing)
W-2: Megafac R08 (produced by Dainippon Ink & Chemicals, Inc.) (fluorine- and silicon-containing)
W-3: Polysiloxane polymer KP-341 (produced by Shin-Etsu Chemical Co., Ltd.) (silicon-containing)
W-4: Troysol S-366 (produced by Troy Chemical)
W-5: PF656 (produced by OMNOVA) (fluorine-containing)
W-6: PF6320 (produced by OMNOVA) (fluorine-containing)
SL-1: Cyclohexane
SL-2: Propylene glycol monomethyl ether acetate
SL-3: Ethyl lactate
SL-4: Propylene glycol monomethyl ether
SL-5: γ-Butyrolactone
SL-6: Propylene carbonate As apparent from the results in Table 2, the positive resist composition of the present invention ensures less fluctuation in the line width due to time delay between exposure and PEB and excellent performance in view of line edge roughness not only at the normal exposure but also at the immersion exposure.

This application is based on Japanese Patent application JP 2005-272074, filed Sep. 20, 2005, the entire content of which is hereby incorporated by reference, the same as if set forth at length.

What is claimed is:

1. A positive resist composition comprising:
(A1) at least one compound selected from a compound capable of generating an acid represented by the following formula (I) upon irradiation with actinic rays or radiation and a compound capable of generating an acid represented by the following formula (II) upon irradiation with actinic rays or radiation;
(A2) a compound capable of generating an acid represented by the following formula (III) upon irradiation with actinic rays or radiation; and
(B) a resin capable of decomposing under the action of an acid to increase its solubility in an alkali developer:

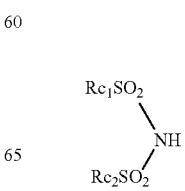

(I)

-continued

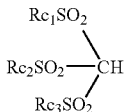
(II)

wherein $Rc_1$, $Rc_2$ and $Rc_3$ each independently represents an alkyl group substituted by at least one fluorine atom, or an aryl group substituted by at least one fluorine atom, and $Rc_1$ and $Rc_2$ may combine with each other to form a ring;

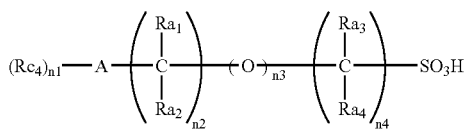
(III)

wherein $Ra_1$, $Ra_2$, $Ra_3$ and $Ra_4$ each independently represents a hydrogen atom, a fluorine atom or a trifluoromethyl group, A represents a divalent or trivalent linking group selected from an oxygen atom, a sulfur atom, a nitrogen atom, a carbonyl group, a sulfonyl group, an ester group, an amide group, a sulfonamide group, an imino group, a urethane group, a urea group and a group formed by combining two or more thereof, $Rc_4$ represents an organic group, and when n1 is 2, two $Rc_4$'s may be the same or different or may combine with each other to form a ring, n1 represents 1 or 2, n2 represents an integer of from 1 to 3, n3 represents 0 or 1, and n4 represents an integer of from 1 to 3.

2. The positive resist composition as claimed in claim 1, wherein the amount of the compound (A2) is from 10 to 90 mol % based on a total amount of the compound (A1) and the compound (A2).

3. The positive resist composition as claimed in claim 1, wherein the amount of the compound (A2) is from 20 to 80 mol % based on a total amount of the compound ((A1)) and the compound (A2).

4. The positive resist composition as claimed in claim 1, further comprising a compound capable of generating an acid upon irradiation with actinic rays or radiation which is other than the compounds (A1) and (A2).

5. The positive resist composition as claimed in claim 4, wherein the compound other than the compounds (A1) and (A2) is represented by the following formula (ZI), (ZII) or (ZIII):

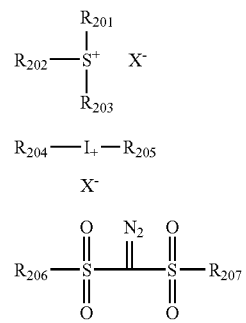

wherein $R_{201}$, $R_{202}$ and $R_{203}$ each independently represents an organic group, $X^-$ represents a non-nucleophilic anion, and $R_{204}$ to $R_{207}$ each independently represents an aryl group, an alkyl group or a cycloalkyl group.

6. The positive resist composition as claimed in claim 1, further comprising a dissolution inhibiting compound capable of decomposing under an action of an acid to increase its solubility in an alkali developer and having a molecular weight of 3,000 or less.

7. The positive resist composition as claimed in claim 1, further comprising a basic compound.

8. The positive resist composition as claimed in claim 1, further comprising at least one of a fluorine-containing surfactant and a silicon-containing surfactant.

9. A pattern forming method comprising forming a resist film from the positive resist composition claimed in claim 1, and exposing and developing the resist film.

10. The pattern forming method as claimed in claim 9, wherein the resist film is exposed through an immersion liquid.

* * * * *